(12) United States Patent
Joly et al.

(10) Patent No.: US 11,248,123 B2
(45) Date of Patent: Feb. 15, 2022

(54) ORGANIC PHOTOCHROMIC DYE AND USES THEREOF FOR DYE SENSITIZED SOLAR CELLS

(71) Applicant: COMMISSARIAT A L'ENERGIE ATOMIQUE ET AUX ENERGIES ALTERNATIVES, Paris (FR)

(72) Inventors: Damien Joly, Sassenage (FR); Yann Kervella, Saint Verand (FR); Renaud Demadrille, Saint Egreve (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/612,538

(22) PCT Filed: May 18, 2018

(86) PCT No.: PCT/EP2018/063208
§ 371 (c)(1),
(2) Date: Nov. 11, 2019

(87) PCT Pub. No.: WO2018/215371
PCT Pub. Date: Nov. 29, 2018

(65) Prior Publication Data
US 2020/0207991 A1      Jul. 2, 2020

(30) Foreign Application Priority Data

May 22, 2017   (EP) .................................. 17305597

(51) Int. Cl.
*C09B 57/00* (2006.01)
*H01L 51/44* (2006.01)
(Continued)

(52) U.S. Cl.
CPC .......... *C09B 57/008* (2013.01); *H01G 9/2031* (2013.01); *H01L 51/006* (2013.01); *H01L 51/0073* (2013.01); *H01L 51/44* (2013.01)

(58) Field of Classification Search
CPC ... C09B 57/008; H01G 9/2031; H01L 51/006; H01L 51/0073; H01L 51/44
See application file for complete search history.

(56) References Cited

U.S. PATENT DOCUMENTS

2003/0096117 A1* 5/2003 Kawabata ............ C07D 405/04
                                                          428/411.1
2004/0014995 A1   1/2004 Kawabata et al.
(Continued)

FOREIGN PATENT DOCUMENTS

JP     2001-114775 A     4/2001
WO     WO 2009/109499 A1   9/2009

OTHER PUBLICATIONS

Hagfeldt, A. et al, "Dye-Sensitive Solar Cells," Chemical Reviews, vol. 110, No. 11, Sep. 10, 2010, pp. 6595-6663.
(Continued)

*Primary Examiner* — Jayne L Mershon
(74) *Attorney, Agent, or Firm* — Oblon, McClelland, Maier & Neustadt, L.L.P.

(57) ABSTRACT

The present invention concerns an organic dye comprising a photochromic entity, a segment -eD representing an electron donor segment and a segment -L-A with -L- representing a covalent bond or a spacer segment and particularly a pi-conjugated spacer segment, and -A representing an electron attractor segment able to form a covalent bond with a semi-conductor. The present invention concerns the use thereof as photosensitizer in a photovoltaic device and said photovoltaic device.

20 Claims, 2 Drawing Sheets

(51) Int. Cl.
*H01L 51/00* (2006.01)
*H01G 9/20* (2006.01)

(56) References Cited

U.S. PATENT DOCUMENTS

| | | |
|---|---|---|
| 2010/0005681 A1 | 1/2010 | Das et al. |
| 2010/0056810 A1* | 3/2010 | Das .................. C07D 309/32 549/382 |
| 2011/0122475 A1* | 5/2011 | Aiken ................ C07D 311/92 359/241 |

OTHER PUBLICATIONS

Yoon, S. et al, "Application of transparent dye-sensitized solar cells to building integrated photovoltaic systems," Building and Environment, vol. 46, 2011, pp. 1899-1904.

Bechinger, C. et al, "Photoelectrochromic windows and displays," Nature, vol. 383, 1996, pp. 608-610.

Yang, S. et al, "A novel photoelectrochromic device based on poly(3,4-(2,2-dimethylpropylenedioxy)thiophene) thin film and dye-sensitized solar cell," Solar Energy Materials & Solar Cells, vol. 97, 2012, pp. 186-190.

Di Nunzio, M.R. et al, "Photochromism and Thermochromism of some Spirooxazines and Naphthopyrans in the Solid State and in Polymeric Film," J. Phys. Chem. C, vol. 114, 2010, pp. 6123-6131.

Pardo, R. et al, "Photochromic organic-inorganic hybrid materials," Chem. Soc. Rev., vol. 40, 2011, pp. 672-687 (17 total pages).

Mishra, A. et al, "Metal-Free Organic Dyes for Dye-Sensitive Solar Cells: From Structure: Property Relationships to Design Rules," Angew. Chem. Int. Ed., vol. 48, 2009, pp. 2474-2499.

Kalyanasundaram, K. (ed.), "Dye-Sensitized Solar Cells," Fundamental Sciences, EPFL Press, ISBN: 978-2940222-36-0, CRC Press, ISBN: 978-1-4398-0866-5, 2010, 170 pages.

Yum, J-H. et al, "A Light-Resistant Organic Sensitizer for Solar-Cell Applications," Angew. Chem. Int. Ed., vol. 48, 2009, pp. 1576-1580.

Moorthy, J.N. et al, "Modulation of Spectrokinetic Properties of o-Quinonoid Reactive Intermediates by Electronic Factors: Time-Resolved Laser Flash and Steady-State Photolysis Investigations of Photochromic 6-and 7-Arylchromenes," Chem. Eur. J., vol. 15, 2009, pp. 4289-4300.

International Search Report and Written Opinion dated Jul. 7, 2019 in PCT/EP2018/063208 filed on May 18, 2018.

U.S. Appl. No. 16/099,623, filed Nov. 7, 2018, 2019/0144677 A1, Demadrille, R. et al.

U.S. Appl. No. 16/323,654, filed Aug. 10, 2017, Demadrille, R. et al.

* cited by examiner

ORGANIC PHOTOCHROMIC DYE AND USES THEREOF FOR DYE SENSITIZED SOLAR CELLS

TECHNICAL FIELD

The present invention belongs to the field of photoelectrical energy and, particularly, to the field of photovoltaic cells and devices.

More particularly, the present invention proposes a family of purely organic compounds comprising at least one photochromic moiety and the use thereof as photosensitizers for dye sensitized solar cell (DSSC).

STATE OF THE PRIOR ART

Among new photovoltaic technologies, Dye-Sensitized Solar Cells (DSSCs) represent one of the most promising approaches in terms of efficiency and production costs [1]. Indeed this generation of photovoltaic devices can combine good efficiency close to 13% with low cost fabrication. Unlike traditional silicon based solar cells, DSSCs require no complex manufacturing processes and the raw materials are relatively inexpensive. For these reasons, this type of solar cells has recently initiated its industrial development. Notably, DSSC modules are very promising for use in façades of buildings as demonstrated by their first large scale application, which was delivered in the beginning of 2014 at Convention Centre of the Ecole Polytechnique Fédérale de Lausanne (EPFL).

DSSCs present many advantages for applications in Building Integrated PhotoVoltaics (BIPV) [2]. Indeed they can exhibit up to 40% superior performance compared to the conventional silicon solar cells under non-ideal light environments (dim, diffuse and indoor light). Their energy payback time is significantly shorter than silicon but the strongest advantage relies on the fact that they can be semi-transparent and colorful.

The DSSC technology consists of a transparent conducting oxide (TCO) deposited on transparent substrates to make working and counter electrodes with an electrolyte in between to transport charges. The working (or "photo") electrode is constituted of a thin layer (few μm) of nanoparticles of a semiconductor, usually $TiO_2$. The $TiO_2$ is sintered to allow the transport of the electrons from particle to particle down to the TCO. The working electrode is then soaked in a sensitizer (dye) solution. Several different classes of materials are employed to fabricate a DSSC, but the sensitizer is the key element since it governs the photon harvesting and the creation of free charges after injection of electrons into the nanostructured semi-conducting oxide. Moreover, the sensitizer structure has also been shown to control key electron transfer processes at the $TiO_2$/dye/electrolyte interface such as the recombination of $TiO_2$ electrons with electrolyte species or with dye cations themselves. For this reason many efforts have recently focused on the development of new efficient sensitizers that could help improving device performance, allowing the real use of this technology beyond the laboratory.

Historically the DSSCs were developed using ruthenium sensitizers and liquid redox electrolytes. Despite the good performances of such dyes, ruthenium based sensitizers have some drawbacks that limit the potential of DSSCs. First, their molar extinction coefficients are moderate to low. Therefore thick layers of $TiO_2$ are required to harvest visible light. In addition to the higher cost of thick electrodes, thick layers are detrimental to the performances when ionic liquid based electrolytes are used for developing stable DSSCs. Also, ruthenium complexes are difficult to synthesize and purify and some derivatives should be considered as highly toxic and carcinogenic.

As alternative to ruthenium complexes, organic dyes have successfully been developed for applications in DSSCs in the recent years. Organic dyes reveal several advantages such as higher molar absorption coefficient and tunable colors that are of a great importance for practical applications. Besides, employing them, DSSCs showing rather good power conversion efficiencies up to 8% with ionic liquid electrolyte and a long-term stability up to 10 years have been demonstrated.

Most organic dyes developed over the years are conceived and constructed according to the following design:

Scheme 1: General design of organic sensitizers

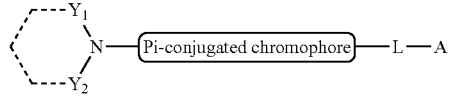

They show:
- an electro-donating (or electron donor) group (eD) with stable redox properties i.e. an arylamine based redox function ($—N(Y_1)(Y_2)$) that allows the dye to be easily and fastly regenerated by the electrolyte thanks to a reduction;
- a pi-conjugated moiety that absorbs solar photon in an efficient way while facilitating charge extraction to the semiconductor oxide;
- and lastly an anchoring function (A) with electro-accepting property that can be carboxilic acid, cyano acrylic acid that is covalently bonded to the pi-conjugated core with a spacer (L).

Thanks to the latest developments of robust and efficient organic dyes, DSSCs are now very seriously envisioned for application in BIPV.

In order to convert efficiently light into electricity, DSSCs have to harvest maximum of photons from the sun in the visible range and as a consequence the best performing solar cells cannot show a good optical transparency. For this reason a compromise has to be found between transparency and efficiency when applications in façades are targeted. The optical transparency of solar cells can be adapted by tuning the thickness of the $TiO_2$ electrode or the absorption domain of the sensitizer. However the actual state of the art only allows for the fabrication of semi-transparent solar cells showing a given optical transmission that is determined by the molar absorption coefficient and the thickness of the mesoporous electrode. For integration in windows and the massive development of this technology in buildings, the development of solar cells the transparency of which can be adaptable depending on the solar light conditions would be very valuable.

Only one concept has been proposed so far to develop solar cells with variable optical transmission. This concept is based on the combination of a photovoltaic device and an electrochromic device [3-4]. In such devices the light-absorption process (in the photovoltaic film) is separate from the coloration process (in the electrochromic film) and both need therefore to be optimized individually. Moreover, as the coloration process of the electrochromic film requires an external electrical current between the two electrodes, it consumes a part of the electricity that is generated by the solar cell. Such photovoltaic devices are not transparent even in absence of sun. Besides they require absorbing sufficient light to generate enough electricity for piloting the electrochromic system and their efficiency decreases with the coloration of the electrochromic film.

As things stand, there thus exists a real need to have available organic dyes capable of tackling the challenge of solar cells with variable transparency. In addition said dyes should present performances comparable to the ones of the prior art dyes in solar cells or even improved performances when compared to the ones of the prior art dyes.

DISCUSSION OF THE INVENTION

The present invention makes it possible to resolve all or part of the technical problems listed above.

Indeed, the work of the inventors has made it possible to design and use photochromic-based materials to replace conventional dyes in DSSC whereby said solar cells present a new functionality that is to adapt their transparency to the weather conditions. To that purpose the inventors have adapted the structure of photochromic organic dyes to match the requirements of use in solar cells.

In contrast to electrochromic materials, a photochromic compound is a chemical species that is capable of undergoing a reversible transformation between two forms having different absorption spectra under light irradiation. Organic photochromic compounds are known for decades and they have been studied extensively owing to the possibility of having a photochromic response in a wide range of wavelengths in the visible spectrum. More than one hundred organic photochromic molecules have been developed, the most commonly known being fulgides, azobenzenes, diarylethenes, spirooxazines, spiropyrans and chromenes derivatives [5].

Data storage, optical switches and non-linear optics are some of their fields of application but their best-known use is in ophthalmology with their integration into glasses or lenses showing variable optical transmission. In these applications, all the molecules are developed for their ability to modulate the absorption spectrum with more or less rapid kinetics. It is only this optical property that the one skilled in the art seeks to exploit and modulate. The semiconducting nature of these molecules is never exploited.

Only few of organic photochromic molecules (such as azobenzenes, spiropyrans, spirooxazines and naphthopyrans) can show both photo-chemically and thermally activated reversible transformation [6]. The photo-generated isomers of these compounds are thermally unstable and return to the initial isomers, even in the dark, by reversible cyclization reactions. Among the different photochromic dyes, naphthopyrans have been the most extensively investigated because they reveal high fatigue resistance. Besides the photo-colorability of these compounds is fairly high due to significant quantum efficiency of the photochemical process (>20%) and high values of the absorption coefficients of the colored species.

The organic photochromic dyes prepared by the inventors take advantage of the ability of some photochromic compounds to change color upon UV irradiation and in a reversible way. Optical transmission as well as photovoltaic parameters can thus be tuned with any light source, including sunlight that comprises UV.

As a consequence, the solar cells of the present invention i.e. fabricated with organic photochromic dyes are highly transparent in the absence of light and become colored under sunlight during the day. When the solar cells pass from the non-colored state to the colored state they start to produce electricity. The intensity of the absorption of the solar cells is directly controlled by the photochromic process and the light intensity. In other words, the present inventors have invented the first solar cell showing self-adaptable optical parameters. The solar cells are highly transparent in the visible range and become colorful upon irradiation, showing self-adjustable light transmission with the weather conditions.

The organic photochromic dye according to the present invention in its colored form will act as a photon harvester and a sensitizer of the wide band gap inorganic semiconductor (such as $TiO_2$). As a result the higher the intensity of the irradiation will be, the more the photochromic dye will absorb and the more it will inject electrons into the metal oxide enabling the solar cell to generate electricity.

In addition, the photochromic behavior of the molecules of the prior art is only observed in solution or dispersed in a polymer matrix such as, for example, for application in painting or in optical devices. Before the present invention, it had never been demonstrated that these molecules could present a photochromic behavior even after grafting on a nanostructured semi-conductor metal oxide i.e. in a solid state. Before the present invention, it had never been demonstrated that these molecules could be used as photosensitizer of a metal oxide.

Thus, the present invention relates to an organic dye presenting the following formula (I):

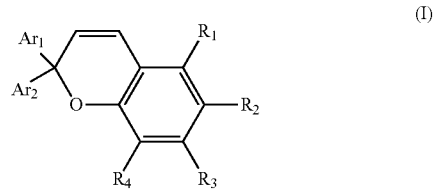

in which the radicals $Ar_1$ and $Ar_2$, identical or different, represent an aryl group optionally substituted;

the radicals $R_1$ to $R_4$, identical or different, represent a hydrogen, a halogen, a cyano group (—CN), a nitro group (—$NO_2$), an alkyl group optionally substituted, an aryl group optionally substituted, an alkylaryl group optionally substituted or an arylalkyl group optionally substituted; the radicals $R_1$ and $R_2$ may form with the carbons to which they are attached an aromatic or heteroaromatic ring eventually substituted and the radicals $R_3$ and $R_4$ may form with the carbons to which they are attached an aromatic or heteroaromatic ring eventually substituted;

in which either the radical $Ar_1$ and/or the radical $Ar_2$ is/are substituted by a segment -eD and at least one element selected in the group consisting of the radical $R_1$, the radical $R_2$, the radical $R_3$, the radical $R_4$, the aromatic or heteroaromatic ring formed by the radicals $R_1$ and $R_2$ with the carbons to which they are attached and the aromatic or heteroaromatic ring formed by the radicals $R_3$ and $R_4$ with the carbons to which they are attached is substituted by a segment -L-A;

or the radical $Ar_1$ and/or the radical $Ar_2$ is/are substituted by a segment -L-A and at least one element selected in the group consisting of the radical $R_1$, the radical $R_2$, the radical $R_3$, the radical $R_4$, the aromatic or heteroaromatic ring formed by the radicals $R_1$ and $R_2$ with the carbons to which they are attached and the aromatic or heteroaromatic ring formed by the radicals $R_3$ and $R_4$ with the carbons to which they are attached is substituted by a segment -eD;

with
-eD representing an electron donor segment,
-L- representing a covalent bond or a spacer segment and particularly a pi-conjugated spacer segment, and
-A representing an electron attractor segment able to form a covalent bond with a semi-conductor.

"Alkyl group" is taken to mean, within the scope of the present invention, a linear, branched or cyclic alkyl group, comprising from 1 to 20 carbon atoms, particularly from 1 to 15 carbon atoms and in particular, from 1 to 10 carbon atoms, which can optionally comprise at least one heteroatom and/or at least one carbon-carbon double bonds or triple bonds, such as, for example, a methyl, ethyl, n-propyl, isopropyl, butyl, isobutyl, sec-butyl, tert-butyl, pentyl, isopentyl, hexyl, heptyl, octyl or nonyl group.

"Aryl group" is taken to mean, within the scope of the present invention, any functional group or substituent derived from at least one simple aromatic ring wherein an aromatic ring corresponds to any planar cyclic compound having a delocalized Π system in which each atom of the ring comprises a p-orbital, said p-orbitals overlapping themselves. An aryl group comprises one aromatic ring or several aromatic rings identical or different joined or connected by a single bond or by a hydrocarbon group, each ring having from 4 to 20 carbon atoms, particularly from 4 to 14 carbon atoms, in particular, from 4 to 8 carbon atoms and which can optionally comprise at least one heteroatom. As examples of aryl group, phenyl, biphenyl, naphthyl, anthracenyl, cyclopentadienyl, pyrenyl, tetrahydronaphthyl, furanyl, pyrrolyl, thiophenyl, oxazolyl, pyrazolyl, isoquinolinyl, thiazolyl, imidazolyl, triazolyl, pyridinyl, pyranyl, quinolinyl, pyrazinyl and pyrimidinyl groups may be cited. An aryl group can be substituted.

"Alkylaryl group" is taken to mean, within the scope of the present invention, any group derived from an aryl group as defined above wherein a hydrogen atom is replaced by an alkyl group as defined above.

"Arylalkyl group" is taken to mean, within the scope of the present invention, any group derived from an alkyl group as defined above wherein a hydrogen atom is replaced by an aryl group as defined above.

"Substituted alkyl group", "substituted aryl group", "substituted alkylaryl group" or "substituted arylalkyl group" are taken to mean, within the scope of the present invention, an alkyl, aryl, alkylaryl or arylalkyl group as defined previously substituted by a group or several groups, identical or different, selected from the group consisting of a halogen; an amine; a diamine; a carboxyl; a carboxylate; an aldehyde; an ester; an ether; a hydroxyl; a halogen; an aryl optionally substituted as defined previously and particularly such as a phenyl, a benzyl or a naphthyl; an alkyl optionally substituted as defined previously and particularly such as a methyl, an ethyl, a propyl or a hydroxypropyl; an amide; a sulphonyl; a sulphoxide; a sulphonic acid; a sulphonate; an acyl; a vinyl; a hydroxyl; an epoxy; a phosphonate; an isocyanate; a thiol; a glycidoxy; an acryloxy; a thiophene; a furan; a selenophene, a segment -eD, a segment -L-A and salts thereof.

"Heteroatom" is taken to mean, within the scope of the present invention, an atom chosen from the group consisting of nitrogen, oxygen, phosphorous, sulphur, silicon, fluorine, chlorine and bromine.

"Halogen" is taken to mean, within the scope of the present invention, an atom chosen from the group consisting of fluorine, chlorine, iodine and bromine. Advantageously, when a halogen is implemented in the present invention, it is a fluorine or a chlorine.

In a $1^{st}$ embodiment, the radicals $R_1$ and $R_2$ in the organic dye according to the present invention form with the carbons to which they are attached an aromatic or heteroaromatic ring.

In particular, in this $1^{st}$ embodiment, the organic dye according to the invention presents the following formula (II):

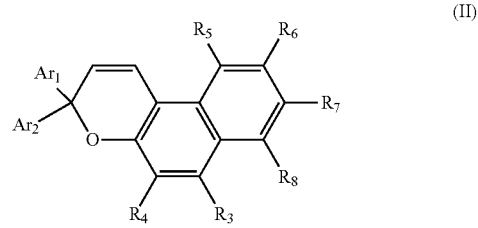

in which
the radicals $Ar_1$, $Ar_2$, $R_3$ and $R_4$ are as previously defined;
the radicals $R_5$ to $R_8$, identical or different, represent a hydrogen, a halogen, a cyano group (—CN), a nitro group (—$NO_2$), an alkyl group optionally substituted, an aryl group optionally substituted, an alkylaryl group optionally substituted, an arylalkyl group optionally substituted, a segment -eD or a segment -L-A;
in which
either the radical $Ar_1$ and/or the radical $Ar_2$ is/are substituted by a segment -eD and at least one element selected in the group consisting of the radical $R_3$, the radical $R_4$, the radical $R_5$, the radical $R_6$, the radical $R_7$ and the radical $R_8$ is a segment -L-A or substituted by a segment -L-A;
or the radical $Ar_1$ and/or the radical $Ar_2$ is/are substituted by a segment -L-A and at least one element selected in the group consisting of the radical $R_3$, the radical $R_4$, the radical $R_5$, the radical $R_6$, the radical $R_7$ and the radical $R_8$ is a segment -eD or is substituted by a segment -eD;
with a segment -eD and a segment -L-A being as previously defined.

More particularly, in this $1^{st}$ embodiment, the organic dye according to the invention presents the following formula (III):

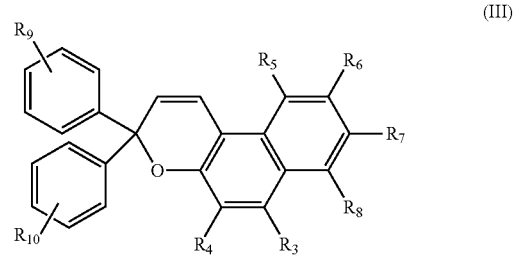

in which
the radicals $R_3$ to $R_8$ are as previously defined;
the radicals $R_9$ and $R_{10}$, identical or different, represent a hydrogen, a halogen, a cyano group (—CN), a nitro group (—$NO_2$), an alkyl group optionally substituted, an aryl group optionally substituted, an alkylaryl group optionally substituted, an arylalkyl group optionally substituted, a segment -eD or a segment -L-A;

in which either the radical $R_9$ and/or the radical $R_{10}$ is/are a segment -eD or is/are substituted by a segment -eD and at least one element selected in the group consisting of the radical $R_3$, the radical $R_4$, the radical $R_5$, the radical $R_6$, the radical $R_7$ and the radical $R_8$ is a segment -L-A or substituted by a segment -L-A;

or the radical $R_9$ and/or the radical $R_{10}$ is/are a segment -L-A or is/are substituted by a segment -L-A and at least one element selected in the group consisting of the radical $R_3$, the radical $R_4$, the radical $R_5$, the radical $R_6$, the radical $R_7$ and the radical $R_8$ is a segment -eD or is substituted by a segment -eD;

with a segment -eD and a segment -L-A being as previously defined.

Advantageously, in the organic dyes of formula (II) or (III), the radicals $R_3$ and $R_4$ are identical and both represent a hydrogen, a halogen, a cyano group (—CN), a nitro group (—NO$_2$), an alkyl group optionally substituted, an aryl group optionally substituted, an alkylaryl group optionally substituted or an arylalkyl group optionally substituted. More advantageously, in the organic dyes of formula (II) or (III), the radicals $R_3$ and $R_4$ are identical and both represent a hydrogen.

Advantageously, in the organic dyes of formula (II) or (III) as previously defined, the radicals $R_5$, $R_6$ and $R_8$ are identical and selected in the group consisting a hydrogen, a halogen, a cyano group (—CN), a nitro group (—NO$_2$), an alkyl group optionally substituted, an aryl group optionally substituted, an alkylaryl group optionally substituted and an arylalkyl group optionally substituted. More advantageously, in the organic dyes of formula (II) or (III), the radicals $R_5$, $R_6$ and $R_8$ represent a hydrogen.

Advantageously, in the organic dyes of formula (II) or (III) as previously defined, the radical $R_7$ is a segment -eD, a segment -L-A, an aryl group substituted by a segment -eD or an aryl group substituted by a segment -L-A.

In a $2^{nd}$ embodiment, the radicals $R_3$ and $R_4$ in the organic dye according to the present invention form with the carbons to which they are attached an aromatic or heteroaromatic ring.

In particular, in this $2^{nd}$ embodiment, the organic dye according to the invention presents the following formula (IV):

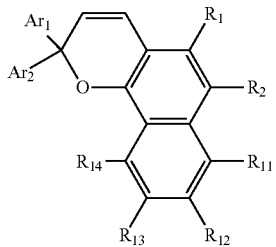

in which the radicals $Ar_1$, $Ar_2$, $R_1$ and $R_2$ are as previously defined;
the radicals $R_{11}$ to $R_{14}$, identical or different, represent a hydrogen, a halogen, a cyano group (—CN), a nitro group (—NO$_2$), an alkyl group optionally substituted, an aryl group optionally substituted, an alkylaryl group optionally substituted, an arylalkyl group optionally substituted, a segment -eD or a segment -L-A; the radicals $R_{11}$ and $R_{12}$ may form with the carbons to which they are attached an aromatic or heteroaromatic ring eventually substituted and the radicals $R_{13}$ and $R_{14}$ may form with the carbons to which they are attached an aromatic or heteroaromatic ring eventually substituted;

in which either the radical $Ar_1$ and/or the radical $Ar_2$ is/are substituted by a segment -eD and at least one element selected in the group consisting of the radical $R_1$, the radical $R_2$, the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached and the aromatic or heteroaromatic ring formed by the radicals $R_{13}$ and $R_{14}$ with the carbons to which they are attached is a segment -L-A or is substituted by a segment -L-A;

or the radical $Ar_1$ and/or the radical $Ar_2$ is/are substituted by a segment -L-A and at least one element selected in the group consisting of the radical $R_1$, the radical $R_2$, the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached and the aromatic or heteroaromatic ring formed by the radicals $R_{13}$ and $R_{14}$ with the carbons to which they are attached is a segment -eD or is substituted by a segment -eD;

with a segment -eD and a segment -L-A being as previously defined.

More particularly, in this $2^{nd}$ embodiment, the organic dye according to the invention presents the following formula (V):

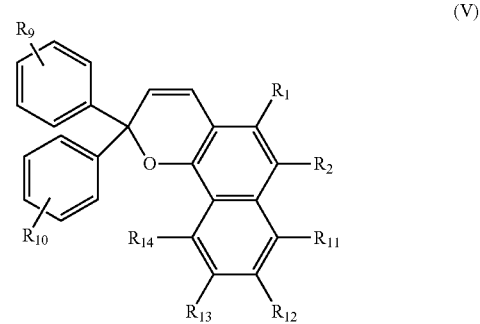

in which the radicals $R_1$, $R_2$, $R_9$, $R_{10}$ and $R_{11}$ to $R_{14}$ are as previously defined;

in which either the radical $R_9$ and/or the radical $R_{10}$ is/are a segment -eD or is/are substituted by a segment -eD and at least one element selected in the group consisting of the radical $R_1$, the radical $R_2$, the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached and the aromatic or heteroaromatic ring formed by the radicals $R_{13}$ and $R_{14}$ with the carbons to which they are attached is a segment -L-A or is substituted by a segment -L-A;

or the radical $R_9$ and/or the radical $R_{10}$ is/are a segment -L-A or is/are substituted by a segment -L-A and at least one element selected in the group consisting of the radical $R_1$, the radical $R_2$, the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached and the aromatic or heteroaromatic ring formed by the radicals $R_{13}$ and $R_{14}$ with the carbons to which they are attached is a segment -eD or is substituted by a segment -eD;

with a segment -eD and a segment -L-A being as previously defined.

Advantageously, in the organic dyes of formula (IV) or (V) as previously defined, the radical $R_{11}$, the radical $R_{12}$, the radical $R_{13}$, the radical $R_{14}$ are identical and represent a hydrogen, a halogen, a cyano group (—CN), a nitro group (—$NO_2$), an alkyl group optionally substituted, an aryl group optionally substituted, an alkylaryl group optionally substituted or an arylalkyl group optionally substituted. More advantageously, in the organic dyes of formula (IV) or (V) as previously defined, the radical $R_{11}$, the radical $R_{12}$, the radical $R_{13}$, the radical $R_{14}$ are identical and represent a hydrogen.

Advantageously, in the organic dyes of formula (IV) or (V) as previously defined, the radicals $R_1$ and $R_2$ are different and selected in the group consisting a hydrogen, a halogen, a cyano group (—CN), a nitro group (—$NO_2$), an alkyl group optionally substituted, an aryl group optionally substituted, an alkylaryl group optionally substituted and an arylalkyl group optionally substituted. More advantageously, in the organic dyes of formula (IV) or (V) as previously defined, the radical $R_1$ represents a hydrogen and the radical $R_2$ is a segment -eD, a segment -L-A, an aryl group substituted by a segment -eD or an aryl group substituted by a segment -L-A.

In a $3^{rd}$ embodiment, the radicals $R_1$ and $R_2$ in the organic dye according to the present invention form with the carbons to which they are attached an aromatic or heteroaromatic ring and the radicals $R_3$ and $R_4$ in the organic dye according to the present invention form with the carbons to which they are attached an aromatic or heteroaromatic ring.

In a $1^{st}$ variant of this $3^{rd}$ embodiment, the organic dye according to the invention presents the following formula (VI):

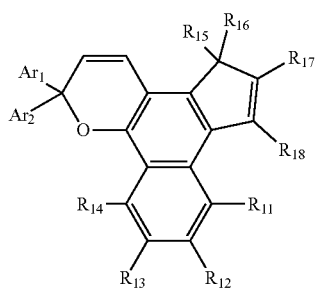

(VI)

in which the radicals $Ar_1$, $Ar_2$ and $R_1$ to $R_{14}$ are as previously defined;

the radicals $R_{15}$ to $R_{18}$, identical or different, represent a hydrogen, a halogen, a cyano group (—CN), a nitro group (—$NO_2$), an alkyl group optionally substituted, an aryl group optionally substituted, an alkylaryl group optionally substituted or an arylalkyl group optionally substituted; the radicals $R_{15}$ and $R_{16}$ may form together a =O or =$C(R_{24})(R_{25})$ group with the radicals $R_{24}$ and $R_{25}$, identical or different, representing a hydrogen, a halogen, a cyano group (—CN), a nitro group (—$NO_2$), an alkyl group optionally substituted, an aryl group optionally substituted, an alkylaryl group optionally substituted or an arylalkyl group optionally substituted and the radicals $R_{17}$ and $R_{18}$ may form with the carbons to which they are attached an aromatic or heteroaromatic ring eventually substituted;

in which either the radical $Ar_1$ and/or the radical $Ar_2$ is/are substituted by a segment -eD and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{17}$, the radical $R_{18}$, the radical $R_{24}$, the radical $R_{25}$ and the aromatic or heteroaromatic ring formed by the radicals $R_{17}$ and $R_{18}$ with the carbons to which they are attached is substituted by a segment -L-A;

or the radical $Ar_1$ and/or the radical $Ar_2$ is/are substituted by a segment -L-A and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{17}$, the radical $R_{18}$, the radical $R_{24}$, the radical $R_{25}$ and the aromatic or heteroaromatic ring formed by the radicals $R_{17}$ and $R_{18}$ with the carbons to which they are attached is substituted by a segment -eD;

with a segment -eD and a segment -L-A being as previously defined.

In a $2^{nd}$ variant of this $3^{rd}$ embodiment, the organic dye according to the invention presents the following formula (VII):

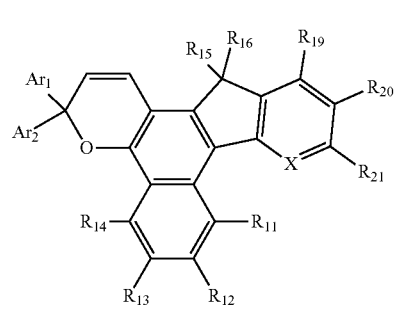

(VII)

in which the radicals $Ar_1$, $Ar_2$ and $R_1$ to $R_{16}$ are as previously defined;

X represents $C(R_{26})$ or N;

the radicals $R_{19}$ to $R_{21}$, identical or different, represent a hydrogen, a halogen, a cyano group (—CN), a nitro group (—$NO_2$), an alkyl group optionally substituted, an aryl group optionally substituted, an alkylaryl group optionally substituted, an arylalkyl group optionally substituted, a segment -eD or a segment -L-A;

the radical $R_{26}$ represents a hydrogen, a halogen, a cyano group (—CN), a nitro group (—$NO_2$), an alkyl group optionally substituted, an aryl group optionally substituted, an alkylaryl group optionally substituted or an arylalkyl group optionally substituted;

in which either the radical $Ar_1$ and/or the radical $Ar_2$ is/are substituted by a segment -eD and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{19}$, the radical $R_{20}$, the radical $R_{21}$, the radical $R_{24}$ and the radical $R_{25}$ is a segment -L-A or is substituted by a segment -L-A;

or the radical $Ar_1$ and/or the radical $Ar_2$ is/are substituted by a segment -L-A and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{19}$, the radical $R_{20}$, the radical $R_{21}$, the radical $R_{24}$ and the radical $R_{25}$ is a segment -eD or is substituted by a segment -eD;

with a segment -eD and a segment -L-A being as previously defined.

In particular, in this $2^{nd}$ variant of this $3^{rd}$ embodiment, the organic dye according to the invention presents the following formula (VIII):

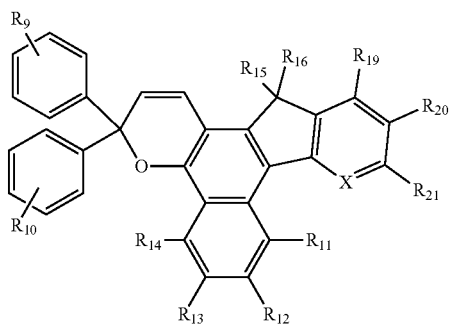

in which

X, the radicals $R_9$ to $R_{16}$ and $R_{19}$ to $R_{21}$ are as previously defined;

in which either the radical $R_9$ and/or the radical $R_{10}$ is/are a segment -eD or is/are substituted by a segment -eD and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{19}$, the radical $R_{20}$, the radical $R_{21}$, the radical $R_{24}$ and the radical $R_{25}$ is a segment -L-A or is substituted by a segment -L-A;

or the radical $R_9$ and/or the radical $R_{10}$ is/are a segment -L-A or is/are substituted by a segment -L-A and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{19}$, the radical $R_{20}$, the radical $R_{21}$, the radical $R_{24}$ and the radical $R_{25}$ is a segment -eD or is substituted by a segment -eD;

with a segment -eD and a segment -L-A being as previously defined.

Advantageously, in the organic dyes of formula (VII) or (VIII) as previously defined, the radicals $R_{19}$ and $R_{21}$ are identical and the radical $R_{20}$ is different therefrom. The radicals $R_{19}$ and $R_{21}$ are selected in the group consisting of a hydrogen, a halogen, a cyano group (—CN), a nitro group (—NO$_2$), an alkyl group optionally substituted, an aryl group optionally substituted, an alkylaryl group optionally substituted and an arylalkyl group optionally substituted.

More advantageously, in the organic dyes of formula (VII) or (VIII) as previously defined, the radicals $R_{19}$ and $R_{21}$ are identical and represent a hydrogen and the radical $R_{20}$ is a segment -eD, a segment -L-A, an aryl group substituted by a segment -eD or an aryl group substituted by a segment -L-A.

Advantageously, in the organic dyes of formula (VII) or (VIII) as previously defined, X represents CH.

In a $3^{rd}$ variant of this $3^{rd}$ embodiment, the organic dye according to the invention presents the following formula (IX):

in which the radicals $Ar_1$, $Ar_2$ and $R_{11}$ to $R_{16}$ are as previously defined;

Y represents $C(R_{27})(R_{28})$, $C(=O)$, S, Se, O, $N(R_{29})$, $P(R_{30})$ or $Si(R_{31})(R_{32})$;

the radicals $R_{22}$ and $R_{23}$, identical or different, represent a hydrogen, a halogen, a cyano group (—CN), a nitro group (—NO$_2$), an alkyl group optionally substituted, an aryl group optionally substituted, an alkylaryl group optionally substituted, an arylalkyl group optionally substituted, a segment -eD or a segment -L-A;

the radicals $R_{27}$ to $R_{32}$, identical or different, represent a hydrogen, an alkyl group optionally substituted, an aryl group optionally substituted, an alkylaryl group optionally substituted or an arylalkyl group optionally substituted;

in which either the radical $Ar_1$ and/or the radical $Ar_2$ is/are substituted by a segment -eD and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{22}$, the radical $R_{23}$, the radical $R_{24}$ and the radical $R_{25}$ is a segment -L-A or is substituted by a segment -L-A;

or the radical $Ar_1$ and/or the radical $Ar_2$ is/are substituted by a segment -L-A and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{22}$, the radical $R_{23}$, the radical $R_{24}$ and the radical $R_{25}$ is a segment -eD or is substituted by a segment -eD;

with a segment -eD and a segment -L-A being as previously defined.

In particular, in this $3^{rd}$ variant of this $3^{rd}$ embodiment, the organic dye according to the invention presents the following formula (X):

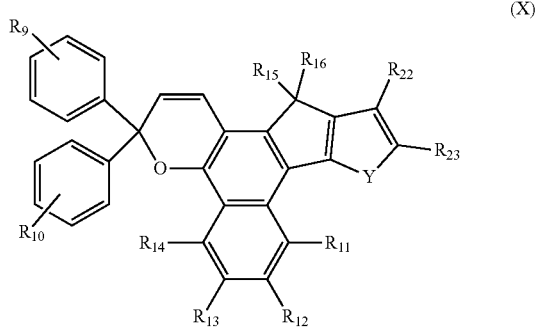

(X)

in which
Y, the radicals $R_9$ to $R_{16}$, $R_{22}$ and $R_{23}$ are as previously defined;
in which
either the radical $R_9$ and/or the radical $R_{10}$ is/are a segment -eD or is/are substituted by a segment -eD and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{22}$, the radical $R_{23}$, the radical $R_{24}$ and the radical $R_{25}$ is a segment -L-A or is substituted by a segment -L-A;

or the radical $R_9$ and/or the radical $R_{10}$ is/are a segment -L-A or is/are substituted by a segment -L-A and at least one element selected in the group consisting of the radical $R_{11}$, the radical $R_{12}$, the radical $R_{13}$, the radical $R_{14}$, the aromatic or heteroaromatic ring formed by the radicals $R_{11}$ and $R_{12}$ with the carbons to which they are attached, the aromatic or heteroaromatic ring formed by the radicals $R_{13}$ and $R_{14}$ with the carbons to which they are attached, the radical $R_{15}$, the radical $R_{16}$, the radical $R_{22}$, the radical $R_{23}$, the radical $R_{24}$ and the radical $R_{25}$ is a segment -eD or is substituted by a segment -eD;

with a segment -eD and a segment -L-A being as previously defined.

Advantageously, in the organic dyes of formula (IX) or (X) as previously defined, the radicals $R_{22}$ and $R_{23}$ are different and selected in the group consisting of a hydrogen, a halogen, a cyano group (—CN), a nitro group (—NO$_2$), an alkyl group optionally substituted, an aryl group optionally substituted, an alkylaryl group optionally substituted and an arylalkyl group optionally substituted. More advantageously, the radical $R_{22}$ represents a hydrogen and the radical $R_{23}$ is a segment -eD, a segment -L-A, an aryl group substituted by a segment -eD or an aryl group substituted by a segment -L-A. Alternatively, the radical $R_{23}$ represents a hydrogen and the radical $R_{22}$ is a segment -eD, a segment -L-A, an aryl group substituted by a segment -eD or an aryl group substituted by a segment -L-A.

Advantageously, in the organic dyes of formula (IX) or (X) as previously defined, Y represents CH$_2$.

Advantageously, in the organic dyes of formulas (VI) to (X) as previously defined, the radicals $R_{15}$ and $R_{16}$ are identical and selected from the group consisting a halogen, a cyano group (—CN), a nitro group (—NO$_2$), an alkyl group optionally substituted, an aryl group optionally substituted, an alkylaryl group optionally substituted and an arylalkyl group optionally substituted.

More advantageously, in the organic dyes of formulas (VI) to (X) as previously defined, the radicals $R_{15}$ and $R_{16}$ are identical and represent an alkylaryl optionally substituted. In particular, in the organic dyes of formula (VII) or (X) as previously defined, the radicals $R_{15}$ and $R_{16}$ represent a group —C$_6$H$_4$—C$_6$H$_{13}$.

Advantageously, in the organic dyes of formulas (IV) to (X) as previously defined, the radical $R_{11}$, the radical $R_{12}$, the radical $R_{13}$ and the radical $R_{14}$ are identical and represent a hydrogen, a halogen, a cyano group (—CN), a nitro group (—NO$_2$), an alkyl group optionally substituted, an aryl group optionally substituted, an alkylaryl group optionally substituted or an arylalkyl group optionally substituted.

More advantageously, in the organic dyes of formula (IV) to (X) as previously defined, the radical $R_{11}$, the radical $R_{12}$, the radical $R_{13}$, the radical $R_{14}$ are identical and represent a hydrogen.

In particular, in the organic dyes of formulas (III), (V), (VIII) and (X) as previously defined, the radicals $R_9$ and $R_{10}$ are different and selected from the group consisting of a hydrogen, a halogen, a cyano group (—CN), a nitro group (—NO$_2$), an alkyl group optionally substituted, an aryl group optionally substituted, an alkylaryl group optionally substituted, an arylalkyl group optionally substituted, a segment -eD or a segment -L-A. Advantageously, the radical $R_9$ represents a hydrogen and the radical $R_{10}$ is a segment -eD, a segment -L-A, an aryl group substituted by a segment -eD or an aryl group substituted by a segment -L-A and advantageously the radical $R_{10}$ is a segment -L-A or an aryl group substituted by a segment -L-A. More advantageously, the radical $R_{10}$ is a segment -L-A, a C$_6$H$_4$— group substituted by a segment -L-A or a C$_4$H$_2$S— group substituted by a segment -L-A.

"Electron donor segment (eD)" is taken to mean, within the scope of the present invention, an electron donor function that enables the organic dye according to the present invention to be reduced more easily by the electrolyte.

Any electron donor segment known to those skilled in the art and commonly used in the field of photosensitizer organic colorants may be used within the scope of the present invention. As examples of such electron donor segments may be cited those described from page 42, line 10 to page 45, line 1 of the international application WO 2009/109499 [7] and those implemented in the 56 organic colorants described in Mishra et al, 2009 [8].

Advantageously, the electron donor segment implemented within the scope of the present invention is an amino group of (Z$_1$)(Z$_2$)N-type, with Z$_1$ and Z$_2$, identical or different, representing an alkyl group optionally substituted or an aryl group optionally substituted as defined previously. In particular, when Z$_1$ and/or Z$_2$, identical or different, represent a substituted aryl group, the latter is substituted by one group or several groups, identical or different, with electron donor character. "Electron donor character" is taken to mean, within the scope of the present invention, a group chosen from an alkyl group, comprising from 1 to 10 carbon atoms, optionally substituted; an alkoxy group comprising from 1 to 10 carbon atoms, optionally substituted; a diamine group and particularly a di(alkyl)amino group optionally substituted on the alkyl group(s) by an hydroxy; a alkylthio group and a thioether group.

In the experimental part hereafter, two examples of electron donor segment are given. They are of formula —N(C$_6$H$_5$)$_2$ and of formula —N(C$_6$H$_4$—C$_6$H$_{13}$)$_2$. They are useable in any organic dye according to the invention.

"Electron acceptor segment (A)" is taken to mean, within the scope of the present invention, an electron acceptor function which ensures the anchoring of the organic dye according to the present invention on the solid support such as a solid support of metal oxide type while ensuring good transfer of charges between said support and said colorant.

Any electron acceptor segment known to those skilled in the art and commonly used in the field of photosensitizer organic colorants may be used within the scope of the present invention. As examples of such electron acceptor segments may be cited those as defined on page 1, lines 26 and 27 and particularly exemplified on page 29, lines 7 to 23; page 37, lines 6 to 9; from page 46, line 6 to page 47, line 1 or page 47, lines 2 to 8 of international application WO 2009/109499 [7] and those implemented in the 56 organic colorants described in Mishra et al, 2009 [8].

Advantageously, the electron acceptor segment implemented within the scope of the present invention is a carboxylic acid group, a cyanoacrylic acid group, a phosphonic group, a dithiocarboic group or a group corresponding to any of the following formula:

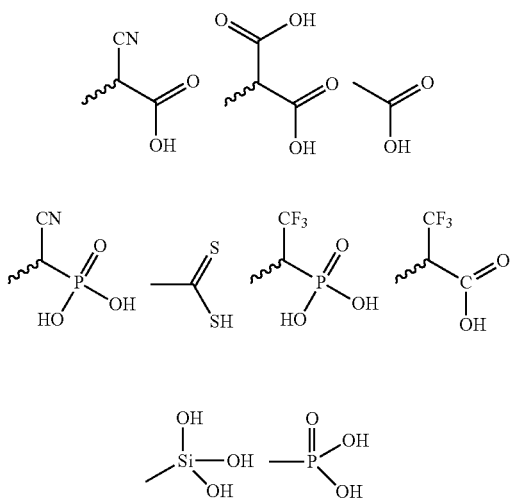

Within the scope of the present invention, the pi-conjugated chromophore and the electron acceptor segment are advantageously separated from each other by a spacer (L).

Any spacer known to those skilled in the art and commonly used in the field of photosensitizer organic colorants may be used within the scope of the present invention. As examples of such spacers, those implemented in the 56 organic colorants described in Mishra et al, 2009 [8] may be cited.

Within the scope of the present invention, the spacer L is particularly a pi-conjugated function such as an alkenylene or alkynylene chain optionally substituted or an arylene chain optionally substituted.

Within the scope of the present invention, "alkylene chain" is taken to mean a linear, branched or cyclic alkylene chain, comprising from 1 to 40 carbon atoms, particularly from 2 to 30 carbon atoms and which can optionally comprise at least one heteroatom. By way of examples of alkylene chains that may be used, methylene, ethylene, n-propylene, isopropylene, butylene, isobutylene, sec-butylene, tert-butylene, pentylene, isopentylene, hexylene, cyclopentylene, cyclohexylene, —(CH$_2$)$_n$—O—(CH$_2$)$_m$—, —(CH$_2$)$_n$—S—(CH$_2$)$_m$—, —(CH$_2$)$_n$—S—S—(CH$_2$)$_m$—, —(CH$_2$)$_n$—C(O)O—(CH$_2$)$_m$—, —(CH$_2$)$_n$—N(R)—(CH$_2$)$_m$—, —(CH$_2$)$_n$—N(R')—(CH$_2$)$_p$—N(R")—(CH$_2$)$_m$— groups may be cited with R representing a hydrocarbon group as defined previously and n, m and p, identical or different, representing a whole number comprised between 0 and 20.

Within the scope of the present invention, "alkenylene or alkynylene chain" is taken to mean a linear, branched or cyclic alkenylene or alkynylene chain, comprising from 4 to 40 carbon atoms and particularly from 4 to 30 carbon atoms and which can optionally comprise at least one heteroatom. As examples of alkenylene or alkynylene chains being able to be used, butenylene or butynylene, isobutenylene or isobutynylene, sec-butenylene or sec-butynylene, tert-butenylene or tert-butynylene, pentenylene or pentynylene, isopentenylene or isopentynylene, cyclopentenylene or cyclopentynylene, cyclohexenylene or cyclohexynylene groups may be cited.

Within the scope of the present invention, "arylene chain" is taken to mean an arylene chain with one ring or several rings joined or connected by a single bond or by a hydrocarbon group, each ring having from 4 to 50 carbon atoms and particularly from 4 to 40 carbon atoms and which can comprise optionally at least one heteroatom. As examples of arylene chains which may be used, phenylene, biphenylene, naphthylene, anthracenylene, cyclopentadienylene, pyrenylene, tetrahydronaphthylene, furanylene, pyrrolylene, thiophenylene, selenophenylene, oxazolylene, pyrazolylene, isoquinolinylene, thiazolylene, imidazolylene, triazolylene, pyridinylene, pyranylene, quinolinylene, pyrazinylene and pyrimidinylene groups may be cited.

Within the scope of the present invention, "substituted alkylene chain", "substituted alkenylene or alkynylene chain" or "substituted arylene chain" are taken to mean an alkylene chain, an alkenylene or an alkynylene chain or arylene chain as defined previously having one substitution or several substitutions, identical or different, this or these substitutions corresponding, preferably, to halogen atoms or to aliphatic groups optionally comprising at least one heteroatom such as, for example, a —COOR", —CHO, —OR", —SR", —SCOR", —SO$_2$R", —NR"R'", —CONR"R'", —C(Hal)$_3$, —OC(Hal)$_3$, —C(O)Hal or —CN group in which R" and R'" represent a hydrogen atom or a hydrocarbon group as defined previously, whereas Hal represents a halogen atom, particularly fluorine, chlorine or bromine.

As spacers L which can be more particularly implemented within the scope of the present invention, an ethylenyl, propylenyl, butenyl, phenylene, benzylene or naphthylene chain may be cited.

In a particularly advantageous manner, the organic dye according to the present invention is chosen from the following compounds:
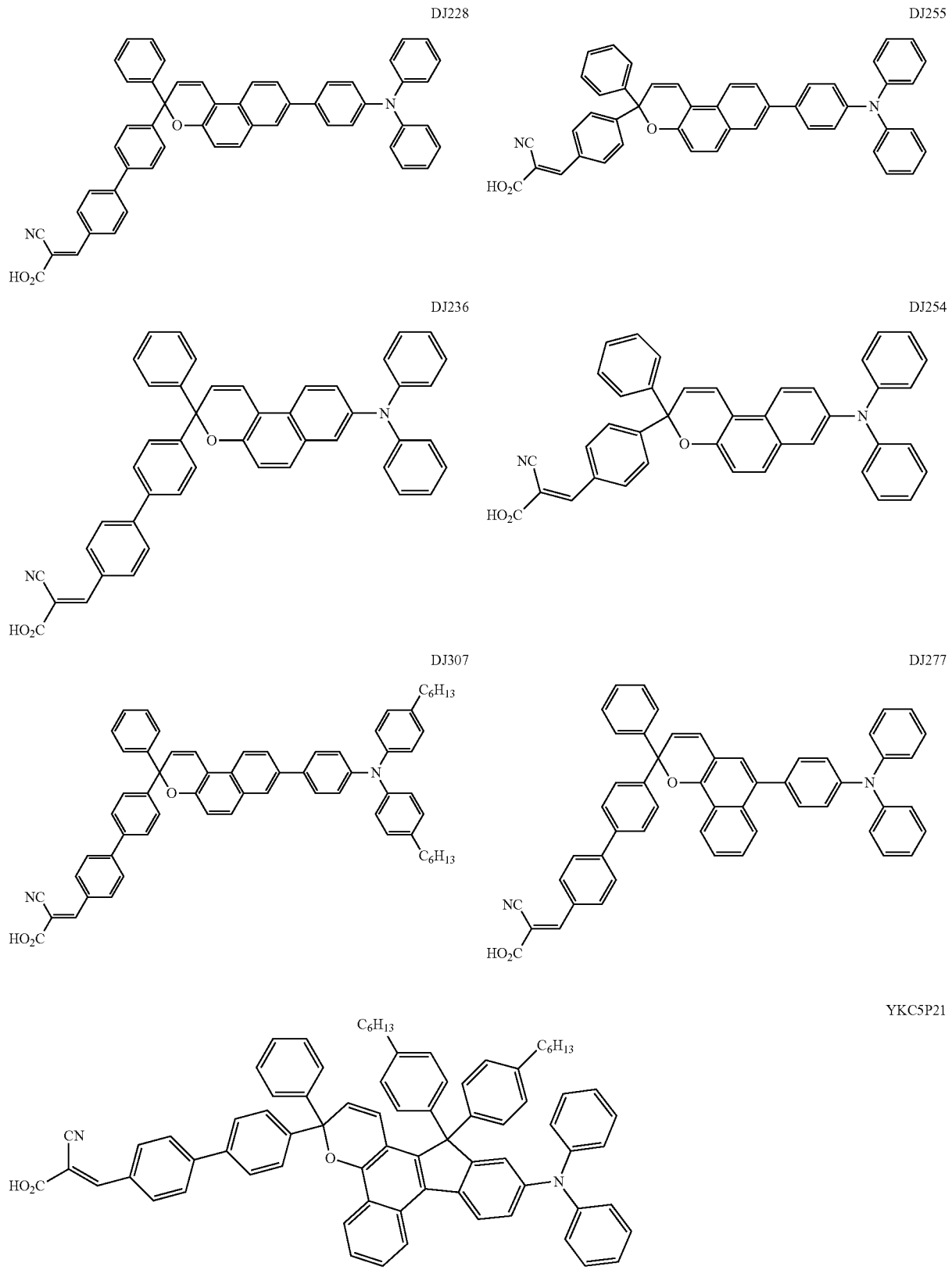

LG36

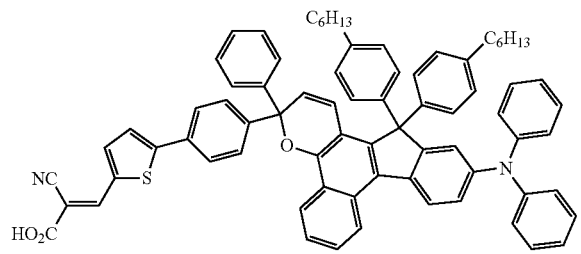

YKC5P98

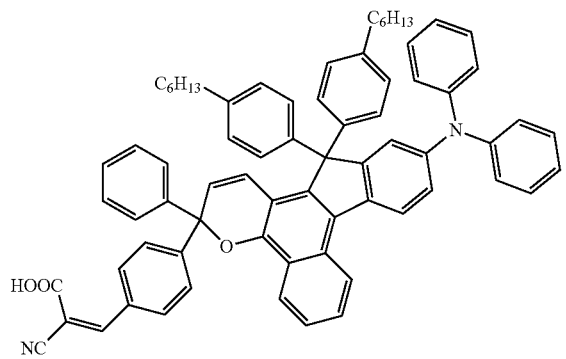

For all of the units and structures described in the present invention, the latter covers all stereo-isomers, all tautomers and all enantiomers that may be envisaged.

The present invention also relates to a method of preparing an organic dye as defined in the present invention. Said method of preparation implements chemical reactions well known to those skilled in the art. The latter, on the basis of the different protocols explained in the experimental part hereafter and protocols for preparing organic dyes of the prior art, could prepare any organic dye according to the present invention without any inventive effort.

The present invention moreover relates to an organic dye as defined previously used as photosensitizer in a photovoltaic device.

Within the scope of the present invention, the expressions "photovoltaic device", "photovoltaic cell", "Dye-Sensitized Solar Cell" and "DSSC" are similar and can be used in an interchangeable manner.

Consequently, the present invention relates to the photovoltaic device thereby obtained i.e. a photovoltaic device having a nanostructured semi-conductor metal oxide layer sensitized by an organic dye as defined in the present invention. It should be noted that since the organic dyes according to the present invention are organic photochromic dyes that can act as sensitizers of wide band gap semiconductors, the photovoltaic cell thus obtained is a semi-transparent solar cell capable to adapt its absorption depending on the light intensity. The present invention have thus developed the concept of photo-chromo-voltaic cells.

In the photovoltaic cell according to the present invention, the organic dye as defined previously reacts with the metal oxide layer via its electron attractor segment to give a group derived from the functionalising organic dye, i.e. covalently bonded to the metal oxide layer. These functionalising groups thus have an electron donor segment (eD), a pi-conjugated chromophore, optionally a spacer (L) and a group derived from the electron acceptor segment (A) covalently bonded to the metal oxide layer, the electron donor segment (eD), the pi-conjugated chromophore, the spacer (L) and the electron acceptor segment (A) being as defined previously.

Within the scope of the present invention, when the organic photochromic dye reacts with, i.e. is adsorbed on, the metal oxide layer, said reaction may take place in the presence of an additive such as another organic colorant or a co-adsorbent.

The other organic colorant, which can also be adsorbed on the metal oxide layer, may be (a) another chromophoric dye according to the present invention, (b) a mixture of chromophoric dyes according to the present invention, (c) another colorant different from a chromophoric dye according to the present invention and (d) a mixture comprising at least one other chromophoric dye according to the present invention and at least one other dye different from a chromophoric dye according to the present invention.

"Dye different from a chromophoric dye according to the present invention" is taken to mean, within the scope of the present invention, a dye chosen from a metal complex dye and/or an organic dye such as a dye of indoline, courmarine, cyanine, merocyanine, hemicyanine, methine, azo, quinone, quinonimine, diceto-pyrrolo-pyrrole, quinacridone, squaraine, triphenylmethane, perylene, indigo, xanthene, eosin, rhodamine, phthalocyanine optionally metallised, porphyrine optionally metallised and mixtures thereof.

As co-adsorbents that can be used within the scope of the present invention may be cited steroid co-adsorbents such as deoxycholic acid, dehydrodeoxycholic acid, chenodeoxycholic acid, cholic acid methyl ester, the sodium salt of cholic acid or a mixture thereof.

The photovoltaic device according to the present invention moreover comprises two electrodes, designated, within the scope of the invention, anode and counter electrode, and separated from each other by an electrolyte and optionally polymer shims.

Advantageously, the anode implemented within the scope of the present invention consists of a layer of tin dioxide doped with fluorine ($SnO_2$:F or FTO) or indium tin oxide (ITO) deposited on a glass plate.

Within the scope of the present invention, "semi-conductor metal oxide" is taken to mean any binary, tertiary or quaternary metal oxide. Within the scope of the present invention, "nanostructured semi-conductor metal oxide" is taken to mean any semi-conductor metal oxide as defined previously comprising pores and particularly pores in which the average size is comprised between 20 and 500 Å, i.e. any mesoporous semi-conductor metal oxide as defined previously. Thus, the nanostructured semi-conductor metal oxide layer in the form of a mesoporous layer is deposited on the anode as defined previously.

Within the scope of the present invention, "binary metal oxide" is taken to mean a metal oxide of $M^{II}O$, $M^{III}_2O_3$ or $M^{V}_2O_5$ type with M representing a mono-, bi-, tri-, penta-valent metal and O an oxygen atom. As examples of such binary metal oxides may be cited $TiO_2$, $ZnO$, $SnO_2$, $Nb_2O_5$, $In_2O_3$ and $RuO_2$.

Within the scope of the present invention, "tertiary metal oxide" is taken to mean a metal oxide of MM'O type with M and M' representing two different bivalent metals. As an indication, $Zn_2SnO_4$, $SrTiO_4$, $SrTiO_3$, $BaSnO_3$ may be cited.

Within the scope of the present invention, "quaternary metal oxide" is taken to mean a composition of mixed oxides. Within the scope of the present invention, "composition of mixed oxides" is taken to mean:

- a mixture of two binary oxides as defined previously. For example, mixtures may be cited such as $(ZnO)_{1-x}$—$(SnO_2)_x$, $(TiO_2)_{1-x}$—$(Nb_2O_5)_x$, or
- a mixture of a binary oxide and a tertiary oxide as defined previously. For example a mixture of $(SnO_2)$—$(SrTiO_3)$ may be cited.

Within the scope of the photovoltaic device according to the present invention, the electrolyte may be a liquid, an ionic liquid, a gel or a solid. Such an electrolyte is particularly as disclosed in the book of Kalyanasundaram K., 2010 [9].

When the electrolyte is a liquid electrolyte, it is advantageously chosen from customary liquid electrolytes such as $I^-/I_3^-$, $Br^-/Br_2^-$, $SCN^-/(SCN)_2$ or cobalt complexes of Co(III/II) type.

When the electrolyte is an electrolyte of gel or ionic liquid type, it is advantageously chosen from imidazolium salts such as, by way of examples and in a non-exhaustive manner, 1-ethyl-3-methylimidazolium selenocyanate (EMISeCN), 1-ethyl-3-methylimidazolium thiocyanate (EMISCN) or 1-methyl-3-n-hexylimidazolium iodide (MHIml).

When the electrolyte is a solid type electrolyte, it is advantageously chosen from a p-type semi-conductor solid, such as a polymer or a small molecule, being able to be deposited by liquid process. More particularly, the electrolyte of solid type capable of being implemented within the scope of the present invention is chosen from the compound spiro-OMeTAD or a derivative of triarylamine. A pi-conjugated polymer may also be used such as, for example, poly(3,4-ethylenedioxythiophene) (PEDOT) or a mixture of PEDOT and sodium poly(styrene sulphonate) (PSS) known as PEDOT:PSS. A polymer of poly(ethylene) oxide type containing a redox couple or even polyaniline may also be used.

Whatever the type of electrolyte implemented within the scope of the present invention, the latter moreover comprises a redox couple such as the redox couple $I^-/I_3^-$ or a cobalt complex and optionally an anion of bis(trifluoromethanesulphonyl)imide (TFSI) type such as Li-TFSI and does so to improve the conductivity of the electrolyte.

Within the scope of the present invention, "polymer shim" is taken to mean a thermal polymer adhesive making it possible to set the two electrodes. Such polymer adhesives are particularly the adhesives of Solaronix brand such as those of the Amosil or even Meltonix range or even the adhesives of the FastelFilm range of Dupond. These polymers come in the form of thick hot melt thermoplastic sheets. The sealing occurs when the polymer is heated to around 100° C. for several seconds, for example, using a vacuum laminator, a hot press or a soldering iron for small surfaces. Typically, the seals or the strips are cut and laid out on the electrode substrate before hot lamination.

Finally, the counter electrode of the photovoltaic device according to the present invention is constituted of a metal layer deposited on a transparent solid FTO support according to an operating method well known to those skilled in the art.

Other characteristics and advantages of the present invention will become clearer to those skilled in the art on reading the examples below given for illustrative and non-limiting purposes, and by referring to the appended drawings.

DETAILED DISCUSSION OF PARTICULAR EMBODIMENTS

I. Synthesis of the Compounds

I.1. Nuclear Magnetic Resonance (NMR)

Figure 1:
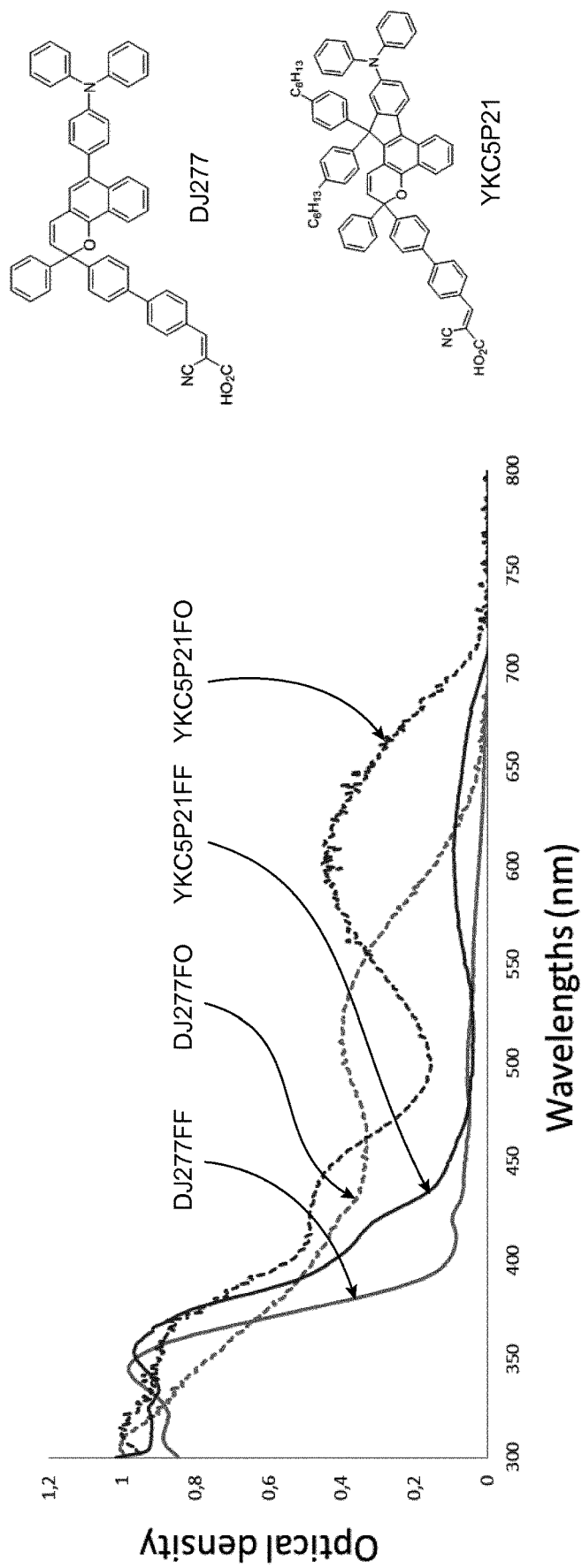
FIG. 1 shows the absorption spectrum of two organic chromophoric dyes according to the present invention (DJ277 and YKC5P21).

NMR spectra were recorded on Bruker AC 200 MHz and Bruker AC 400 MHz spectrometers. The deuterated solvents used were chloroform-d (1H, δ: 7.26, 13C, δ: 77.16), acetone-d₆ (1H δ: 2.05, 13C, δ: 29.84), tetrahydrofuran-d₈ (1H, δ: 3.58, 13C, δ: 67.21) and dichloromethane-d₂ (1H, δ: 5.32, 13C, δ: 53.84). The follow abbreviations were used: s for singlet, d for doublet, t for triplet, m for multiplet and br for broaden signals.

All synthesis intermediates and final products were characterized by ¹H and ¹³C NMR to confirm their structures.

I.2. Synthesis of (Z)-2-cyano-3-(4-(8-(diphenylamino)-3-phenyl-3H-benzo[f]chromen-3-yl)phenyl)acrylic acid (DJ254)

A. 1-(4-bromophenyl)-1-phenylprop-2-yn-1-ol

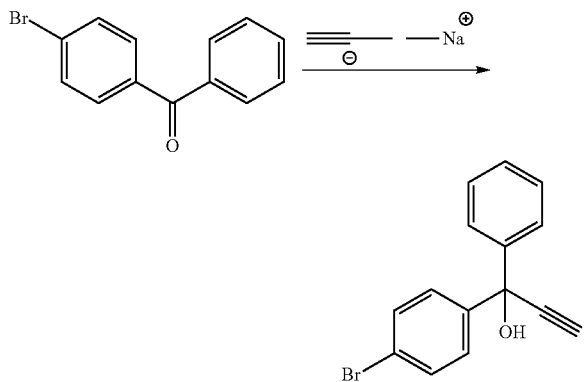

Under argon, sodium acetylide (3.68 g, 76.6 mmol, 18 wt % in xylene) was dissolved in anhydrous THF. 4-bromobenzophenone (2.00 g, 7.6 mmol) was added in one portion at 0° C. After reaching room temperature the reaction mixture was stirred for 3 h. Then an ammonium chloride (NH₄Cl) saturated solution was added to the reaction and stirred for 10 min. The organic phase was extracted with diethyl ether (Et₂O), dried on sodium sulfate and concentrated. Purification on silica gel using dichloromethane (DCM) as eluent to give a pale yellow solid (1.75 g, 6.1 mmol, 80%).

$^1$H RMN (CD$_2$Cl$_2$, 400 MHz): δ=7.63-7.58 (m, 2H, H$_{ar}$), 7.49 (qAB, 4H, J Δvab=9.1 Hz, J=8.6 Hz, H$_{ar}$), 7.40-7.27 (m, 3H, H$_{ar}$), 3.11 (s, 1H, OH), 2.97 (s, 1H, C≡CH).

$^{13}$C RMN (CD$_2$Cl$_2$, 100 MHz): δ=144.19, 143.87, 131.35, 128.41, 128.06, 127.80, 125.82, 121.81, 85.78, 75.87, 73.81.

B. 6-(diphenylamino)naphthalen-2-ol

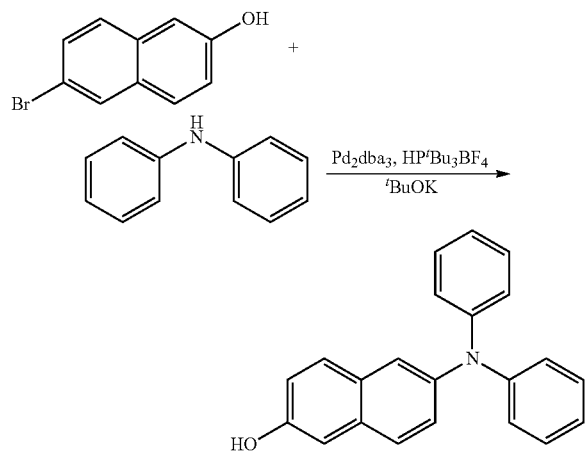

Under air condition, 2-bromo-6-naphtol (1.00 g, 4.5 mmol), 4-diphenylamine (834 mg, 5.0 mmol), Tris(dibenzylideneacetone)dipalladium(0) (Pd$_2$dba$_3$, 82 mg, 89 μmol), Tri-tert-butylphosphonium tetrafluoroborate (HP$^t$Bu$_3$BF$_4$, 52 mg, 179 μmol) and potassium tert-butoxide ($^t$BuOK, 1.5 g, 13.5 mmol) were dissolved in anhydrous toluene. The mixture was refluxed for 36 hours before being cooled to room temperature and poured into a HCl (2 M) solution. The organic phase was extracted with DCM, dried on sodium sulfate and concentrated. Purification on silica gel using n-hexane/ethyl acetate (EtOAc) (8:2) as eluent to give a white solid (0.97 g, 3.2 mmol, 70%).

$^1$H RMN (CD$_2$Cl$_2$, 400 MHz): δ=7.60 (d, 1H, J=8.8 Hz, H$_{ar}$), 7.52 (d, 1H, J=8.8 Hz, H$_{ar}$), 7.25 (d, 1H, J=2.1 Hz, H$_{ar}$), 7.30-7.20 (m, 5H, H$_{ar}$), 7.13-7.06 (m, 4H, H$_{ar}$), 7.05-6.98 (m, 3H, H$_{ar}$), 5.05 (s, 1H, OH).

$^{13}$C RMN (CD$_2$Cl$_2$, 100 MHz): δ=152.80, 147.97, 143.57, 131.31, 129.75, 129.18, 128.74, 127.32, 125.59, 123.86, 122.55, 121.31, 117.98, 109.34.

C. 3-(4-bromophenyl)-N,N,3-triphenyl-3H-benzo[f]chromen-8-amine

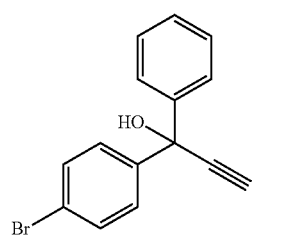

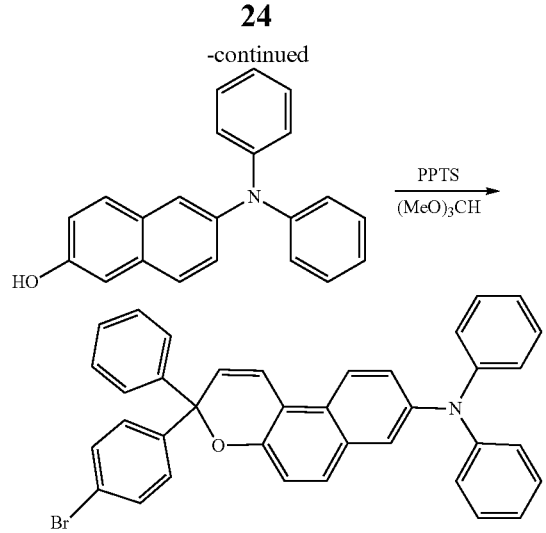

Under argon, 1-(4-bromophenyl)-1-phenylprop-2-yn-1-ol (691.0 mg, 2.41 mmol), 6-(diphenylamino)naphthalen-2-ol (500.0 mg, 1.61 mmol), pyridinium p-toluenesulfonate (PPTS, 20 mg, 80 μmol) were dissolved in anhydrous chloroform. Trimethyl orthoformate (0.35 mL, 3.21 mmol) was added and the reaction was heated to reflux for 9 h. Solvent was removed under reduced pressure and the crude solid was purified on silica gel using n-hexane/DCM (7:3) as eluent to give a white solid (628 mg, 1.08 mmol, 67%).

$^1$H RMN (CD$_2$Cl$_2$, 400 MHz): δ=7.90 (d, 1H, J=9.1 Hz), 7.53-7.46 (m, 5H, H$_{ar}$, CH═), 7.45-7.40 (m, 2H, H$_{ar}$), 7.40-7.25 (m, 10H, H$_{ar}$), 7.16 (d, 1H, J=8.9 Hz), 7.13-7.08 (m, 4H, H$_{ar}$), 7.05 (tt, 2H, J=7.3 Hz, J=1.1 Hz, H$_{ar}$), 6.31 (d, 1H, J=9.9 Hz, CCH═).

$^{13}$C RMN (CD$_2$Cl$_2$, 100 MHz): δ=149.48, 147.83, 144.38, 144.07, 143.89, 131.16, 130.45, 129.22, 128.91, 128.76, 128.18, 127.69, 126.78, 126.20, 125.55, 123.98, 122.71, 122.48, 121.64, 121.53, 120.19, 118.47, 114.46, 81.91.

D. 4-(8-(diphenylamino)-3-phenyl-3H-benzo[f]chromen-3-yl)benzaldehyde

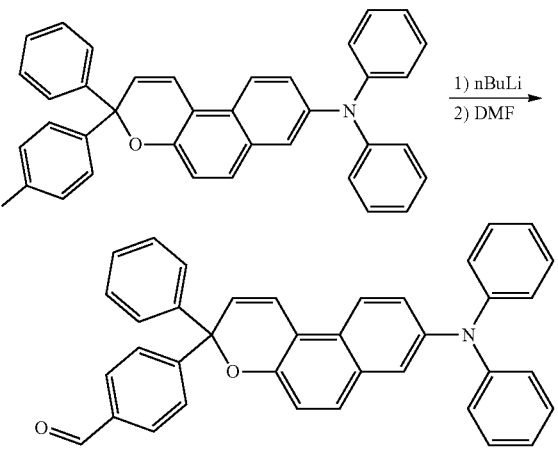

Under argon, 3-(4-bromophenyl)-N,N,3-triphenyl-3H-benzo[f]chromen-8-amine (200 mg, 0.34 mmol) was dissolved in distilled THF. Then n-Butyllithium (n-BuLi, 1.1

M, 0.34 mL, 0.38 mmol) was added at −78° C. The reaction was stirred at temperature ranging from −80° C. to −60° C. for 1 h before adding Dimethylformamide (DMF, 50 µL, 0.69 mmol) at −78° C. The reaction was allowed to reach room temperature and stirred for 12 h and then quenched with water. The organic phase was recovered with EtOAc, dried on sodium sulfate and concentrated under reduced pressure. The crude product was purified on silica gel using DCM/petroleum ether (9:1) as eluent to give a yellow solid (85 mg, 0.16 mmol, 46%).

$^1$H RMN (CD$_2$Cl$_2$, 400 MHz): δ=9.97 (s, 1H, CHO), 7.87 (d, 1H, J=9.1 Hz), 7.77 (qAB, 4H, J Δvab=52.3 Hz, J=8.3 Hz, H$_{ar}$), 7.53-7.47 (m, 2H, CH=, H$_{ar}$), 7.45 (d, 1H, J=8.9 Hz), 7.38-7.21 (m, 10H, H$_{ar}$), 7.16 (d, 1H, J=8.8 Hz), 7.10-7.04 (m, 4H, H$_{ar}$), 7.02 (tt, 2H, J=7.3 Hz, J=1.1 Hz, H$_{ar}$), 6.33 (d, 1H, J=9.9 Hz, CCH=).

$^{13}$C RMN (CD$_2$Cl$_2$, 100 MHz): δ=191.63, 151.41, 149.45, 147.81, 144.06, 143.97, 135.65, 130.51, 129.41, 129.24, 129.03, 128.29, 127.88, 127.37, 126.86, 126.18, 125.57, 124.02, 122.76, 122.50, 121.88, 121.56, 120.55, 118.45, 114.49, 82.06.

E. (Z)-2-cyano-3-(4-(8-(diphenylamino)-3-phenyl-3H-benzo[f]chromen-3-yl)phenyl)acrylic acid (DJ254)

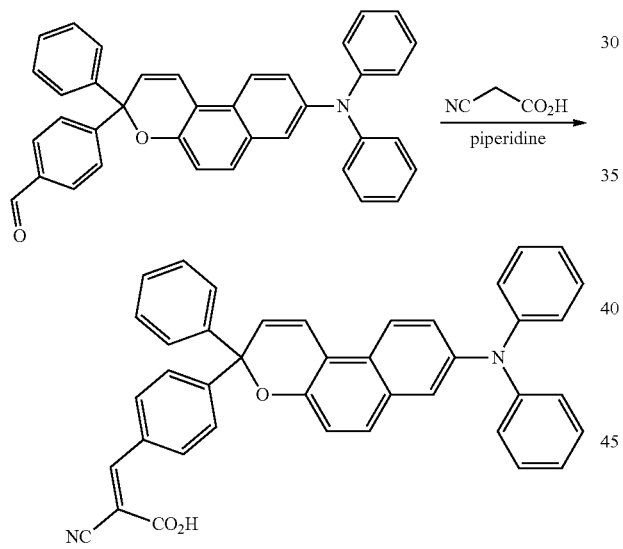

4-(8-(diphenylamino)-3-phenyl-3H-benzo[f]chromen-3-yl)benzaldehyde (105 mg, 0.20 mmol), cyanoacetic acid (73 mg, 0.99 mmol), were dissolved in a mixture of acetonitrile (8 mL) and chloroform (5 mL). A catalytic amount of piperidine was added and the solution was refluxed for 3 h. Solvent was removed under reduced pressure and the solid dissolved in chloroform. The organic phase was washed with a HCl solution (2 M), dried on sodium sulfate (Na$_2$SO$_4$) and concentrated. The crude solid was chromatographed on silica using DCM followed by DCM/methanol (MeOH) and DCM/MeOH/Acetic acid 96/2/2 as eluents to afford pale yellow solid (75 mg, 0.13 mmol, 63%).

$^1$H RMN (THF-ds, 400 MHz): δ=8.25 (s, 1H, CH=), 7.98 (d, 1H, J=9.1 Hz, H$_{ar}$), 7.89 (qAB, 4H, Δvab=122.0 Hz, J=8.4 Hz, H$_{ar}$), 7.57-7.54 (m, 2H, H$_{ar}$), 7.52 (d, 1H, J=8.9 Hz, H$_{ar}$), 7.47 (d, 1H, J=9.9 Hz, CH=), 7.39 (d, 1H, J=2.3 Hz, H$_{ar}$), 7.37-7.31 (m, 2H, H$_{ar}$), 7.31-7.19 (m, 6H, H$_{ar}$), 7.19 (d, 1H, J=8.9 Hz), 7.08 (dd, 4H, J=1.0 Hz, J=8.6 Hz, H$_{ar}$), 6.99 (tt, 2H, J=1.0 Hz, J=7.3 Hz, H$_{ar}$), 6.45 (d, 1H, J=9.9 Hz, CCH=)

$^{13}$C RMN (THF-ds, 400 MHz): δ=152.78, 152.74, 150.15, 149.63, 147.96, 144.43, 143.87, 131.17, 130.69, 130.48, 129.00, 128.88, 127.98, 127.36, 126.64, 126.47, 125.42, 123.74, 122.57, 122.41, 121.86, 120.19, 118.29, 114.49, 81.93.

I.3. Synthesis of (Z)-2-cyano-3-(4-(8-(4-(diphenylamino)phenyl)-3-phenyl-3H-benzo[f]chromen-3-yl)phenyl)acrylic acid (DJ255)

A. 6-(4-(diphenylamino)phenyl)naphthalen-2-ol

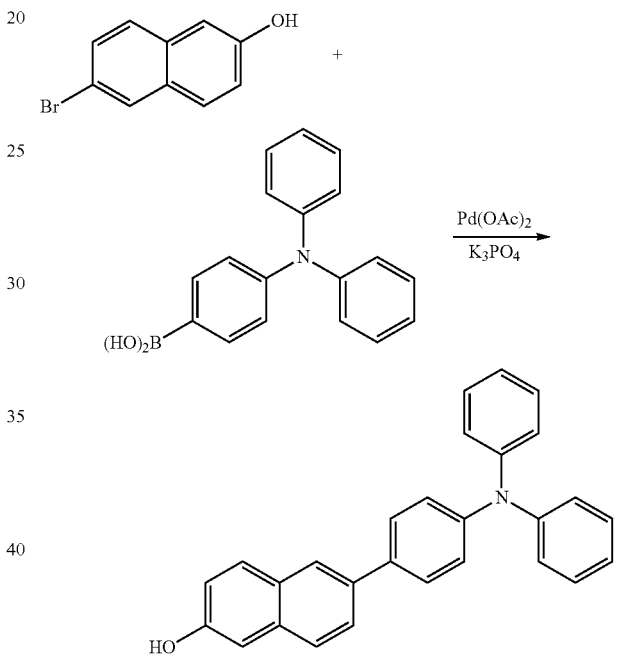

Under air condition, 2-bromo-6-naphtol (1.00 g, 4.5 mmol) and 4-diphenylamino-phenylboronic acid (1.69 g, 5.8 mmol) and palladium(II) acetate (Pd(OAc)$_2$, 20.1 mg, 89 µmol) were dissolved in isopropanol (iPrOH)/H$_2$O mixture (150 mL, 2:1). The mixture was heated to reflux and tripotassium phosphate (K$_3$PO$_4$, 2.85 g, 13.4 mmol) was added. The mixture was stirred for 2 h before being cooled to room temperature. The organic phase was extracted with EtOAc, dried on sodium sulfate and concentrated. Purification on silica gel using n-hexane/EtOAc (7:3) as eluent to give a white solid (1.30 g, 3.4 mmol, 75%).

$^1$H RMN (CD$_2$Cl$_2$, 400 MHz): δ=7.95 (s, 1H, H$_{ar}$), 7.79 (d, 1H, J=8.8 Hz, H$_{ar}$), 7.74 (d, 1H, J=8.6 Hz, H$_{ar}$), 7.69 (dd, 1H, J=1.8 Hz, J=8.6 Hz, H$_{ar}$), 7.60 (d, 2H, J=8.6 Hz, H$_{ar}$), 7.28 (dd, 4H, J=7.5 Hz, J=8.3 Hz, H$_{ar}$), 7.18-7.08 (m, 8H, H$_{ar}$) 7.04 (t, 2H, J=7.3 Hz, H$_{ar}$), 5.14 (s, 1H, OH).

$^{13}$C RMN (CD$_2$Cl$_2$, 100 MHz): δ=153.56, 147.71, 147.12, 135.70, 134.92, 133.59, 129.98, 129.26, 129.20, 127.68, 126.80, 125.80, 124.78, 124.38, 123.98, 122.94, 118.11, 109.15.

B. 4-(3-(4-bromophenyl)-3-phenyl-3H-benzo[f]chromen-8-yl)-N,N-diphenylaniline

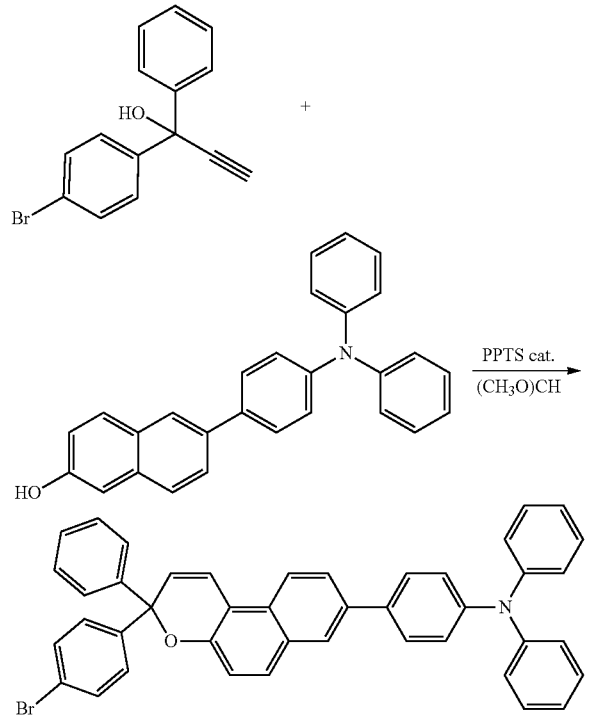

Under argon, 1-(4-bromophenyl)-1-phenylprop-2-yn-1-ol (445 mg, 1.55 mmol), 6-(4-(diphenylamino)phenyl)naphthalen-2-ol (400 mg, 1.03 mmol), PPTS (13 mg, 52 µmol) were dissolved in anhydrous 1,2-dichloroethane (5 mL). Trimethyl orthoformate (0.25 mL, 2.1 mmol) was added and the reaction was heated to reflux for 9 h. Solvent was removed under reduced pressure and the crude solid was purified on silica gel using n-hexane/DCM (7:3) as eluent to give a white solid (400 mg, 0.60 mmol, 60%).

$^1$H RMN (CD$_2$Cl$_2$, 400 MHz): δ=8.06 (d, 1H, J=8.9 Hz, H$_{ar}$), 7.97 (d, 1H, J=1.7 Hz, H$_{ar}$), 7.80 (dd, 1H, J=2.0 Hz, J=9.0 Hz), 7.77 (d, 1H, J=9.3 Hz, C=CH), 7.64 (d, 2H, J=8.7 Hz, H$_{ar}$), 7.55-7.44 (m, 5H, H$_{ar}$), 7.44-7.35 (m, 4H, H$_{ar}$), 7.35-7.29 (m, 5H, H$_{ar}$), 7.26 (d, 1H, J=8.8 Hz, H$_{ar}$), 7.22-7.14 (m, 6H, H$_{ar}$), 7.09 (tt, 2H, J=7.3 Hz, J=1.0 Hz, H$_{ar}$), 6.33 (d, 1H, J=9.9 Hz, CCH=).

$^{13}$C RMN (CD$_2$Cl$_2$, 100 MHz): δ=150.24, 147.68, 147.24, 144.35, 144.03, 135.88, 134.51, 131.17, 130.18, 129.78, 129.26, 128.76, 128.60, 128.19, 127.71, 127.63, 127.48, 126.78, 125.96, 125.45, 124.41, 123.91, 122.98, 121.91, 121.55, 120.09, 118.50, 114.14.

C. 4-(8-(4-(diphenylamino)phenyl)-3-phenyl-3H-benzo[f]chromen-3-yl)benzaldehyde

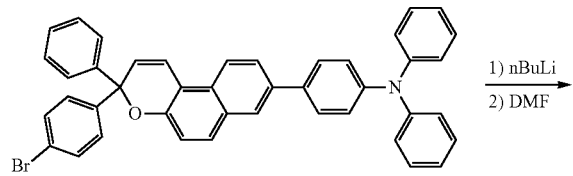

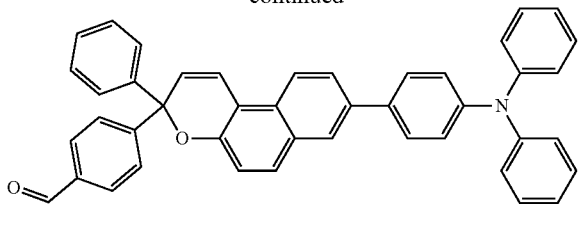

Under argon, 4-(3-(4-bromophenyl)-3-phenyl-3H-benzo[f]chromen-8-yl)-N,N-diphenylaniline (208 mg, 0.31 mmol) was dissolved in distilled THF. Then n-BuLi (1.1 M, 0.32 mL, 0.34 mmol) was added at −78° C. The reaction was stirred at temperature ranging from −80° C. t −60° C. for 1 h before adding the DMF at −78° C. The reaction was allowed to reach room temperature and stirred for 12 h. The reaction was quenched with water. The organic phase was recovered with EtOAc, dried on sodium sulfate and concentrated under reduced pressure. The crude product is purified on silica gel using DCM/petroleum ether (9:1) as eluent to give a yellow solid (110 mg, 0.18 mmol, 57%).

$^1$H RMN (CD$_2$Cl$_2$, 400 MHz): δ=10.01 (s, 1H, CHO), 8.07 (d, 1H, J=8.9 Hz, H$_{ar}$), 7.97 (d, 1H, J=1.7 Hz, H$_{ar}$), 7.82 (qAB, 4H, J=8.4 Hz, Δv$_{AB}$=47.8 Hz, H$_{ar}$), 7.80 (dd, 1H, J=2.0 Hz, J=8.7 Hz, H$_{ar}$), 7.79 (d, 1H, J=8.5 Hz, H$_{ar}$), 7.64 (d, 1H, J=8.7 Hz, H$_{ar}$), 7.57-7.53 (m, 2H, H$_{ar}$), 7.45 (d, 1H, J=9.9 Hz, CH=), 7.42-7.36 (m, 2H, H$_{ar}$), 7.36-727 (m, 6H, H$_{ar}$), 7.22-7.14 (m, 6H, H$_{ar}$), 7.09 (tt, 2H, J=7.3 Hz, J=1.1 Hz, H$_{ar}$), 6.39 (d, 1H, J=9.9 Hz, CCH=).

$^{13}$C RMN (CD$_2$Cl$_2$, 100 MHz): δ=191.63, 151.36, 150.22, 147.68, 147.27, 144.04, 135.97, 135.65, 134.45, 130.30, 129.83, 129.42, 129.28, 128.60, 128.30, 127.90, 127.65, 127.38, 127.14, 126.86, 126.03, 125.46, 124.43, 123.90, 123.00, 121.93, 120.45, 118.48, 114.17, 82.23.

D. (Z)-2-cyano-3-(4-(8-(4-(diphenylamino)phenyl)-3-phenyl-3H-benzo[f]chromen-3-yl)phenyl)acrylic acid (DJ255)

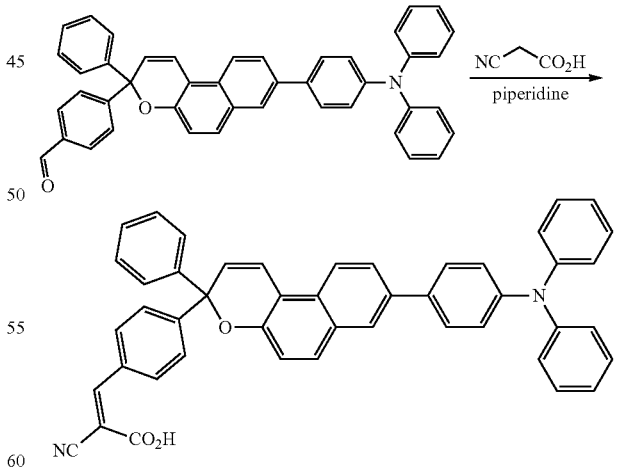

4-(8-(4-(diphenylamino)phenyl)-3-phenyl-3H-benzo[f]chromen-3-yl)benzaldehyde (105 mg, 0.17 mmol), cyanoacetic acid (73 mg, 0.86 mmol), were dissolved in a mixture of acetonitrile (8 mL) and chloroform (5 mL). A catalytic amount of piperidine was added and the solution was refluxed for 3 h. Solvent was removed under reduced pressure and the solid redissolved in chloroform. The organic phase was washed with a HCl solution (2 M), dried on sodium sulfate and concentrated. The crude solid was chromatographed on silica using DCM followed by DCM/MeOH and DCM/MeOH/Acetic acid 96/2/2 as eluents to afford pale yellow solid (45 mg, 0.06 mmol, 40%).

$^1$H RMN (THF-d$_8$, 400 MHz): δ=8.18 (s, 1H, CH=), 8.03 (d, 1H, J=8.8 Hz, H$_{ar}$), 7.95 (d, 1H, J=1.5 Hz, H$_{ar}$), 7.93-7.85 (m, 2H, H$_{ar}$), 7.75-7.68 (m, 2H, H$_{ar}$), 7.63-7.55 (m, 4H, H$_{ar}$), 7.49 (d, 2H, J=7.5, H$_{ar}$), 7.40 (d, 1H, J=9.9 Hz, CH=), 7.31-7.17 (m, 8H, H$_{ar}$), 7.14-7.05 (m, 6H, H$_{ar}$), 6.98 (tt, 2H, J=7.3 Hz, J=1.1 Hz, H$_{ar}$), 6.34 (d, 1H, J=9.9 Hz, CCH=).

$^{13}$C RMN (THF-d$_8$, 100 MHz): δ=148.46, 147.22, 145.96, 145.34, 142.62, 133.91, 133.01, 129.91, 128.27, 128.20, 128.15, 127.21, 126.94, 126.10, 125.66, 125.52, 125.40, 125.30, 124.86, 123.76, 123.42, 122.30, 122.179, 120.84, 120.04, 118.07, 116.44, 112.24, 80.31.

I.4. Synthesis of (Z)-2-cyano-3-(4'-(8-(diphenylamino)-3-phenyl-3H-benzo[f]chromen-3-yl)-[1,1'-biphenyl]-4-yl)acrylic acid (DJ236)

A. 4'-(8-(diphenylamino)-3-phenyl-3H-benzo[f]chromen-3-yl)-[1,1'-biphenyl]-4-carbaldehyde The reaction was cool to room temperature before extracting the organic phase with diethyl ether. The latter is washed with brine, dried on sodium sulfate and concentrated under reduced pressure. The crude product is purified on silica gel using DCM/petroleum ether (9:1) as eluent to give a white solid (125 mg, 0.20 mmol, 60%).

$^1$H RMN (CD$_2$Cl$_2$, 400 MHz): δ=10.07 (s, 1H, CHO), 7.93 (d, 1H, J=9.1 Hz, H$_{ar}$), 7.87 (qAB, 4H, Δv$_{AB}$=78.3 Hz, J=8.3 Hz, H$_{ar}$), 7.67 (qAB, 4H, Δv$_{AB}$=11.9 Hz, J=8.7 Hz, H$_{ar}$) 7.63-7.59 (m, 2H, H$_{ar}$, CH=), 7.50 (d, 1H, J=8.9 Hz), 7.44-7.38 (m, 4H, H$_{ar}$), 7.38-7.26 (m, 6H, H$_{ar}$), 7.24 (d, 1H, J=8.8 Hz), 7.16-7.11 (m, 4H, H$_{ar}$) 7.08 (tt, 2H, J=7.3 Hz, J=1.1 Hz, H$_{ar}$), 6.42 (d, 1H, J=9.9 Hz, CCH=)

$^{13}$C RMN (CD$_2$Cl$_2$, 100 MHz): δ=191.69, 149.68, 147.85, 146.36, 145.27, 144.71, 143.89, 138.87, 135.42, 130.47, 130.11, 129.27, 128.93, 128.23, 128.03, 127.69, 127.60, 127.54, 127.12, 126.85, 126.27, 125.59, 124.00, 122.74, 122.55, 121.68, 120.13, 118.60, 114.57, 82.12.

B. (Z)-2-cyano-3-(4'-(8-(diphenylamino)-3-phenyl-3H-benzo[f]chromen-3-yl)-[1,1'-biphenyl]-4-yl) acrylic acid (DJ236)

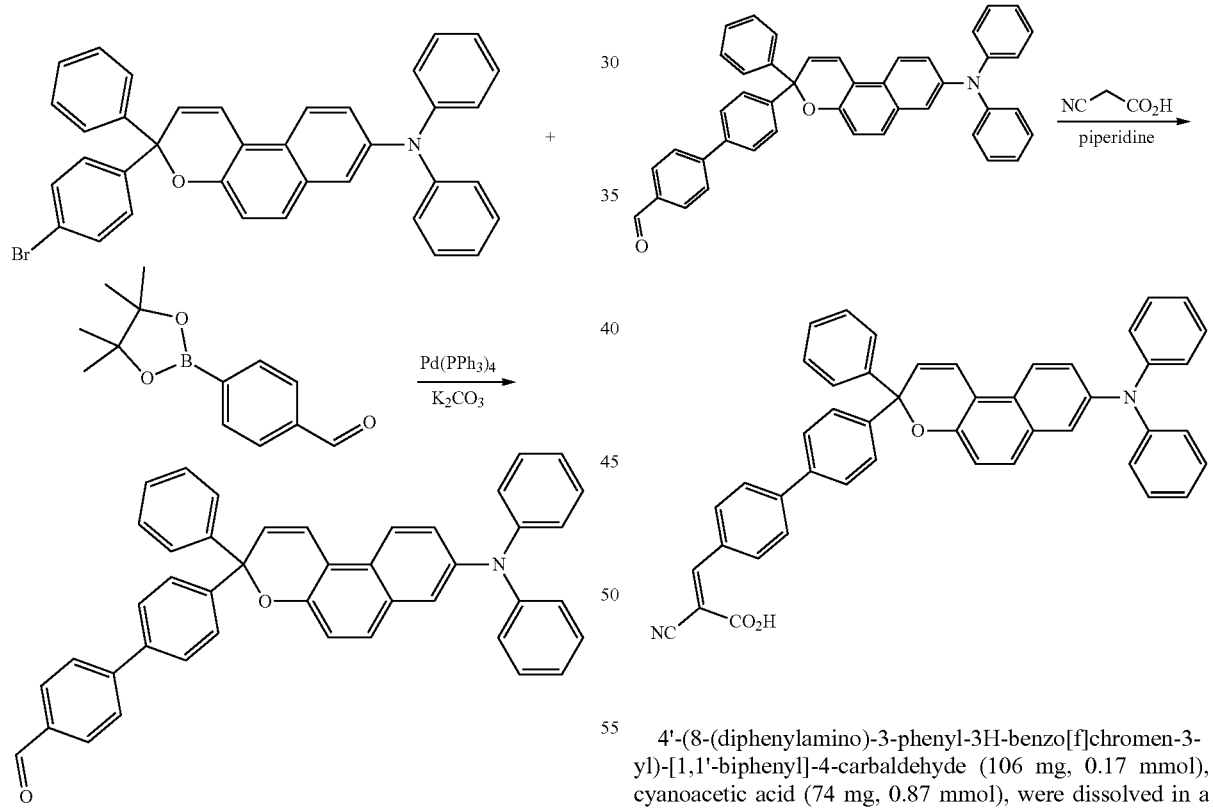

Under argon, 3-(4-bromophenyl)-N,N,3-triphenyl-3H-benzo[f]chromen-8-amine (200 mg, 0.34 mmol), 4-(4,4,5,5-tetramethyl-1,3,2-dioxaborolan-2-yl)-benzaldehyde (120 mg, 0.52 mmol), Tetrakis(triphenylphosphine)palladium(0) (Pd(PPh$_3$)$_4$, 8.0 mg, 6.9 μmol) were dissolved in distilled THF. Then an aqueous solution of potassium carbonate (K$_2$CO$_3$, 0.5 M, 2.1 mL) was added. The mixture was stirred overnight at reflux.

4'-(8-(diphenylamino)-3-phenyl-3H-benzo[f]chromen-3-yl)-[1,1'-biphenyl]-4-carbaldehyde (106 mg, 0.17 mmol), cyanoacetic acid (74 mg, 0.87 mmol), were dissolved in a mixture of acetonitrile (8 mL) and chloroform (5 mL). A catalytic amount of piperidine was added and the solution was refluxed for 3 h. Solvent was removed under reduced pressure and the solid redissolved in chloroform. The organic phase was washed with a HCl solution (2 M), dried on sodium sulfate and concentrated. The crude solid was chromatographed on silica using DCM followed by DCM/MeOH and DCM/MeOH/Acetic acid 96/2/2 as eluents to afford pale yellow solid (110 mg, 0.16 mmol, 93%).

$^1$H RMN (THF-ds, 400 MHz): δ=8.30 (s, 1H, CH=), 8.15 (d, 2H, J=8.4 Hz, H$_{ar}$), 7.99 (d, 1H, J=9.1 Hz, H$_{ar}$), 7.83 (d, 2H, J=8.4 Hz, H$_{ar}$), 7.69 (qAB, 4H, Δv$_{AB}$=15.8 Hz, J=8.6 Hz, H$_{ar}$), 7.60-7.55 (m, 2H, H$_{ar}$), 7.51 (d, 1H, J=8.9 Hz, H$_{ar}$), 7.31-7.20 (m, 6H, H$_{ar}$), 7.45 (d, 1H, J=9.9 Hz, CH=), 7.39 (d, 1H, J=2.2 Hz, H$_{ar}$), 7.37-7.31 (m, 2H, H$_{ar}$), 7.18 (d, 1H, J=8.8 Hz, H$_{ar}$), 7.11-7.05 (m, 4H, H$_{ar}$), 6.99 (tt, 2H, J=7.3 Hz, J=1.1 Hz, H$_{ar}$), 6.45 (d, 1H, J=9.9 Hz, CCH=).

$^{13}$C RMN (C THF-ds, 100 MHz): δ=162.96, 152.91, 149.82, 147.98, 145.54, 145.02, 144.71, 143.76, 138.45, 131.33, 131.03, 130.62, 128.99, 128.73, 127.98, 127.86, 127.45, 127.27, 127.20, 126.70, 126.59, 126.54, 125.40, 123.71, 122.56, 122.38, 121.94, 119.73, 118.38, 115.42, 114.49, 82.06.

I.5. Synthesis of Z)-2-cyano-3-(4'-(8-(4-(diphenylamino)phenyl)-3-phenyl-3H-benzo[f]chromen-3-yl)-[1,1'-biphenyl]-4-yl)acrylic acid (DJ228)

A. 4'-(8-(4-(diphenylamino)phenyl)-3-phenyl-3H-benzo[f]chromen-3-yl)-[1,1'-biphenyl]-4-carbaldehyde

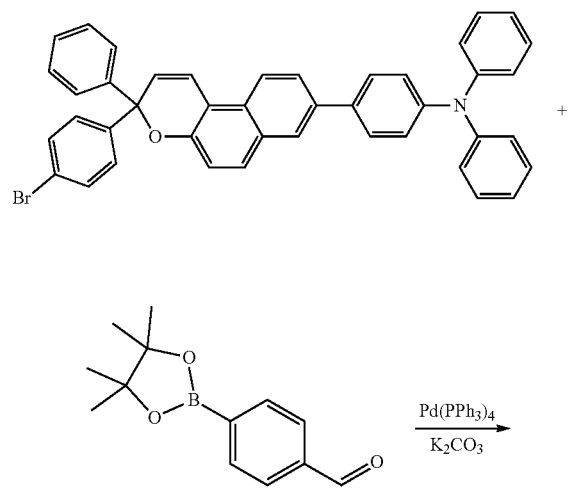

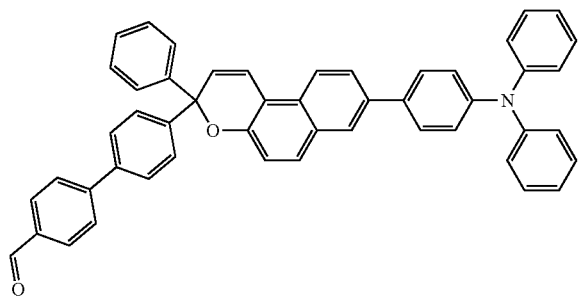

Under argon, 4-(3-(4-bromophenyl)-3-phenyl-3H-benzo[f]chromen-8-yl)-N,N-diphenylaniline (100 mg, 0.15 mmol), 4-(4,4,5,5-tetramethyl-1,3,2-dioxaborolan-2-yl)-benzaldehyde (53 mg, 0.22 mmol), Pd(PPh$_3$)$_4$ (4.0 mg, 3.1 μmol) were dissolved in distilled THF. Then an aqueous solution of K$_2$CO$_3$ (0.5 M, 0.8 mL) was added. The mixture was stirred overnight at reflux. The reaction was cool to room temperature before extracting the organic phase with diethyl ether. The latter was washed with brine, dried on sodium sulfate and concentrated under reduced pressure. The crude product was purified on silica gel using DCM/petroleum ether (7:3) as eluent to give a white solid (78 mg, 0.11 mmol, 75%).

$^1$H RMN (CD$_2$Cl$_2$, 400 MHz): δ=10.06 (s, 1H), 8.50 (d, 1H, J=8.3 Hz, CHO), 7.95 (d, 3H, J=8.2 Hz, H$_{ar}$), 7.78 (d, 2H, J=8.2 Hz, H$_{ar}$), 7.70 (qAB, 4H, J Δvab=20.3 Hz, J=8.6 Hz, H$_{ar}$), 7.65 (m, 1H), 7.58 (t, 1H, J=7.2 Hz, H$_{ar}$), 7.49 (t, 1H, J=7.1 Hz, H$_{ar}$), 7.44-7.38 (m, 2H, H$_{ar}$), 7.38-7.30 (m, 6H, H$_{ar}$), 7.24-7.16 (m, 6H, H$_{ar}$), 7.09 (tt, 2H, J=7.3 Hz, J=0.9 Hz, H$_{ar}$), 6.89 (d, 1H, J=9.7 Hz, CH=), 6.38 (d, 1H, J=9.7 Hz, CCH=).

$^{13}$C RMN (CD$_2$Cl$_2$, 100 MHz): δ=191.66, 147.80, 146.88, 146.84, 146.32, 145.48, 144.93, 138.94, 135.41, 134.43, 133.02, 132.70, 130.84, 130.07, 129.26, 128.29, 127.70, 127.61, 127.58, 127.39, 127.20, 126.69, 126.50, 126.07, 125.68, 125.31, 124.80, 124.38, 124.22, 123.40, 122.90, 121.99, 115.39, 82.97.

B. (Z)-2-cyano-3-(4'-(8-(4-(diphenylamino)phenyl)-3-phenyl-3H-benzo[f]chromen-3-yl)-[1,1'-biphenyl]-4-yl)acrylic acid (DJ228)

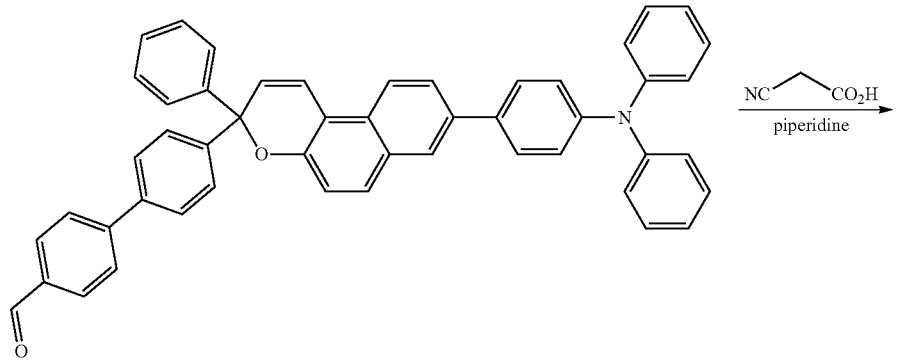

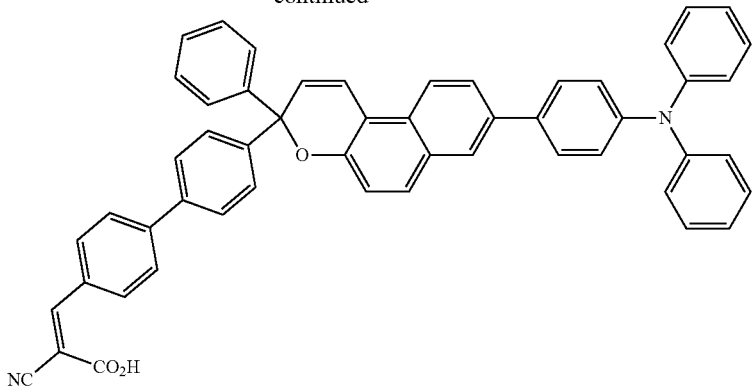

4'-(8-(4-(diphenylamino)phenyl)-3-phenyl-3H-benzo[f]chromen-3-yl)-[1,1'-biphenyl]-4-carbaldehyde (30 mg, 44 μmol), cyanoacetic acid (19 mg, 0.22 mmol), were dissolved in a mixture of acetonitrile (8 mL) and chloroform (5 mL). A catalytic amount of piperidine was added and the solution was refluxed for 3 h Solvent was removed under reduced pressure and the solid redissolved in chloroform. The organic phase was washed with a HCl solution (2 M), dried on sodium sulfate and concentrated. The crude solid was chromatographed on silica using DCM followed by DCM/MeOH and DCM/MeOH/Acetic acid 96/2/2 as eluents to afford pale yellow solid (24 mg, 33 μmol, 75%).

$^1$H RMN (THF-ds, 400 MHz): δ=8.26 (s, =CH), 8.15-8.07 (m, 3H, H$_{ar}$), 7.97 (d, 1H, J=1.6 Hz, H$_{ar}$), 7.84-7.71 (m, 5H, H$_{ar}$), 7.71-7.60 (m, 6H, H$_{ar}$), 7.57-7.52 (m, 2H, H$_{ar}$), 7.47 (d, 1H, J=9.9 Hz, CH=), 7.32-7.27 (m, 2H, H$_{ar}$), 7.26-7.20 (m, 5H, H$_{ar}$), 7.15-7.06 (m, 6H, H$_{ar}$), 6.99 (tt, 2H, J=7.3 Hz, J=1.0 Hz, H$_{ar}$), 6.42 (d, 1H, J=9.9 Hz, CCH=).

$^{13}$C RMN (THF-ds, 100 MHz): δ=150.65, 148.62, 145.97, 145.33, 143.60, 143.15, 142.66, 136.66, 133.87, 133.09, 129.38, 129.30, 128.12, 128.09, 127.20, 126.99, 126.94, 126.01, 125.87, 125.66, 125.60, 125.41, 125.38, 125.27, 125.03, 124.87, 124.74, 123.72, 123.44, 122.28, 122.21, 120.83, 120.01, 117.77, 116.48, 112.26, 80.42.

I.6. Synthesis of (Z)-2-cyano-3-(4'-(6-(4-(diphenylamino)phenyl)-2-phenyl-2H-benzo[h]chromen-2-yl)-[1,1'-biphenyl]-4-yl)acrylic acid (DJ277)

A. 4-(4-methoxynaphthalen-1-yl)-N,N-diphenylaniline

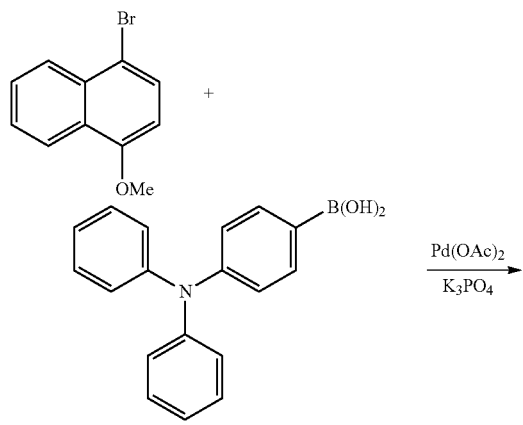

Under air condition, 1-methoxy-6-bromonaphtalene (0.79 g, 3.3 mmol) and 4-diphenylamino-phenylboronic acid (1.6 g, 4.33 mmol) and PdOAc (15.0 mg, 67 μmol) were dissolved in iPrOH/H$_2$O mixture (150 mL, 2:1). The mixture was heated to reflux and K$_3$PO$_4$ (2.12 g, 10.0 mmol) was added. The mixture was stirred for 2 h at 80° C. before being cooled to room temperature. The organic phase was extracted with EtOAc, dried on sodium sulfate and concentrated. The crude product was purified on silica gel using n-hexane/EtOAc (95:5) as eluent to give a white solid (1.30 g, 3.2 mmol, 97%).

$^1$H RMN (CD$_2$Cl$_2$, 400 MHz): δ=8.35 (dd, 1H, J=2.1 Hz, J=7.3 Hz, H$_{ar}$), 8.00 (dd, 1H, J=2.0 Hz, J=7.4 Hz, H$_{ar}$), 7.54-7.50 (m, 2H, H$_{ar}$), 7.42-7.37 (m, 3H, H$_{ar}$), 7.36-7.30 (m, 4H, H$_{ar}$), 7.23-7.17 (m, 5H, H$_{ar}$), 7.14 (dd, 1H, J=2.8 Hz, J=8.1 Hz, H$_{ar}$), 7.09 (td, 2H, J=7.9 Hz, J=1.0 Hz, H$_{ar}$), 6.94 (d, 2H, J=7.9 Hz, H$_{ar}$), 4.08 (s, 3H, CH$_3$).

$^{13}$C RMN (CD$_2$Cl$_2$, 100 MHz): δ=154.79, 147.87, 146.71, 135.01, 132.45, 130.94, 129.26, 127.19, 126.83, 126.37, 125.70, 125.03, 124.30, 124.01, 123.58, 122.83, 122.07, 103.55, 55.55.

B. 4-(4-(diphenylamino)phenyl)naphthalen-1-ol

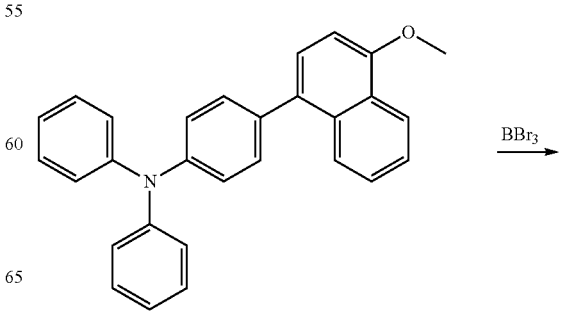

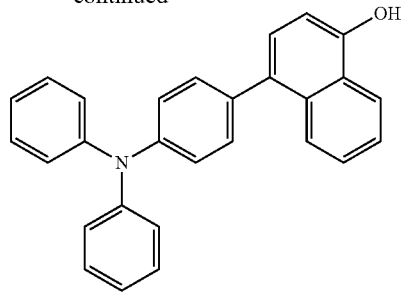

Under argon, 4-(4-methoxynaphthalen-1-yl)-N,N-diphenylaniline (0.50 g, 1.2 mmol) was dissolved in DCM and boron tribromide (BBr₃, 0.16 mL, 1.6 mmol) was added at 0° C. The reaction was stirred at room temperature for 3 h before being quenched with a K₂CO₃ saturated solution. The organic phase was extracted with DCM, dried on sodium sulfate and concentrated. The crude product was purified on silica gel using n-hexane/EtOAc (8:2) as eluent to give a white solid (0.38 g, 1.0 mmol, 80%).

¹H RMN (CD₂Cl₂, 400 MHz): δ==8.28 (dd, 1H, J=2.1 Hz, J=7.3 Hz, H$_{ar}$), 8.02 (dd, 1H, J=2.0 Hz, J=7.4 Hz, H$_{ar}$), 7.58-7.49 (m, 2H, H$_{ar}$), 7.41-7.30 (m, 7H, H$_{ar}$), 7.24-7.17 (m, 6H, H$_{ar}$), 7.09 (tt, 2H, J=7.3 Hz, J=1.0 Hz, H$_{ar}$), 6.94 (d, 2H, J=7.7 Hz, H$_{ar}$), 5.49 (s, 1H, OH).

¹³C RMN (CD₂Cl₂, 100 MHz): δ=150.81, 147.85, 146.75, 134.89, 132.74, 132.69, 130.92, 129.25, 126.76, 126.42, 125.91, 125.07, 124.47, 124.31, 123.54, 122.84, 121.75, 108.18.

C. 4-(2-(4-bromophenyl)-2-phenyl-2H-benzo[h]chromen-6-yl)-N,N-diphenylaniline Under argon, 1-(4-bromophenyl)-1-phenylprop-2-yn-1-ol (411 mg, 1.43 mmol), 4-(4-(diphenylamino)phenyl)naphthalen-1-ol (370 mg, 0.95 mmol), PPTS (12 mg, 52 μmol) were dissolved in anhydrous 1,2-dichloroethane (6 mL). Trimethyl orthoformate (0.21 mL, 1.91 mmol) was added and the reaction was heated to reflux for 9 h. Solvent was removed under reduced pressure and the crude solid was purified on silica gel using n-hexane/DCM (6:4) as eluent to give a white solid (250 mg, 0.38 mmol, 40%).

¹H RMN (CD₂Cl₂, 400 MHz): δ=8.45 (d, 1H, J=8.0 Hz, H$_{ar}$), 7.96 (d, 1H, J=8.4 Hz, H$_{ar}$), 7.62-7.44 (m, 9H H$_{ar}$), 7.41-7.30 (m, 9H, H$_{ar}$), 7.24-7.16 (m, 9H, H$_{ar}$), 7.09 (tt, 2H, J=7.3 Hz, J=0.9 Hz, H$_{ar}$), 6.86 (d, 1H, J=9.7 Hz, CH=), 6.28 (d, 1H, J=9.7 Hz, CCH=).

¹³C RMN (CD₂Cl₂, 100 MHz): δ=147.82, 146.90, 144.62, 134.43, 133.09, 132.71, 131.29, 130.87, 129.28, 128.68, 128.37, 128.31, 127.91, 127.77, 127.34, 126.68, 126.53, 126.08, 125.71, 125.29, 124.77, 124.40, 124.34, 123.43, 122.93, 121.93, 121.62, 115.34, 82.80.

D. 4'-(6-(4-(diphenylamino)phenyl)-2-phenyl-2H-benzo[h]chromen-2-yl)-[1,1'-biphenyl]-4-carbaldehyde

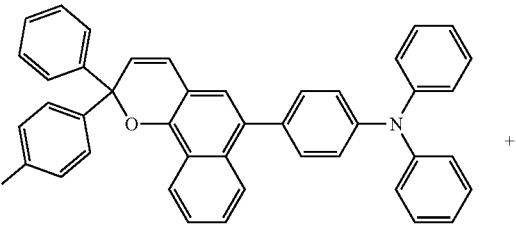

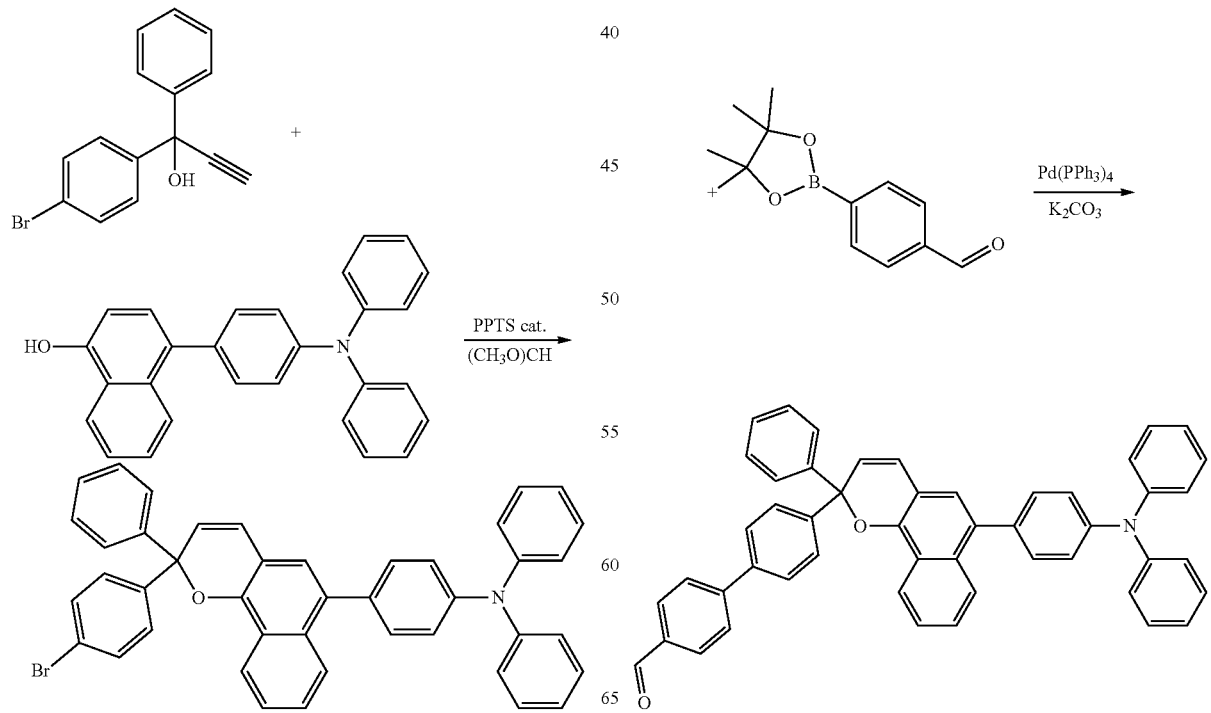

Under argon, 4-(2-(4-bromophenyl)-2-phenyl-2H-benzo[h]chromen-6-yl)-N,N-diphenylaniline (180 mg, 0.27 mmol), 4-(4,4,5,5-tetramethyl-1,3,2-dioxaborolan-2-yl)-benzaldehyde (70 mg, 0.30 mmol), Pd(PPh$_3$)$_4$ (9.5 mg, 8.2 µmol) were dissolved in distilled THF. Then an aqueous solution of K$_2$CO$_3$ (0.5 M, 1.6 mL) was added. The mixture was stirred overnight at reflux. The reaction was cool to room temperature before extracting the organic phase with diethyl ether. The latter was washed with brine, dried on sodium sulfate and concentrated under reduced pressure. The crude product was purified on silica gel using DCM/petroleum ether (7:3) as eluent to give a white solid (150 mg, 0.22 mmol, 80%).

$^1$H RMN (CD$_2$Cl$_2$, 400 MHz): δ=10.06 (s, 1H), 8.50 (d, 1H, J=8.3 Hz, CHO), 7.95 (d, 3H, J=8.2 Hz, H$_{ar}$), 7.78 (d, 2H, J=8.2 Hz, H$_{ar}$), 7.70 (qAB, 4H, J Δvab=20.3 Hz, J=8.6 Hz, H$_{ar}$), 7.65 (m, 1H), 7.58 (t, 1H, J=7.2 Hz, H$_{ar}$), 7.49 (t, 1H, J=7.1 Hz, H$_{ar}$), 7.44-7.38 (m, 2H, H$_{ar}$), 7.38-7.30 (m, 6H, H$_{ar}$), 7.24-7.16 (m, 6H, H$_{ar}$), 7.09 (tt, 2H, J=7.3 Hz, J=0.9 Hz, H$_{ar}$), 6.89 (d, 1H, J=9.7 Hz, CH=), 6.38 (d, 1H, J=9.7 Hz, CCH=).

$^{13}$C RMN (CD$_2$Cl$_2$, 100 MHz): δ=191.66, 147.80, 146.88, 146.84, 146.32, 145.48, 144.93, 138.94, 135.41, 134.43, 133.02, 132.70, 130.84, 130.07, 129.26, 128.29, 127.70, 127.61, 127.58, 127.39, 127.20, 126.69, 126.50, 126.07, 125.68, 125.31, 124.80, 124.38, 124.22, 123.40, 122.90, 121.99, 115.39, 82.97.

E. (Z)-2-cyano-3-(4'-(6-(4-(diphenylamino)phenyl)-2-phenyl-2H-benzo[h]chromen-2-yl)-[1,1'-biphenyl]-4-yl)acrylic acid (DJ277)

4'-(6-(4-(diphenylamino)phenyl)-2-phenyl-2H-benzo[h]chromen-2-yl)-[1,1'-biphenyl]-4-carbaldehyde (230 mg, 0.34 mmol), cyanoacetic acid (143 mg, 1.69 mmol), were dissolved in a mixture of acetonitrile (8 mL) and chloroform (12 mL). A catalytic amount of piperidine was added and the solution was refluxed for 3 h. Solvent was removed under reduced pressure and the solid redissolved in chloroform. The organic phase was washed with a HCl solution (2 M), dried on sodium sulfate and concentrated. The crude solid was chromatographed on silica using DCM followed by DCM/MeOH and DCM/MeOH/Acetic acid 96/2/2 as eluents to afford pink solid (204 mg, 0.26 mmol, 80%).

$^1$H RMN (THF-d$_8$, 400 MHz): δ=8.50 (d, 1H, J=8.3 Hz, H$_{ar}$), 8.30 (s, 1H, CH=), 8.15 (d, 2H, J=8.4 Hz, H$_{ar}$), 7.91 (d, 1H, J=8.3 Hz, H$_{ar}$), 7.83 (d, 2H, J=8.4 Hz, H$_{ar}$), 7.73 (s, 4H, H$_{ar}$), 7.66-7.62 (m, 1H, H$_{ar}$), 7.53 (ddd, 1H, J=1.2 Hz, J=6.8 Hz, J=8.2 Hz, H$_{ar}$), 7.44 (ddd, 1H, J=1.2 Hz, J=6.8 Hz, J=8.2 Hz, H$_{ar}$), 7.38-7.33 (m, 4H, H$_{ar}$), 7.32-7.26 (m, 5H, H$_{ar}$), 7.22 (s, 1H, H$_{ar}$), 7.19-7.14 (m, 6H, H$_{ar}$), 7.04 (tt, 2H, J=1.2 Hz, J=7.3 Hz, H$_{ar}$), 6.88 (d, 1H, J=9.8 Hz, CCH=) ppm 6.42 (d, 1H, J=9.7 Hz, CH=).

$^{13}$C RMN (THF-d$_8$, 100 MHz): δ=162.92, 152.93, 147.91, 146.93, 146.90, 145.72, 145.23, 144.66, 138.56, 134.73, 132.83, 132.74, 131.34, 131.04, 130.71, 129.11, 128.00, 127.58, 127.39, 127.32, 127.27, 126.73, 126.64, 126.16, 125.82, 125.32, 124.88, 124.27, 123.71, 123.28, 122.73, 121.94, 115.40, 115.25, 83.14.

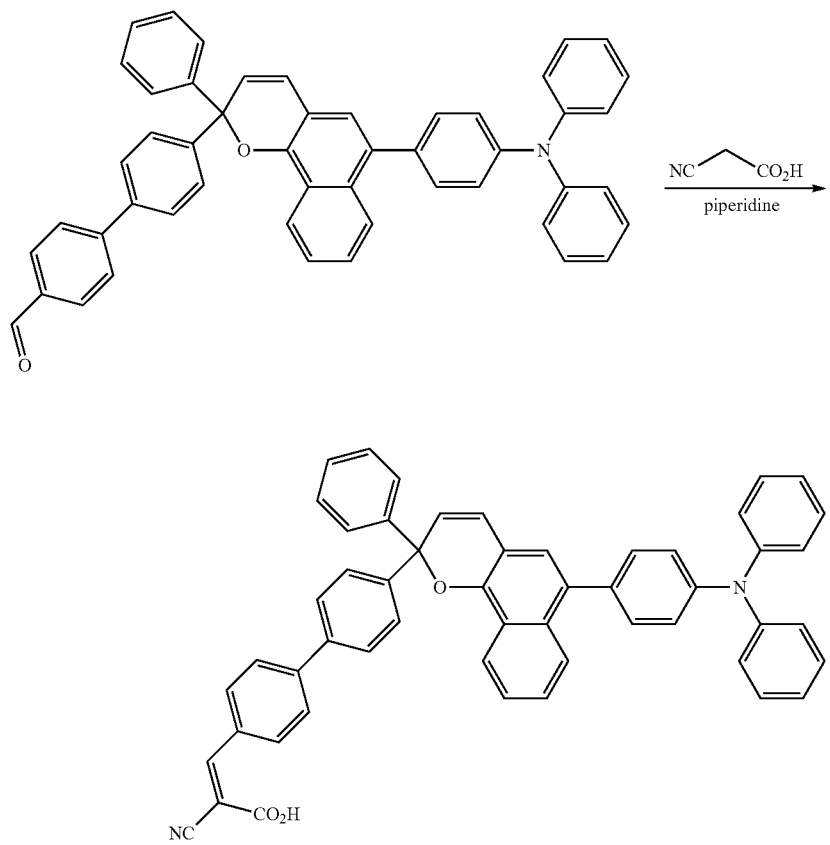

I.7. Synthesis of (E)-2-cyano-3-(4'-(11-(diphenylamino)-13,13-bis(4-hexylphenyl)-3-phenyl-3,13-dihydrobenzo[h]indeno[2,1-f]chromen-3-yl)-[1,1'-biphenyl]-4-yl)acrylic acid (YKC5P21)

A. Methyl-5-bromo-2-(4-methoxynaphthalen-1-yl)benzoate

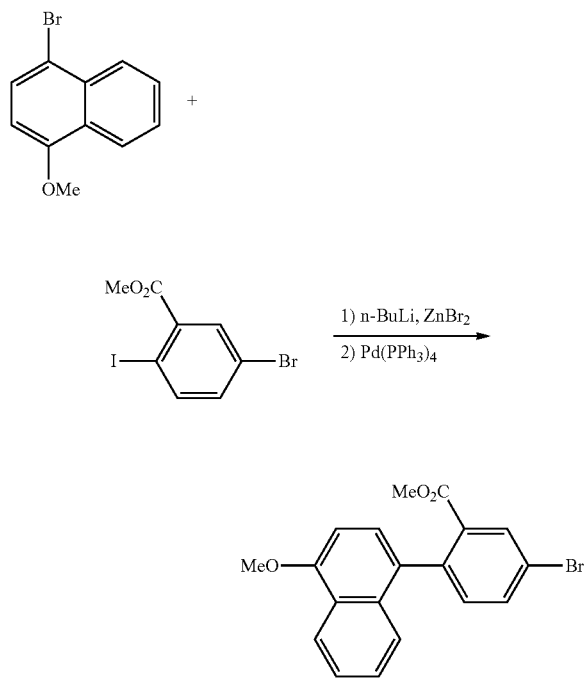

Under argon, after 1-bromo-4-methoxynaphthalene (400 mg, 1.69 mmol) was dissolved in distilled THF (20 mL), n-BuLi (675 μL, 1.69 mmol, 1 eq) was added dropwise at −78° C. The solution was stirred for 30 min before adding a solution of zinc bromide (418 mg, 1.86 mmol, 1.1 eq) in 5 mL of THF. The solution was kept stirred at −78° C. during 1 h. In a separate flask, methyl 5-bromo-2-iodobenzoate (600 mg, 1.76 mmol) and palladium tetrakis (101.7 mg, 5% mol) were previously dried before including the zinc product solution. The reaction was stirred in the cold bath for 2 h and left stirred overnight at room temperature. The reaction was quenched with HCl solution (1 M). The organic phase was extracted with diethyl ether and washed with water and brine, dried over sodium sulphate, filtered and concentrated under vacuum. The crude product was purified by chromatography on silica gel using n-hexane/DCM: 9/1, then 8/2 and 6/4 as eluent to afford white solid (531 mg, 1.43 mmol, 81.3%).

$^1$H NMR (CDCl$_3$, 200 MHz): δ=8.30 (d, 1H, J=8.3 Hz, H$_{ar}$), 8.10 (d, 1H, J=2.0 Hz, H$_{ar}$), 7.68 (dd, 1H, J=2.1 Hz, J=8.2 Hz, H$_{ar}$), 7.44 (m, 1H, H$_{ar}$), 7.37 (m, 2H, H$_{ar}$), 7.26 (s, 1H, H$_{ar}$), 7.00 (ABq, 2H, Δvab=140.0 Hz, J=7.85 Hz, H$_{ar}$), 4.02 (s, 3H, OCH$_3$), 3.39 (s, 3H, OCH$_3$).

$^{13}$C NMR (CDCl$_3$, 50 MHz): δ=166.7, 155.2, 140.3, 134.4, 133, 9, 133.5, 132.8, 132.7, 130.5, 126.7, 126.0, 125.3, 125.1, 125.0, 122.3, 121.1, 103.7, 55.5, 52.1, 31.6, 22.7, 14.1.

B. 9-bromo-7,7-bis(4-hexylphenyl)-5-methoxy-7H-benzo[c]fluorene

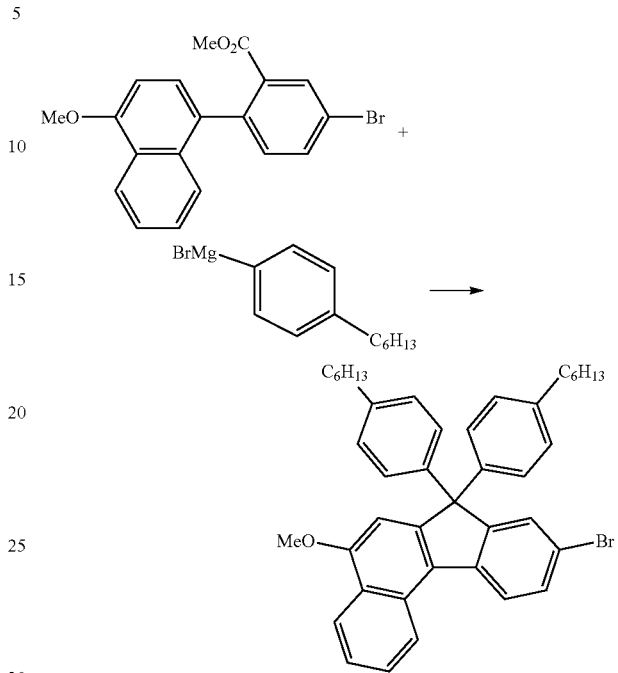

Previously under argon, (4-hexylphenyl)magnesium bromide was prepared from 1(4-bromophenyl)hexane (1.0 g, 4.15 mmol) and magnesium (100 mg, 4.15 mmol, 1 eq) in 5 mL freshly distilled THF. This reaction mixture was stirred at reflux for 1 h. In a second flask, methyl 5-bromo-2-(4-methoxynaphthalen-1-yl) benzoate (500 mg, 1.35 mmol) was solubilized in 15 mL THF. Then the Grignard reagent was added dropwise and the solution was heated to reflux overnight. After cooling to room temperature, the crude mixture was poured into water. The organic layer was extracted twice with ethyl acetate and washed by water and brine, dried over sodium sulphate, filtered and concentrated under vacuum overnight. The crude was dissolved in glacial acetic acid (40 mL). After 30 min, 4 mL concentrated HCl were added dropwise and refluxed at 120° C. for 5 h. After back to room temperature, the acetic acid was removed by rotary evaporation, and the crude was extracted by pentane. The organic layer was washed several times by water and dried over sodium sulphate, filtered and concentrated under vacuum. The crude product was purified by chromatography on silica gel using n-hexane/DCM: 98/5 as eluent to afford colorless oil (273 mg, 0.42 mmol, 39.1%).

$^1$H NMR (CDCl$_3$, 200 MHz): δ=8.69 (d, 1H, J=8.4 Hz, H$_{ar}$), 8.43 (dd, 1H, J=0.9 Hz, J=0.9 Hz, 8.4H$_{ar}$), 8.17 (d, 1H, J=8.3 Hz, H$_{ar}$), 7.72 (m, 1H, H$_{ar}$), 7.37 (m, 2H, H$_{ar}$), 7.63 (m, 1H, H$_{ar}$), 7.58 (m, 2H, H$_{ar}$), 7.18 (ABq, 8H, Δvab=32.1 Hz, J=8.3 Hz, H$_{ar}$), 6.93 (s, 1H, H$_{ar}$), 3.99 (s, 3H, OCH$_3$), 2.53 (t, 4H, CH$_2$), 1.55 (m, 4H, CH$_2$), 1.28 (m, 12H, CH$_2$), 0.87 (t, 6H, CH$_3$).

$^{13}$C NMR (CDCl$_3$, 100 MHz): δ=156.1, 154.8, 151.3, 141.9, 141.6, 140.5, 130.4, 130.0, 128.9, 128.3, 128.1, 127.5, 125.9, 125.7, 125.0, 123.5, 123.3, 123.1, 119.2, 102.1, 65.3, 55.7, 35.5, 31.7, 31.6, 31.3, 29.1, 22.6, 14.0.

C. 7,7-bis(4-hexylphenyl)-5-methoxy-N,N-diphenyl-7H-benzo[c]fluoren-9-amine

D. 9-(diphenylamino)-7,7-bis(4-hexylphenyl)-7H-benzo[c]fluoren-5-ol

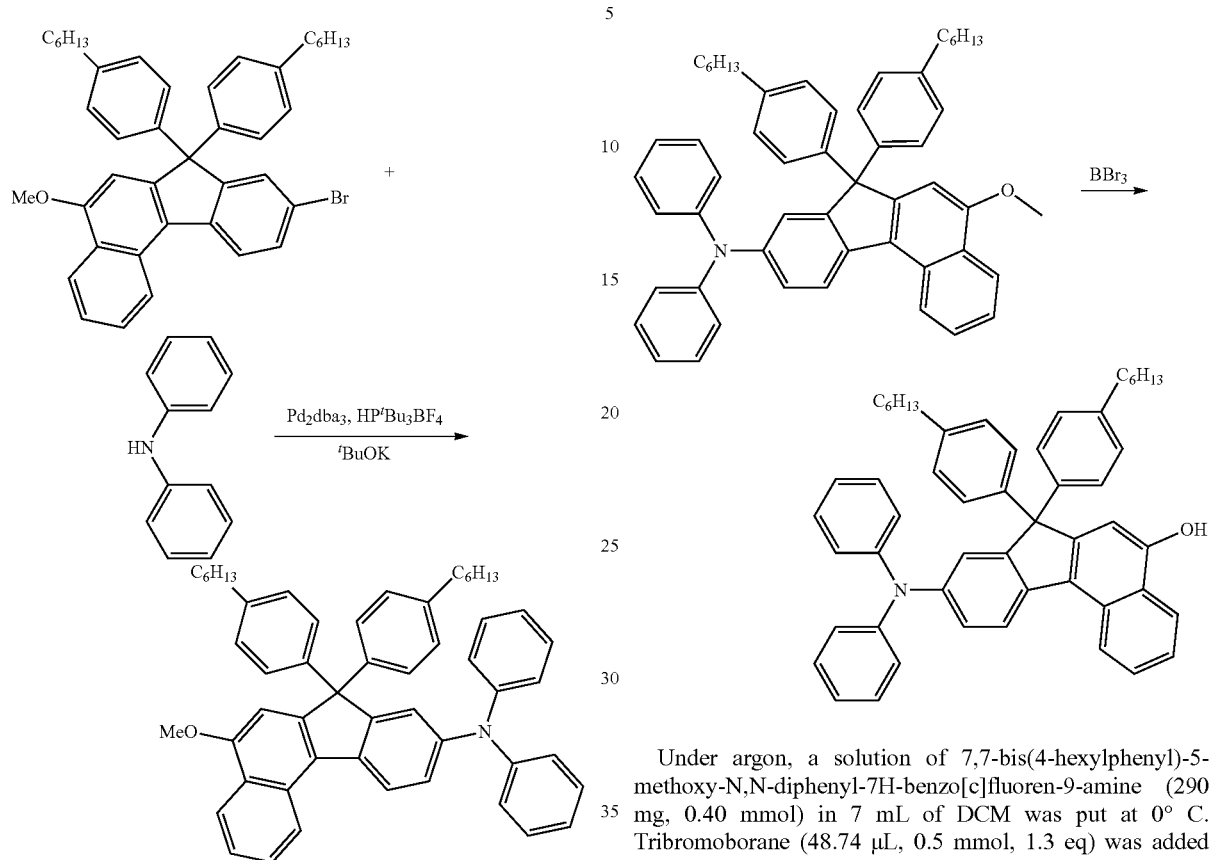

Under argon, Pd₂dba₃ (3.54 mg, 3.87 μmol) and tri-tert-butylphosphine tetrafluoroborate (2.25 mg, 7.74 μmol) were dissolved with anhydrous toluene (5 mL). After stirred for 15 min, a solution of 9-bromo-7,7-bis(4-hexylphenyl)-5-methoxy-7H-benzo[c]fluorene (268 mg, 415 μmol) and diphenylamine (77.26 mg, 456.5 μmol) in anhydrous toluene (20 mL) was added. Potassium tert-butoxide (143.4 mg, 1.28 mmol, 3.3 eq) was added and the resulting mixture was stirred for 30 min at room temperature before being refluxed for 48 h. The melt was filtered through celite and poured into HCl (1 M). The organic phase was extracted with diethyl ether, washed with water, dried over Na₂SO₄ and concentrated. The crude oil was purified by chromatography on silica using n-hexane/DCM: 8/2 as eluent to afford pale yellow oil (299 mg, 407 μmol, 98.1%).

¹H NMR (CDCl₃, 200 MHz): δ=8.60 (d, 1H, J=8.4 Hz, H$_{ar}$), 8.31 (dd, 1H, J=0.9 Hz, J=0.9 Hz, H$_{ar}$), 8.05 (d, 1H, J=8.5 Hz, H$_{ar}$), 7.59 (m, 1H, H$_{ar}$), 7.47 (m, 1H, H$_{ar}$), 7.27 (d, 1H, J=2.2 Hz, H$_{ar}$), 7.17 (m, 4H, H$_{ar}$), 7.10-6.93 (m, 15H, H$_{ar}$), 6.83 (s, 1H, H$_{ar}$), 3.88 (s, 3H, OCH₃), 2.53 (t, 4H, CH₂), 1.55 (m, 4H, CH₂), 1.28 (m, 12H, CH₂), 0.87 (t, 6H, CH₃).

¹³C NMR (CDCl₃, 100 MHz): δ=155.23, 154.16, 150.56, 147.76, 145.45, 142.64, 141.24, 136.28, 129.92, 129.13, 128.31, 128.18, 127.20, 127.09, 125.72, 124.83, 124.03, 123.81, 123.19, 122.99, 122.56, 122.44, 121.80, 102.60, 65.25, 55.69, 35.59, 31.791 31.43, 29.17, 22.67, 14.15.

Under argon, a solution of 7,7-bis(4-hexylphenyl)-5-methoxy-N,N-diphenyl-7H-benzo[c]fluoren-9-amine (290 mg, 0.40 mmol) in 7 mL of DCM was put at 0° C. Tribromoborane (48.74 μL, 0.5 mmol, 1.3 eq) was added dropwise. The solution was allowed to reach room temperature and stirred for 3 h. Then the reaction was quenched with a saturated solution of K₂CO₃. The organic phase was extracted with DCM, dried over Na₂SO₄ and concentrated. The crude was purified by chromatography on silica using n-hexane/ethyl acetate: 8/2 as eluent to afford white solid (250 mg, 347 μmol, 87.9%).

¹H NMR (acetone-d₆, 400 MHz): δ=9.21 (s, 1H, OH), 8.77 (m, 1H, H$_{ar}$), 8.41 (m, 1H, H$_{ar}$), 8.05 (d, 1H, J=8.5 Hz, H$_{ar}$), 8.26 (m, 1H, H$_{ar}$), 7.69 (m, 1H, H$_{ar}$), 7.56 (m, 1H, H$_{ar}$), 7.38-6.93 (m, 20H, H$_{ar}$), 2.59 (t, 4H, CH₂), 1.60 (m, 4H, CH₂), 1.33 (m, 12H, CH₂), 0.89 (t, 6H, CH₃).

¹³C NMR (acetone-d₆, 100 MHz): δ=143.07, 131.53, 131.13, 130.01, 129.77, 127.62, 126.70, 125.80, 124.62, 121.93, 119.37, 37.04, 33.42, 33.25, 24.24, 15.33.

E. 1-(4-bromophenyl)-1-phenylprop-2-yn-1-ol

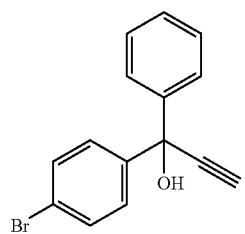 [SMILES: C#CC(O)(c1ccccc1)c1ccc(Br)cc1]

Under argon, sodium acetylide (3.68 g, 76.6 mmol, 18 wt % in xylene) was dissolved in anhydrous THF. 4-bromobenzophenone (2.00 g, 7.6 mmol) was added in one portion at 0° C. After reaching room temperature the reaction mixture was stirred for 3 h. Then a NH$_4$Cl saturated solution was added to the reaction and stirred for 10 min. The organic phase was extracted with Et$_2$O, dried on sodium sulfate and concentrated. The crude was purified on silica gel using DCM as eluent to give a pale yellow solid (1.75 g, 6.1 mmol, 80%).

$^1$H RMN (CD$_2$Cl$_2$, 400 MHz): δ=7.63-7.58 (m, 2H, H$_{ar}$), 7.49 (qAB, 4H, J Δvab=9.1 Hz, J=8.6 Hz, H$_{ar}$), 7.40-7.27 (m, 3H, H$_{ar}$), 3.11 (s, 1H, OH), 2.97 (s, 1H, C≡CH).

$^{13}$C RMN (CD$_2$Cl$_2$, 100 MHz): δ=144.19, 143.87, 131.35, 128.41, 128.06, 127.80, 125.82, 121.81, 85.78, 75.87, 73.81.

F. 3-(4-bromophenyl)-13,13-bis(4-hexylphenyl-3,13-dihydrobenzo[h]indeno[2,1-f]chromen-11-amine

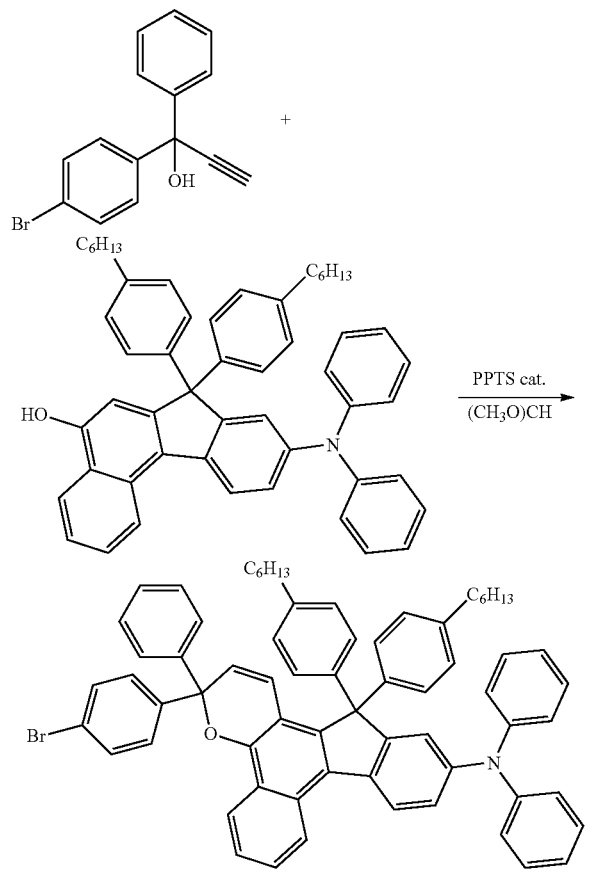

Under argon, 1-(4-bromophenyl)-1-phenylprop-2-yn-1-ol (150 mg, 0.52 mmol), 9-(diphenylamino)-7,7-bis(4-hexylphenyl)-7H-benzo[c]fluoren-5-ol (250 mg, 0.35 mmol), PPTS (4.4 mg, 17 μmol) were dissolved in anhydrous 1,2-dichloroethane (6 mL). Trimethyl orthoformate (75 μL, 0.70 mmol) was added and the reaction was heated to reflux for 9 h. Solvent was removed under reduced pressure and the crude solid was purified on silica gel using n-hexane/DCM (9:1) as eluent to give a pale green solid (197 mg, 0.20 mmol, 57.5%).

$^1$H RMN (CD$_2$Cl$_2$, 400 MHz): δ=8.60 (d, 1H, J=8.4 Hz, H$_{ar}$), 8.42 (dd, 1H, J=1.0 Hz, J=0.9 Hz, 8.4H$_{ar}$), 8.02 (d, 1H, J=8.5 Hz, H$_{ar}$), 7.60 (m, 1H, H$_{ar}$), 7.53 (m, 1H, H$_{ar}$), 7.35-7.32 (m, 4H, H$_{ar}$), 7.27-7.17 (m, 10H, H$_{ar}$), 7.11-7.07 (m, 4H, H$_{ar}$), 7.03-6.95 (m, 11H, H$_{ar}$), 6.72 (d, 1H, J=9.81 Hz, H$_{ar}$), 5.81 (d, 1H, J=9.81 Hz, H$_{ar}$), 2.58 (m, 4H, CH$_2$), 1.60 (m, 4H, CH$_2$), 1.31 (m, 12H, CH$_2$), 0.87 (t, 6H, CH$_3$).

$^{13}$C RMN (CD$_2$Cl$_2$, 100 MHz): δ=156.7, 147.5, 146.2, 146.0, 143.8, 143.4, 141.6, 141.5, 139.5, 139.4, 135.1, 131.0, 129.1, 128.9, 128.8, 128.7, 128.1, 128.0, 127.9, 127.6, 127.5, 127.3, 126.8, 126.7, 125.4, 125.3, 124.1, 123.9, 123.2, 122.8, 122.7, 122.4, 122.2, 122.2, 121.5, 121.4, 120.4, 115.1, 35.4, 31.7, 31.5, 31.4, 29.1, 22.6, 13.8.

G. 4'-(11-(diphenylamino)-13,13-bis(4-hexylphenyl)-3-phenyl-3,13-dihydrobenzo[h]indeno[2,1-f]chromen-3-yl)-[1,1'-biphenyl]-4-carbaldehyde

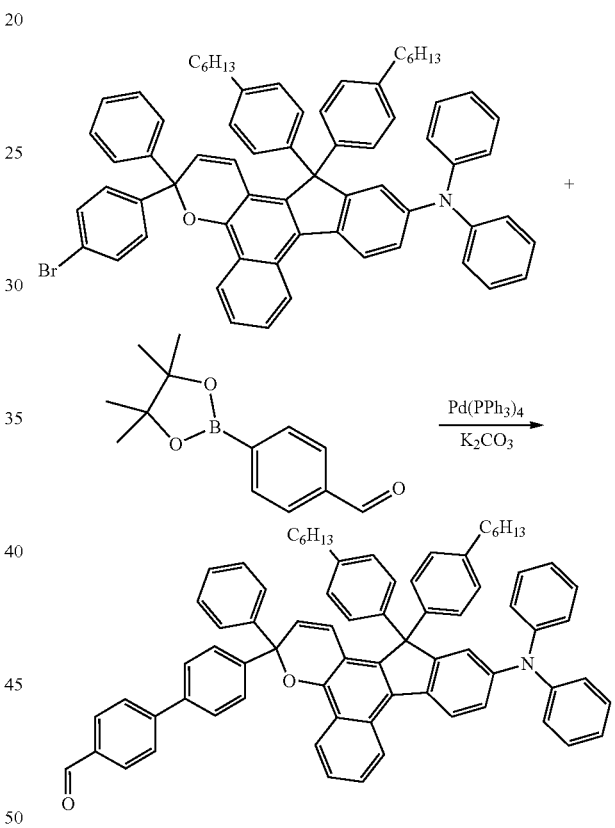

Under argon, chromene 3-(4-bromophenyl)-13,13-bis(4-hexylphenyl)-N,N,3-triphenyl-3,13-dihydrobenzo[h]indeno[2,1-f]chromen-11-amine (195 mg, 0.20 mmol), 4-(4,4,5,5-tetramethyl-1,3,2-dioxaborolan-2-yl)-benzaldehyde (60 mg, 0.27 mmol), Pd(PPh$_3$)$_4$ (4.5 mg, 3.9 μmol) were dissolved in distilled THF. Then an aqueous solution of K$_2$CO$_3$ (0.5 M, 1.6 mL) was added. The mixture was stirred overnight at reflux. The reaction was cool to room temperature before extracting the organic phase with diethyl ether. The latter is washed with brine, dried on sodium sulfate and concentrated under reduced pressure. The crude product is purified on silica gel using petroleum ether/Et$_2$O (7:3) as eluent to give a pale green solid (120 mg, 0.12 mmol, 60%).

$^1$H RMN (CD$_2$Cl$_2$, 400 MHz): δ=10.01 (s, 1H, CHO), 8.60 (d, 1H, J=8.4 Hz, H$_{ar}$), 8.48 (dd, 1H, J=1.0 Hz, J=0.9 Hz, 8.4H$_{ar}$), 8.02 (d, 1H, J=8.5 Hz, H$_{ar}$), 7.80 (ABq, 4H,

Δvab=89.2 Hz, J=7.80 Hz, H$_{ar}$), 7.60-7.39 (m, 7H, H$_{ar}$), 7.29-6.90 (m, 24H, H$_{ar}$), 6.74 (d, 1H, J=9.81 Hz, H$_{ar}$), 5.90 (d, 1H, J=9.81 Hz, H$_{ar}$), 2.59 (m, 4H, CH$_2$), 1.59 (m, 4H, CH$_2$), 1.30 (m, 12H, CH$_2$), 0.85 (t, 6H, CH$_3$).

$^{13}$C RMN (CD$_2$Cl$_2$, 100 MHz): δ=191.64, 146.37, 141.55, 141.47, 139.59, 139.46, 138.78, 135.38, 130.03, 129.60, 129.09, 128.97, 128.85, 128.78, 128.11, 128.03, 127.97, 127.58, 127.54, 127.265, 126.98, 126.79, 125.33, 124.18, 124.14, 124.08, 123.96, 123.13, 122.81, 122.74, 120.46, 81.97, 64.598, 35.45, 31.73, 31.47, 29.10, 22.60, 13.84.

H. (E)-2-cyano-3-(4'-(11-(diphenylamino)-13,13-bis (4-hexylphenyl)-3-phenyl-3,13-dihydrobenzo[h] indeno[2,1-f]chromen-3-yl)-[1,1'-biphenyl]-4-yl) acrylic acid (YKC5P21)

$^1$H RMN (THF-d$_8$, 400 MHz): δ=8.69 (d, 1H, J=8.4 Hz, H$_{ar}$), 8.52 (dd, 1H, J=1.0 Hz, J=0.9 Hz, 8.4H$_{ar}$), 8.28 (s, 1H, H$_{ar}$), 8.15-8.11 (m, 3H, H$_{ar}$), 7.80 (d, 2H, J=8.5 Hz, H$_{ar}$), 7.64-7.61 (m, 3H, H$_{ar}$), 7.56-7.42 (m, 6H, H$_{ar}$), 7.28-7.15 (m, 11H, H$_{ar}$), 7.08-6.95 (m, 11H, H$_{ar}$), 6.80 (d, 1H, J=9.81 Hz, H$_{ar}$), 5.95 (d, 1H, J=9.81 Hz, H$_{ar}$), 2.59 (m, 4H, CH$_2$), 1.66 (m, 4H, CH$_2$), 1.35 (m, 12H, CH$_2$), 0.91 (t, 6H, CH$_3$).

$^{13}$C RMN (THF-d$_8$, 100 MHz): δ=158.13, 149.02, 147.72, 147.18, 145.64, 142.42, 141.23, 141.18, 139.86, 136.77, 132.66, 131.11, 129.21, 129.17, 129.01, 128.63, 128.38, 128.23, 127.92, 126.89, 126.39, 125.31, 124.30, 123.86, 123.74, 123.66, 122.01, 116.51, 36.82, 33.14, 32.98, 30.55, 28.18, 23.93, 14.84.

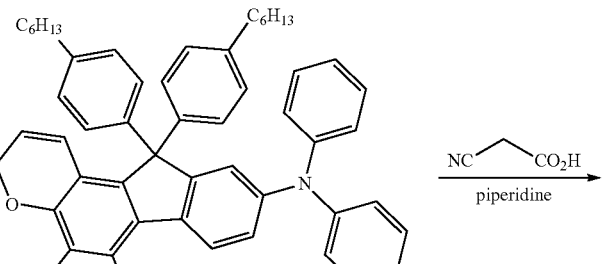

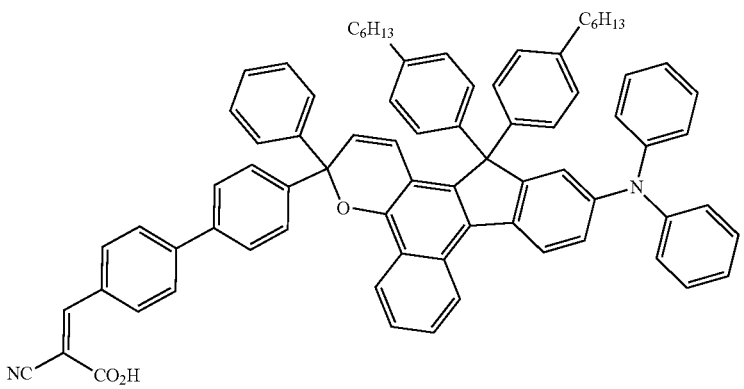

4'-(11-(diphenylamino)-13,13-bis(4-hexylphenyl)-3-phenyl-3,13-dihydrobenzo[h]indeno[2,1-f]chromen-3-yl)-[1,1'-biphenyl]-4-carbaldehyde (100 mg, 0.10 mmol), cyanoacetic acid (83 mg, 0.98 mmol), were dissolved in a mixture of acetonitrile (8 mL) and chloroform (12 mL). A catalytic amount of piperidine was added and the solution was refluxed for 3 h. Solvent was removed under reduced pressure and the solid redissolved in chloroform. The organic phase was washed with an HCl solution (2 M), dried on sodium sulfate and concentrated. The crude solid was chromatographed on silica using DCM followed by DCM/MeOH and DCM/MeOH/Acetic acid 96/2/2 as eluents to afford pale green solid (94 mg, 0.09 mmol, 88%).

I.8. Synthesis of (Z)-3-(4'-(8-(4-(bis(4-hexylphenyl) amino)phenyl)-3-phenyl-3H-benzo[f]chromen-3-yl)-[1,1'-biphenyl]-4-yl)-2-cyanoacrylic acid (DJ307)

A. 4-hexyl-N-(4-hexylphenyl)-N-(4-(6-methoxynaphthalen-2-yl)phenyl)aniline

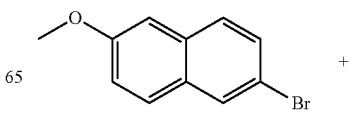

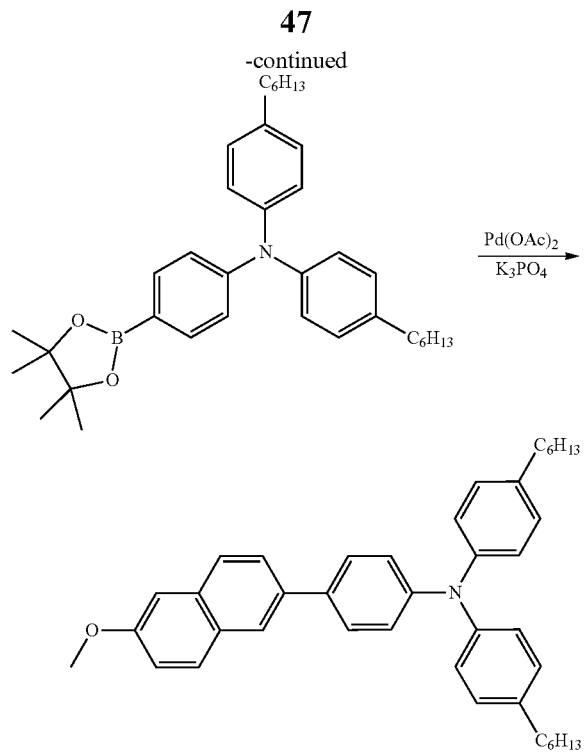

4-(N,N-di((4-hexyloxy)phenyl)amine)phenyl-(4,4,5,5-tetra methyl-1,3,2-dioxa)-borolane was already described by Yum et al, 2009 [10].

Under air condition, 2-bromo-6-methoxynaphtalene (235 mg) and 4-(N,N-di((4-hexyloxy)phenyl)amine)phenyl-(4,4,5,5-tetramethyl-1,3,2-dioxa)-borolane (616 mg) and PdOAc (4.5 mg) were dissolved in iPrOH/H$_2$O mixture (50 mL, 2:1). The mixture was heated to reflux and K$_3$PO$_4$ (632 mg) was added. The mixture was stirred for 2 h at 80° C. before being cooled to room temperature. The organic phase was extracted with diethylether, washed with brine, dried on sodium sulfate and concentrated. Purification on silica gel using n-hexane/dichloromethane (6/4 in volume) as eluent to give a white solid (440 mg, 77%).

$^1$H RMN (CD$_2$Cl$_2$, 400 MHz): 0.90 (t, 6H, —CH3, J=7.33 Hz); 1.33 (m, 12H); 1.62 (m, 4H); 2.58 (t, 4H); 3.92 (m, 3H, —OCH3); 7.01-7.18 (m, 12H); 7.57 (m, 2H); 7.72 (m, 1H); 7.76 (m, 2H); 7.94 (m, 1H)

B. 6-(4-(bis(4-hexylphenyl)amino)phenyl)naphthalen-2-ol

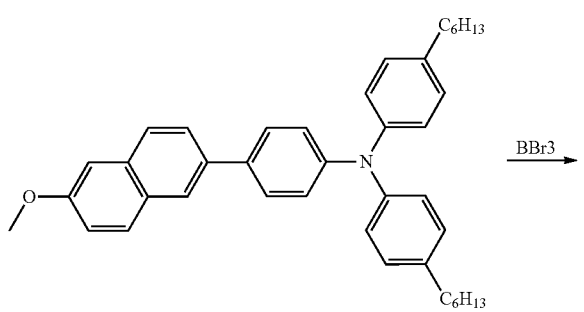

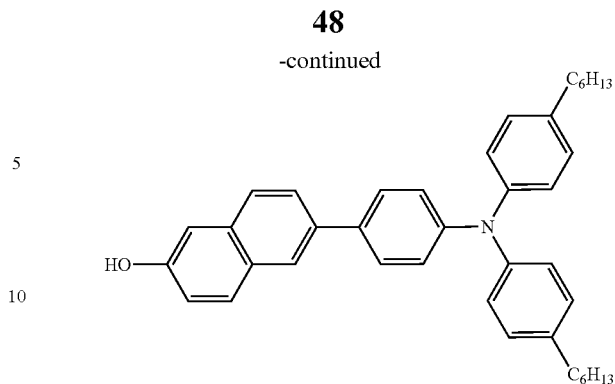

Under argon, the methoxy-protected precursor (470 mg, 1 eq) was dissolved in distilled THF (10 mL). Then BBr$_3$ (270 mg, 1.3 eq) was added at 0° C. The reaction was allowed to reach room temperature in 3 h under vigorous stirring. Then the reaction was quenched with K$_2$CO$_3$, saturation solution. The organic phase was extracted with DCM and dried with sodium sulfate. After concentration under vacuum the purification was carried out on silica gel using a mixture of n-hexane and EtOAc as eluent (8/2 in volume). A second purification with DCM as eluent was necessary to recover the pure product (370 mg, 83%).

$^1$H RMN (CD$_2$Cl$_2$, 200 MHz): δ=8.03 (s, 1H, H$_{ar}$), 7.87 (d, 1H, J=8.8 Hz, H$_{ar}$), 7.79 (m, 2H, H$_{ar}$), 7.65 (d, 2H, J=8.8 Hz, H$_{ar}$), 7.15-7.30 (m, 12H, H$_{ar}$), 5.58 (s, 1H, OH), 2.69 (t, 4H, J=7.6 Hz, H$_{alk}$), 1.73 (q, 4H, J=7.6 Hz, H$_{alk}$), 1.50-1.40 (m, 10H), 1.03 (t, 6H).

C. 4-(3-(4-bromophenyl)-3-phenyl-3H-benzo[f]chromen-8-yl)-N, N-bis(4-hexylphenyl)aniline

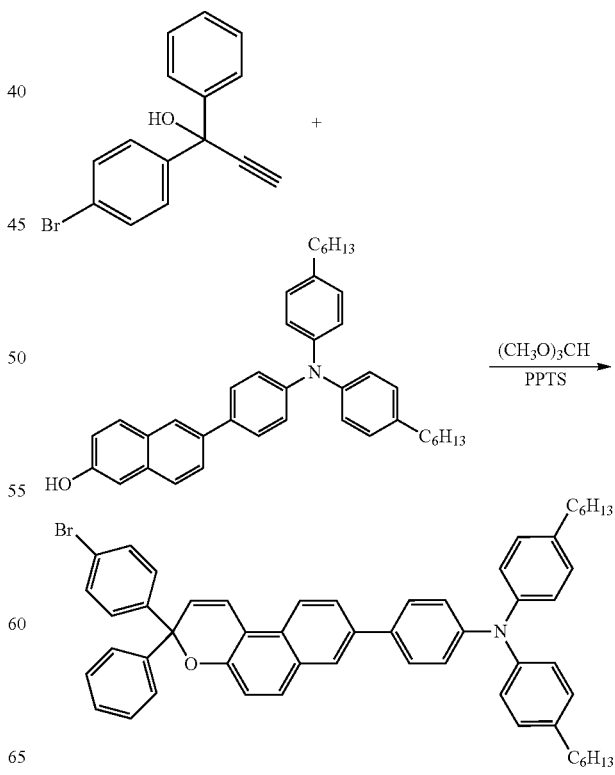

Under argon, 1-(4-bromophenyl)-1-phenylprop-2-yn-1-ol (246 mg), 6-(4-(bis(4-hexylphenyl)amino)phenyl)naphthalen-2-ol (318 mg), PPTS (7.1 mg) were dissolved in anhydrous 1,2-dichloroethane (6 mL). Trimethyl orthoformate (0.13 mL) was added and the reaction was heated to reflux overnight. Solvent was removed under reduced pressure and the crude solid was purified on silica gel using n-hexane/DCM (7:3 in volume) as eluent to give a white solid (360 mg, 63%).

RMN $^1$H (CD$_2$Cl$_2$): 1.10 (t, 6H, —CH$_3$); 1.53 (m, 12H); 1.80 (m, 4H); 2.78 (m, 4H); 6.50 (d, 1H, J=9.90 Hz); 7.20-7.33 (m, 9H); 7.41 (d, 2H, J=8.83 Hz); 7.56 (m, 3H); 7.65-7.72 (m, 7H); 7.76 (d, 2H, J=8.66 Hz); 7.91-7.98 (m, 2H); 8.12 (m, 1H); 8.22 (d, 1H, J=8.84 Hz)

D. 4'-(8-(4-(bis(4-hexylphenyl)amino)phenyl)-3-phenyl-3H-benzo[f]chromen-3-yl)-[1,1'-biphenyl]-4-carbaldehyde

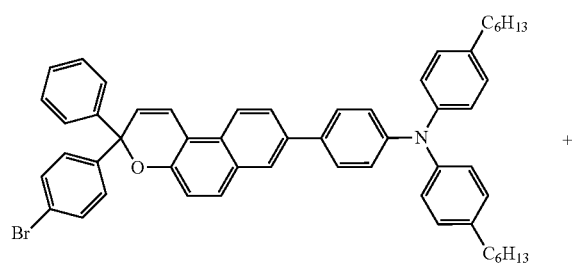

+

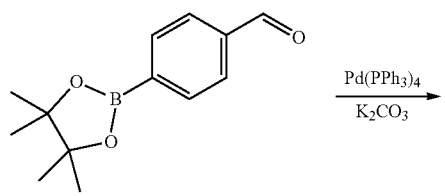

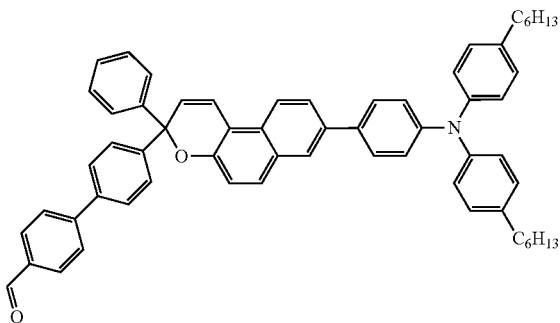

Under argon, 4-(3-(4-bromophenyl)-3-phenyl-3H-benzo[f]chromen-8-yl)-N,N-bis(4-hexylphenyl)aniline (110 mg), 4-(4,4,5,5-tetramethyl-1,3,2-dioxaborolan-2-yl)-benzaldehyde (46 mg), Pd(PPh$_3$)$_4$ (5 mg) were dissolved in distilled THF. Then an aqueous solution of K$_2$CO$_3$ (0.5 M, 0.8 mL) was added. The mixture was stirred 48 h at reflux. The reaction was cool to room temperature before extracting the organic phase with dichloromethane. The latter was washed with brine, dried on sodium sulfate and concentrated under reduced pressure. The crude product was purified on silica gel using DCM/hexanes ether (1/1) as eluent to give a white solid (80 mg, 70%).

$^1$H RMN (CD$_2$Cl$_2$, 400 MHz): δ=10.15, (s, 1H, Aldehyde), 8.2 (d, 1H, J=8.9 Hz, H$_{ar}$), 8.1 (d, 1H, J=1.6 Hz, H$_{ar}$), 8.02 (d, 2H, J=8.45 Hz), 7.93 (dd, 2H, J=1.84 Hz, J=8.3 Hz), 7.90 (d, 2H, J=8.4 Hz), 7.74 (d, 2H, J=8.7 Hz, H$_{ar}$), 7.69 (d, 2H, J=8.8 Hz, H$_{ar}$), 7.60 (d, 2H, J=9.9 Hz, C=CH), 7.52 (t, 2H, J=7.8 Hz, H$_{ar}$), 7.47 (d, 1H, J=7.2 Hz), 7.42 (d, 1H, J=7.2 Hz) 7.28 (t, 5H, J=8.3 Hz, H$_{ar}$), 7.21 (d, 3H, J=8.4 Hz, H$_{ar}$), 6.53 (d, 1H, J=9.9 Hz, C=CH), 2.76 (t, 4H, J=7.8 Hz), 1.8 (q, 4H, J=7.6 Hz), 1.46-1.59 (m, 12H), 1.05-1.12 (m, 6H).

E. (Z)-3-(4'-(8-(4-(bis(4-hexylphenyl)amino)phenyl)-3-phenyl-3H-benzo[f]chromen-3-yl)-[1,1'-biphenyl]-4-yl)-2-cyanoacrylic acid (DJ307)

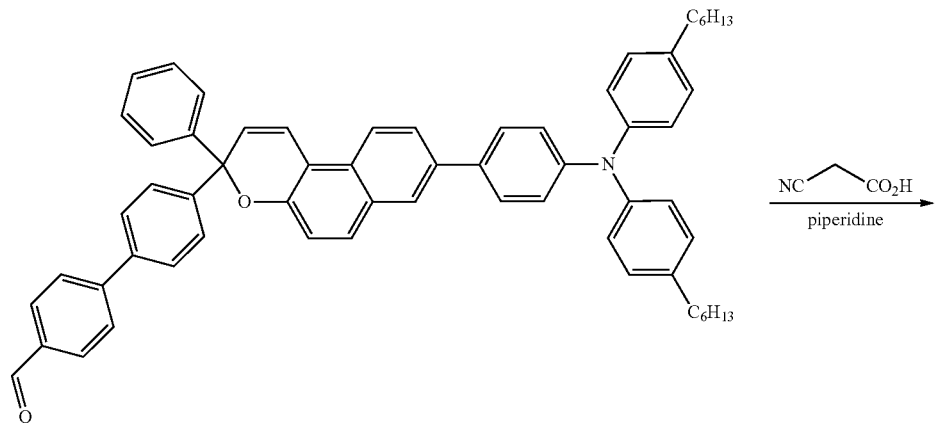

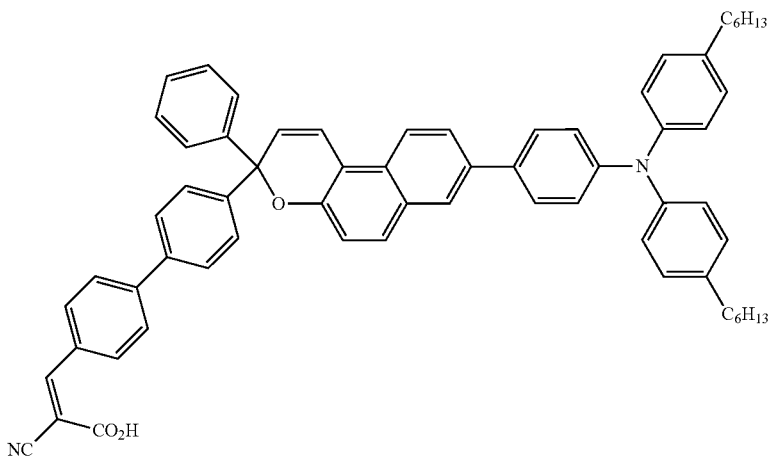

4'-(8-(4-(bis(4-hexylphenyl)amino)phenyl)-3-phenyl-3H-benzo[f]chromen-3-yl)-[1,1'-biphenyl]-4-carbaldehyde (70 mg), cyanoacetic acid (35 mg), were dissolved in a mixture of acetonitrile (10 mL) and chloroform (5 mL). A catalytic amount of piperidine was added and the solution was refluxed for 3 h. Solvent was removed under reduced pressure and the solid redissolved in chloroform. The organic phase was washed with HCl solution (2 M), dried on sodium sulfate and concentrated. The crude solid was chromatographed on silica using DCM followed by DCM/MeOH and DCM/MeOH/Acetic acid 96/2/2 as eluents to afford pale yellow solid (25 mg, 33%).

RMN $^1$H (THF D$^8$, 400 MHz): δ=0.90 (t, 6H, —CH$_3$); 1.33 (m, 12H); 1.60 (m, 4H); 2.56 (m, 4H); 6.41 (d, 1H, J=9.94 Hz); 7.00 (m, 4H); 7.07 (m, 5H); 7.22 (m, 2H); 7.30 (m, 2H); 7.47 (d, 1H, J=9.92 Hz); 7.56 (m, 4H); 7.65 (m, 4H); 7.72-7.76 (m, 2H); 7.79 (m, 3H); 7.94 (m, 1H); 8.07-8.12 (m, 3H); 8.26 (s, 1H)

$^{13}$C RMN: (THF D$^8$, 100 MHz): δ=163.68 (C═O), 153.73, 151.18, 148.38, 146.35, 146.31, 145.80, 145.50, 139.25, 138.19, 136.66, 134.81, 132.12 (2C), 131.80, 130.78, 130.70, 129.74 (4C), 129.55, 128.65 (2C), 128.49, 128.25 (2C), 128.10, 128.06 (2C), 128.01, 127.51 (2C), 127.39, 126.36, 125.91, 125.77, 125.08 (4C), 123.82, 123.07, 122.60, 121.74, 120.45, 119.08, 116.18, 114.90, 104.29, 83.04 (C-spiro), 36.03 (2C), 32.53 (2C), 32.42 (2C), 29.84 (2C), 23.32 (2C), 14.23 (2C).

I.9. Synthesis of (E)-2-cyano-3-(5-(4-(11-(diphenylamino)-13,13-bis(4-hexylphenyl)-3-phenyl-3,13-dihydrobenzo[h]indeno[2,1-f]chromen-3-yl)phenyl)thiophen-2-yl)acrylic acid (LG36)

A. 5-(4-(11-(diphenylamino)-13,13-bis(4-hexylphenyl)-3-phenyl-3,13-dihydrobenzo[h]indeno[2,1-f]chromen-3-yl)phenyl)thiophene-2-carbaldehyde

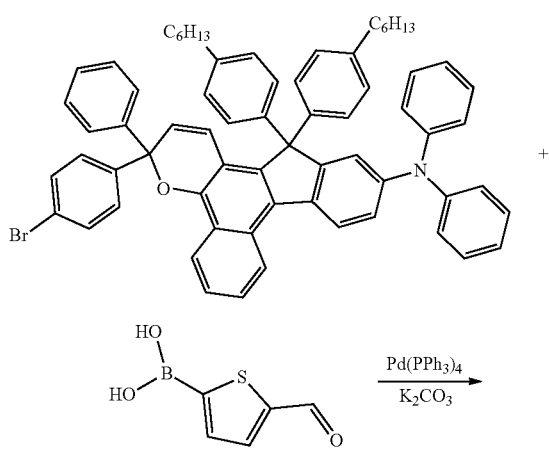

-continued

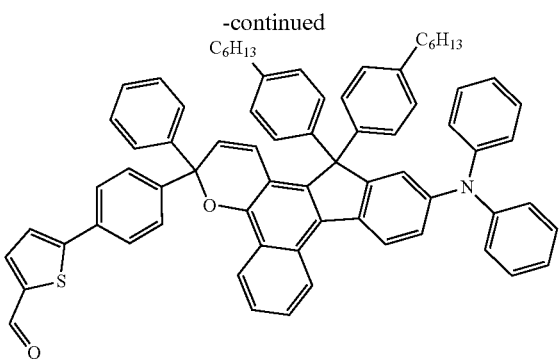

Under argon, chromene 3-(4-bromophenyl)-13,13-bis(4-hexylphenyl)-N,N,3-triphenyl-3,13-dihydrobenzo[h]indeno[2,1-f]chromen-11-amine (245 mg, 0.25 mmol), the (5-formylthiophen-2-yl)boronic acid (43 mg, 0.73 mmol) and the Pd(PPh3)4 (9 mg, 7.4 μmol) were dissolved degassed and dry toluene (3 mL) and distilled THF (24 mL). After the total dissolution of the reactants the base, $K_2CO_3$ (0.5M, 1.5 mL) is added and the solution was heated over 70° C. overnight. The mixture is directly concentrated them quenched with HCl 1M, exacted with diethyl ether and washed with water and saturated sodium chloride solution. The crude mixture is purified on silica by column chromatography using hexane/Et2O: 9/1 as eluent and then purified on silica gel column chromatography hexane/DCM: 5/5. Finally it was purified on silica gel by column chromatography with hexane/THF: 95/5 as eluent to give a green solid (28%).

$^1$H NMR ($CD_2Cl_2$, 400 MHz): δ=9.59 (s, 1H, CHO), 8.61 (d, J=8.0 Hz, 1H, $H_{ar}$), 8.47 (dd, J=1.2 Hz, J=8.4 Hz, 1H, $H_{ar}$), 8.03 (d, J=8.4 Hz, 1H, $H_{ar}$), 7.68 (dt, J=2 Hz, J=8.8 Hz, 2H, $H_{ar}$), 7.63-7.52 (m, 3H, $H_{ar}$), 7.45 (dt, J=2 Hz, J=8.8 Hz, 2H, $H_{ar}$), 7.37-7.35 (m, 2H, $H_{ar}$), 7.28 (d, J=3.6 Hz, 1H, $H_{ar}$), 7.24-7.16 (m, 7H, $H_{ar}$), 7.11-7.09 (m, 4H, $H_{ar}$), 7.04-6.98 (m, 9H, Har), 6.95 (s, 2H, $H_{ar}$), 6.81 (d, J=3.6 Hz, 1H, $H_{ar}$), 6.75 (d, J=10 Hz, 1H, $H_{alkene}$), 5.88 (d, J=10 Hz, 1H, $H_{alkene}$), 2.60 (m, 4H, $CH_2$), 1.61 (m, 4H, $CH_2$), 1.32 (m, 12H, CH2), 0.89 (m, 6H, $CH_3$).

$^{13}$C NMR ($CD_2Cl_2$, 400 MHz): δ=177.60, 159.32, 157.26, 152.80, 148.09, 146.90, 146.51, 144.34, 142.12, 140.12, 140.05, 136.39, 135.67, 131.27, 130.18, 129.38, 128.97, 128.87, 128.80, 128.61, 128.25, 128.10, 127.87, 127.70, 127.44, 125.99, 125.94, 125.65, 125.49, 124.70, 124.55, 123.86, 123.54, 123.34, 123.01, 122.86, 120.99, 115.79, 108.50, 82.55, 65.18, 36.05, 32.34, 32.10, 29.71, 23.22, 14.46

B. (E)-2-cyano-3-(5-(4-(11-(diphenylamino)-13,13-bis(4-hexylphenyl)-3-phenyl-3,13-dihydrobenzo[h]indeno[2,1-f]chromen-3-yl)phenyl)thiophen-2-yl)acrylic acid (LG36)

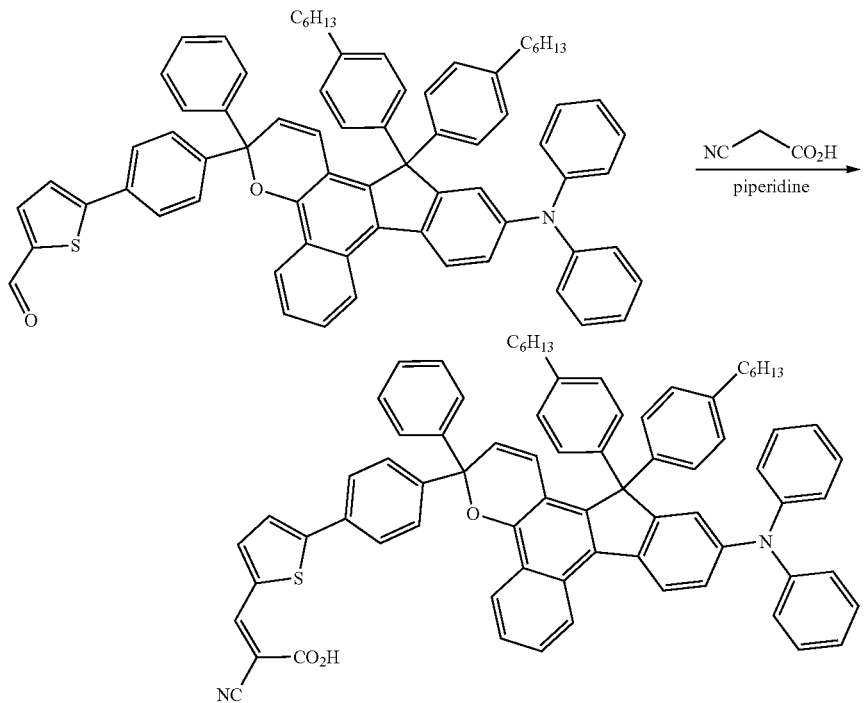

5-(4-(11-(diphenylamino)-13,13-bis(4-hexylphenyl)-3-phenyl-3,13-dihydrobenzo[h]indeno[2,1-f]chromen-3-yl)phenyl)thiophene-2-carbaldehyde (70 mg, 69 μmol), and the 2-cianoacetic acid (58 mg, 0.69 mmol) are dried under vacuum before their dissolution in distilled acetonitrile (5 mL) and anhydrous chloroform (4 mL). Two drop of piperidine were added before heating at 70° C. during 4 hours. The mixture was directly concentrated then neutralized with HCl 1M, extracted with DCM and washed with water. The solution is dried under sodium sulfate, concentrated under vacuum and the crude mixture was purified by column chromatography with three different eluents, the first was 100% DCM, the second was DCM with 2% methanol and the third was DCM with 2% methanol and 2% acetic acid. A green solid is obtained (69 mg, 94%).

$^1$H NMR (THF, 400 MHz): δ=8.66 (d, J=8.4 Hz, 1H, $H_{ar}$), 8.49 (d, J=8 Hz, 1H, $H_{ar}$), 8.09 (d, J=8.4 Hz, 1H, $H_{ar}$), 7.96

(s, 1H, COOH), 7.81 (d, J=8.4 Hz, 2H, H$_{ar}$), 7.69 (q, J=3.2 Hz, 1H, H$_{ar}$), 7.59-7.47 (m, 5H, H$_{ar}$), 7.40 (d, J=7.6 Hz, 2H, H$_{ar}$), 7.32 (d, J=3.6 Hz, 1H, H$_{ar}$), 7.24-7.10 (m, 12H, H$_{ar}$), 7.06-6.92 (m, 11H, H$_{ar}$), 6.77 (d, J=9.6 Hz, 1H, H$_{alkene}$), 5.92 (d, J=9.6 Hz, 1H, H$_{alkene}$), 2.62 (m, 4H, CH2), 1.62 (m, 4H, CH2), 1.37 (m, 12H, CH2), 0.95 (m, 6H, CH3).

$^{13}$C NMR (THF, 400 MHz): δ=169.05, 167.47, 159.56, 157.57, 149.15, 148.38, 147.10, 146.54, 144.84, 142.04, 141.79, 140.58, 140.42, 137.89, 136.11, 133.44, 131.37, 130.46, 129.66, 129.62, 129.39, 129.14, 128.97, 128.64, 128.55, 128.41, 128.05, 127.90, 127.74, 127.54, 126.28, 125.83, 125.49, 124.69, 123.85, 123.64, 123.25, 123.14, 123.01, 121.37, 116.07, 109.69, 82.79, 64.72, 36.21, 32.54, 32.38, 29.94, 23.33, 14.26.

I.10. Synthesis of (Z)-2-cyano-3-(4-(11-(diphenylamino)-13,13-bis(4-hexylphenyl)-3-phenyl-3,13-dihydrobenzo[h]indeno[2,1-f]chromen-3-yl)phenyl) acrylic acid [YKC5P98]

A. (4-(5,5-dimethyl-1,3-dioxan-2-yl)phenyl)(phenyl) methanone [YKC5P60]

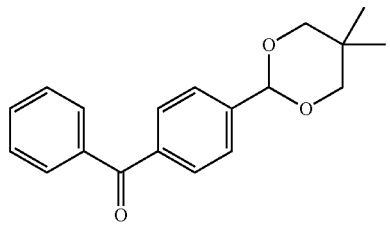 [SMILES: CC1(C)COC(c2ccc(C(=O)c3ccccc3)cc2)OC1]

Under argon, N,O-dimethylhydroxylamine hydrochloride (729 mg, 1.5 eq), was dissolved in anhydrous DCM (110 mL). The solution was cooled to 0° C. and stirred 5 min before the addition of trimethylamine (1.26 g, 2.5 eq). After, benzoyl chloride (700 mg, 5 mmol) was added dropwise and stirred for 30 min at 0° C. and the cold bath was left for stirred overnight at room temperature. The mixture was treated with a NaHCO$_3$ saturated solution and the organic phase was extracted with DCM, dried on sodium sulfate and concentrated. A flash purification was performed on silica gel using Hexane/Et$_2$O: 8/2 as eluent to afford a pale oil of N-methoxy-N-methylbenzamide which used after.

In a second flask, under argon 2-(4-bromophenyl)-5,5-dimethyl-1,3-dioxane (1 g, 3.7 mmol) is dissolved in distilled THF (15 mL), n-BuLi (1.62 mL, 4 mmol, 1.1 eq) is added dropwise at −78° C. The solution was stirred for 1 h before addition of a solution of N-methoxy-N-methylbenzamide (610 mg, 1 eq) in 10 mL of THF. The reaction was stirred for 20 h and at room temperature. The reaction was quenched with water and the organic phase was extracted with diethyl ether and washed with brine, dried over sodium sulphate, filtered and concentrated under vacuum. The crude was purified by chromatography on silica gel using n-hexane/Et$_2$O: 5/5 as eluent to afford white solid (800 mg, 2.7 mmol, 73.2%).

$^1$H NMR (CDCl$_3$, 400 MHz): δ=7.8 (m, 4H, H$_{ar}$), 7.63 (m, 2H, H$_{ar}$), 7.58 (m, 1H, H$_{ar}$), 7.47 (m, 2H, H$_{ar}$), 5.47 (s, 1H, CH), 3.81 (d, 2H, J=11.2 Hz, CH$_2$), 3.68 (d, 2H, J=11.2 Hz, CH$_2$), 1.31 (s, 3H, CH$_3$), 0.82 (s, 3H, CH$_3$).

$^{13}$C NMR (CDCl$_3$, 100 MHz): δ=196.46, 142.47, 137.95, 137.57, 132.45, 130.08, 128.25, 126.13, 100.95, 77.70, 30.29, 23.03, 21.86.

B. 1-(4-(5,5-dimethyl-1,3-dioxan-2-yl)phenyl)-1-phenylprop-2-yn-1-ol [YKC5P63]

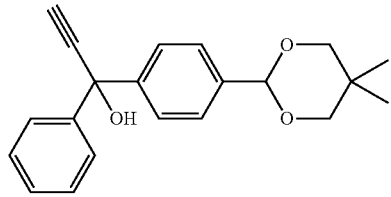 [SMILES: C#CC(O)(c1ccccc1)c1ccc(C2OCC(C)(C)CO2)cc1]

Under argon, sodium acetylide (7.2 g, 27 mmol, 18 wt % in xylene) was dissolved in anhydrous THF (200 mL). (4-(5,5-dimethyl-1,3-dioxan-2-yl)phenyl)(phenyl)methanone (800 mg, 2.7 mmol) was added in one portion at 0° C. After reaching room temperature the reaction mixture was stirred for 3 h. Then a NH$_4$Cl saturated solution was added to the reaction and stirred for 30 min. The organic phase was extracted with Et$_2$O, dried on sodium sulfate and concentrated. The crude was purified on silica gel using n-hexane/THF: 85/15 as eluent to give a white solid (811 mg, 2.5 mmol, 93.2%).

$^1$H NMR (CDCl$_3$, 400 MHz): δ=7.61 (m, 2H, H$_{ar}$), 7.56 (m, 2H, H$_{ar}$), 7.48 (m, 2H, H$_{ar}$), 7.30 (m, 2H, H$_{ar}$), 7.27 (m, 1H, H$_{ar}$), 5.38 (s, 1H, CH), 3.76 (d, 2H, J=11.2 Hz, CH$_2$), 3.64 (d, 2H, J=11.2 Hz, CH$_2$), 2.86 (s, 1H, C≡CH), 2.77 (s, 1H, OH), 1.27 (s, 3H, CH$_3$), 0.79 (s, 3H, CH$_3$).

$^{13}$C NMR (CDCl$_3$, 100 MHz): δ=144.95, 138.10, 128.25, 127.86, 126.12, 125.99, 101.34, 77.64, 75.57, 30.22, 23.01, 21.87.

C. 4-(11-(diphenylamino)-13,13-bis(4-hexylphenyl)-3-phenyl-3,13-dihydrobenzo[h]indeno[2,1-f] chromen-3-yl)benzaldehyde

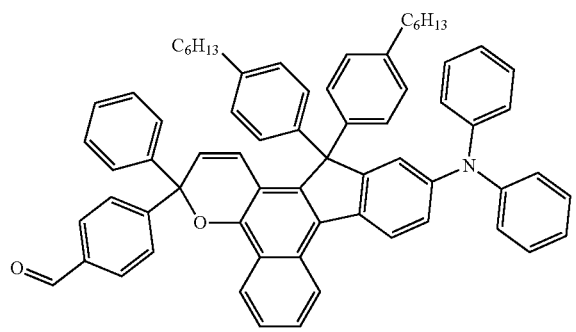

Under argon, propargylic alcohol [YKC5P63] (269 mg, 0.84 mmol, 1.5 eq), naphtol [YKC5P16] (400 mg, 0.35 mmol), Pyridinium p-toluenesulfonate [PPTS] (7 mg, 27.8 μmol) was dissolved in anhydrous 1,2-dichloroethane (10 mL). Trimethyl orthoformate (121 μL, 1.10 mmol) was added and the reaction was heated at 65° C. overnight. Solvent was removed under reduced pressure and the crude solid was purified on silica gel using n-hexane/acetone: 95/5 as eluent to give a green oil (197 mg, 0.20 mmol). In a flask, this oil was put with p-toluenesulfonic acid (70 mg, 1.3 eq) in a mix of 10 mL of THF and 4 mL of HCl conc. This mixture was refluxed for 3 h and was treated with a NaHCO$_3$ saturated. The organic phase was extracted with Et$_2$O, dried on sodium sulfate and concentrated. Purification was performed on silica gel using n-hexane/acetone: 95/5 as eluent to give a green solid (181 mg, 0.19 mmol, 31.8%).

$^1$H RMN (CDCl$_3$, 400 MHz): δ=9.91 (s, 1H, CHO), 8.57 (d, 1H, J=8.3 Hz, H$_{ar}$), 8.45 (dd, 1H, J=1.1 Hz, J=8.3 Hz, H$_{ar}$), 7.98 (d, 1H, J=8.6 Hz, H$_{ar}$), 7.61 (ABq, 4H, Δvab=74.9 Hz, J=8.40 Hz, H$_{ar}$), 7.59-7.54 (m, 2H, H$_{ar}$), 7.33-7.30 (m, 2H, H$_{ar}$), 7.25-7.10 (m, 13H, H$_{ar}$), 7.01-6.91 (m, 12H, H$_{ar}$), 6.76 (d, 1H, J=9.81 Hz, H$_{ar}$), 5.80 (d, 1H, J=9.81 Hz, H$_{ar}$), 2.58 (m, 4H, CH$_2$), 1.61 (m, 4H, CH$_2$), 1.31 (m, 12H, CH$_2$), 0.87 (t, 6H, CH$_3$).

$^{13}$C RMN (CDCl$_3$, 100 MHz): δ=191.77, 156.59, 151.07, 147.48, 147.36, 146.27, 145.76, 143.38, 141.23, 141.21, 139.60, 139.51, 135.37, 135.17, 129.68, 129.44, 129.03, 128.90, 128.57, 128.17, 127.95, 127.92, 127.75, 127.58, 127.19, 126.88, 126.23, 125.28, 124.03, 123.71, 122.94, 122.59, 122.41, 122.34, 120.67, 115.14, 81.89, 64.56, 35.53, 31.73, 31.46, 31.42, 29.11, 22.61, 14.09.

D. (Z)-2-cyano-3-(4-(11-(diphenylamino)-13,13-bis(4-hexylphenyl)-3-phenyl-3,13-dihydrobenzo[h]indeno[2,1-f]chromen-3-yl)phenyl)acrylic acid [YKC5P98]

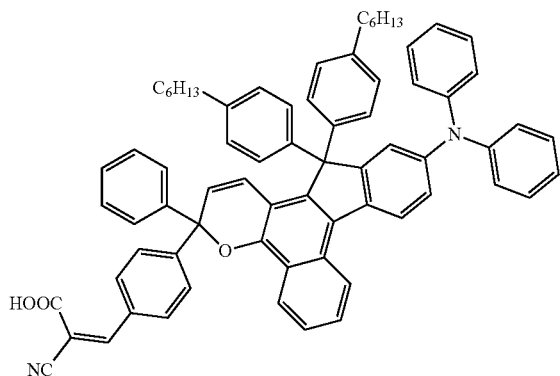

4-(11-(diphenylamino)-13,13-bis(4-hexylphenyl)-3-phenyl-3,13-dihydrobenzo[h]indeno[2,1-f]chromen-3-yl)benzaldehyde [YKC5P96] (175 mg, 0.19 mmol), cyanoacetic acid (158 mg, 1.87 mmol, 10 eq), were dissolved in a mixture of acetonitrile (15 mL) and chloroform (15 mL). A catalytic amount of piperidine was added and the solution was refluxed for 12 h. Solvent was removed under reduced pressure and the solid was dissolved in chloroform. The organic phase was washed with an HCl solution (2M), dried on sodium sulfate and concentrated. The crude solid was chromatographed on silica using DCM followed by DCM/MeOH: 98/2 and DCM/MeOH/Acetic acid: 96/2/2 as eluents to afford blue-green solid (151 mg, 0.15 mmol, 80.5%).

$^1$H RMN (THF-d8, 400 MHz): δ=8.65 (d, 1H, J=8.4 Hz, H$_{ar}$), 8.48 (dd, 1H, J=1.0 Hz, J=0.9 Hz, 8.4H$_{ar}$), 8.16 (s, 1H, H$_{ar}$), 8.08 (d, 1H, J=8.6 Hz, H$_{ar}$), 7.91 (d, 2H, J=8.5 Hz, H$_{ar}$), 7.58 (m, 1H, H$_{ar}$), 7.52-7.5 (m, 3H, H$_{ar}$), 7.39 (m, 2H, H$_{ar}$), 7.24-7.10 (m, 12H, H$_{ar}$), 7.06-6.92 (m, 11H, H$_{ar}$), 6.79 (d, 1H, J=9.81 Hz, H$_{ar}$), 5.91 (d, 1H, J=9.81 Hz, H$_{ar}$), 2.60 (m, 4H, CH$_2$), 1.63 (m, 4H, CH$_2$), 1.33 (m, 12H, CH$_2$), 0.89 (t, 6H, CH$_3$).

$^{13}$C RMN (THF-d8, 100 MHz): δ=156.81, 152.57, 149.18, 147.60, 147.45, 146.29, 145.86, 143.72, 141.27, 141.08, 139.74, 135.25, 131.30, 130.41, 129.72, 128.91, 128.52, 127.98, 127.86, 127.82, 127.61, 127.44, 127.11, 126.70, 126.52, 125.45, 125.16, 123.96, 123.41, 122.83, 122.53, 122.420 122.21, 120.52, 115.23, 81.88, 64.62, 35.43, 35.37, 31.76, 31.62, 29.15, 22.56, 13.50.

II. Tests in Solar Cells

The devices were prepared as followed: the layer of TiO$_2$ films were screen-printed (ordered from Solaronix). The electrode total active area was 0.36 cm$^2$. A layer of transparent titania was deposited with a TiO$_2$ nanoparticles paste (Ti-Nanoxide HT/SP) obtained from Solaronix, Switzerland. In order to optimize adhesion, titania layer porosity and specific area a pre and post TiCl$_4$ treatment was performed.

After sintering at 500° C. and cooling down to 70° C., the sintered TiO$_2$ electrodes were sensitized by immersion in a solution of the dye in indicated solvent with or without chenodeoxycholic acid (CDCA) for at least 1 h but preferentially 3 h or longer in SPrAM, and then assembled using a thermally platinized FTO/glass (TCO 22-7, Solaronix) counter electrode. The working and counter electrodes were separated by a 60 μm thick hot melt gasket (Meltonix 1170-25, Solaronix) and sealed by heating. The heating was minimized to avoid dye thermal degradation.

The cell was then filled with a volatile electrolyte (Solaronix Iodolyte HI-30) through a pre-drilled hole using a vacuum pump. The electrolyte injection hole on the thermally platinized FTO glass counter electrode was finally sealed with a thin glass cover.

Devices using a non-volatile ionic liquid based electrolyte (Solaronix Mosalyte TDE-250) were prepared following the previously described procedure with a 25 μm thick hot melt gasket. The devices were characterized using a Oriel SP94023 A (Xe lamp) solar simulator (AAA) previously calibrated. The current-voltage characteristics of the cell measured under AM 1.5G, 100% sun, were obtained by applying external potential bias to the cell and by measuring the generated photocurrent with a Keithley model 2400 digital source meter (Keithley, USA). The devices were masked prior to measurement according to a procedure previously described to attain an illuminated active area of 0.36 cm$^2$.

III. Results Obtained with the Organic Dyes According to the Invention

III.1. Absorption Spectrum of the Organic Dyes According to the Invention

The organic dye DJ277 shows a reversible photochromic behavior and can absorb UV light up to 400 nm in the close form (FF) giving rise to the formation of the colored species (FO) that can absorb photons up to 500-550 nm (FIG. 1).

The organic dye YKC5P21 presents a range of absorption of the close form (FF) in the UV shifted up to 450 nm (FIG. 1). This gives rise to a better light absorption even in devices and as a consequence the absorption range of the colored species (FO). The chemical modification of YKC5P21 compared to DJ277 i.e. a more extended pi-conjugated system with a fused ring makes it possible to improve the coloration upon irradiation even in devices.

III.2. Power Conversion Efficiencies

Results obtained in a device configuration with organic chromophoric dyes according to the present invention (DJ255, DJ277 and YKC5P21) are presented respectively in Tables 1, 2 and 3 hereafter.

The devices were irradiated using a solar simulator with a power of irradiation of 1000 W/m$^2$ at 25° C. The I(V) curves were recorded at different interval time and the photovoltaic parameters were measured.

The power conversion efficiency is calculated by η=P_max/P_in 100%, where P_max is the maximum generated power and P_in the electrical input power from the light source. The important parameter connected with the efficiency is the field factor, which is the ratio of the maximum power to the theoretical power FF=P_max/P_theor=P_max/(V_oc [ J ]_sc), with Voc the open circuit voltage (for I=0) and Jsc the short circuit current (for V=0). So the efficiency can be written q=(J_sc V_(oc) FF)/P_in 100%

Figure 2:
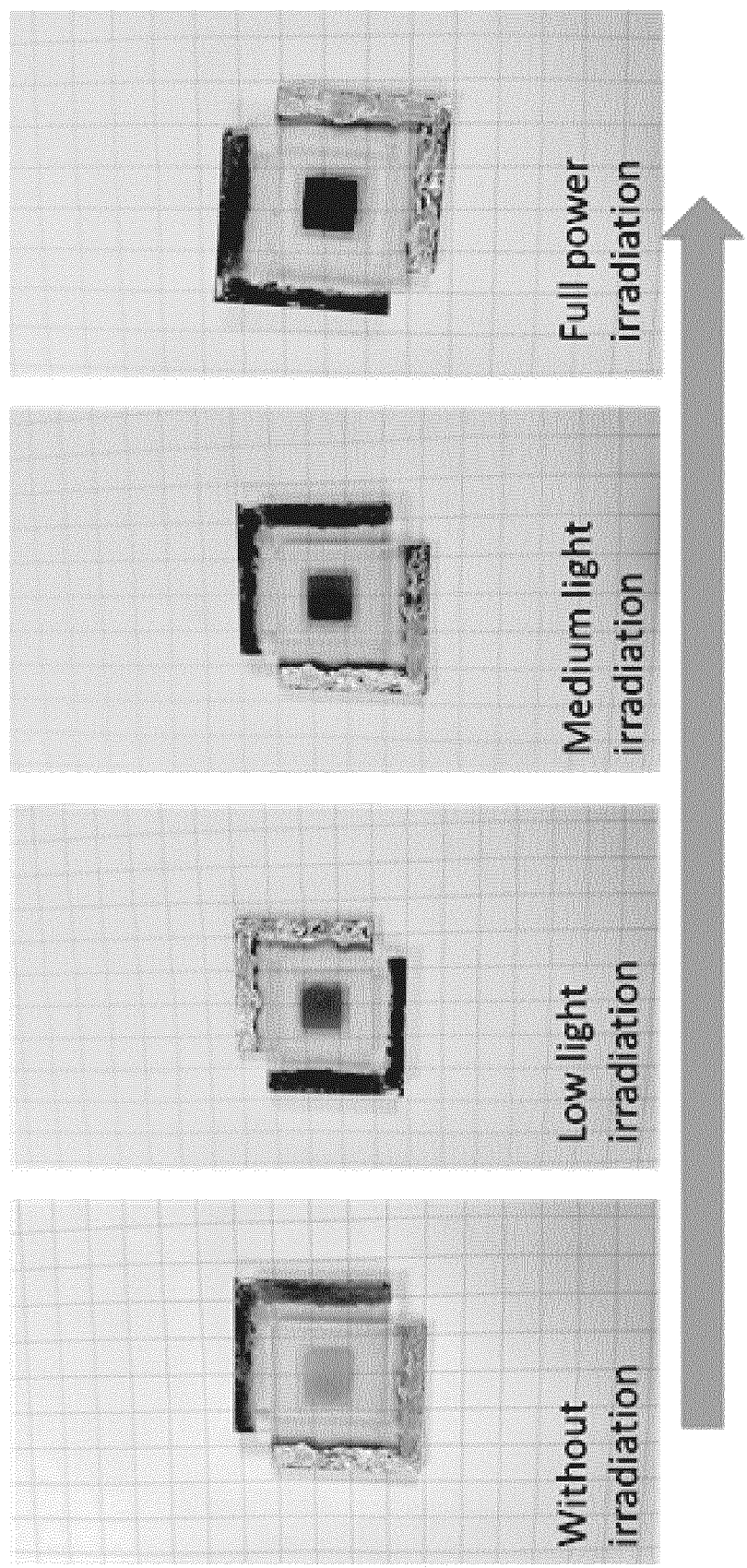
FIG. 2 presents photographs of a solar cell the photosensitizer of which is the organic chromophoric dye according to the present invention (YKCP5P21) at different light irradiation power with Low light=0.1 Sun, Medium Light=0.3 Sun, Full power=1 Sun and 1 Sun=1000 W/m².

The results below indicate that upon irradiation the dyes switch from the uncolored form to the colored form. With increasing the time of irradiation the amount of colored dye increases and the photosensitization of the TiO$_2$ electrode occurs. For this reason the solar cell becomes more and more colored and the current density increases (FIG. 2). After few minutes an equilibrium is reached.

Conditions with DJ255
Dyeing bath: [dye]=0.5 mM. [CDCA]=5.0 mM in Ethanol:CHCl$_3$ 1:1
Electrolyte: [I$_2$]=9 mM. [LiI]=0.5 M. [$^t$BP]=0.5 M. [GThio]=0.1 M in ACN
Thickness: 8 μm. No scattering layer

TABLE 1

(DJ255)

|  | $V_{OC}$ (V) | $J_{SC}$ (mA/cm$^2$) | FF | PCE (%) |
|---|---|---|---|---|
| t0 | 0.467 | 2.46 | 64 | 0.73 |
| t0 + 13 s | 0.468 | 2.51 | 64 | 0.75 |
| t0 + 26 s | 0.467 | 2.59 | 64 | 0.77 |
| t0 + 39 s | 0.464 | 2.64 | 64 | 0.78 |
| t0 + 52 s | 0.462 | 2.65 | 62 | 0.76 |
| t0 + 65 s | 0.460 | 2.69 | 63 | 0.78 |
| t0 + 77 s | 0.458 | 2.70 | 64 | 0.79 |
| t0 + 90 s | 0.456 | 2.71 | 64 | 0.79 |
| t0 + 102 s | 0.454 | 2.72 | 64 | 0.79 |
| t0 + 114 s | 0.453 | 2.74 | 64 | 0.79 |
| t0 + 128 s | 0.452 | 2.75 | 64 | 0.79 |

Conditions with DJ277
Dyeing bath: [dye]=0.5 mM. [CDCA]=5.0 mM in Ethanol:CHCl$_3$ 1:1
Electrolyte: [I$_2$]=9 mM. [LiI]=0.5 M. [$^t$BP]=0.5 M. [GThio]=0.1 M in ACN
Thickness: 8 μm. No scattering layer

TABLE 2

(DJ277)

|  | $V_{OC}$ (V) | $J_{SC}$ (mA/cm$^2$) | FF (%) | PCE (%) |
|---|---|---|---|---|
| t0 | 0.47 | 4.17 | 63 | 1.22 |
| t0 + 71 s | 0.46 | 4.77 | 62 | 1.39 |
| t0 + 131 s | 0.46 | 4.91 | 62 | 1.38 |
| t0 + 175 s | 0.46 | 4.97 | 61 | 1.37 |

Conditions with YKC5P21 (Test 1)
Dyeing bath: [dye]=0.5 mM. [CDCA]=5.0 mM in Ethanol:CHCl$_3$ 1:1
Electrolyte: [I$_2$]=9 mM. [LiI]=0.5 M. [$^t$BP]=0.5 M. [GThio]=0.1 M in ACN
Thickness: 12 μm. No scattering layer

TABLE 3

(YKC5P21-test 1)

|  | $V_{OC}$ (V) | $J_{SC}$ (mA/cm$^2$) | FF | PCE (%) |
|---|---|---|---|---|
| t0 | 0.42 | 6.92 |  | 1.77 |
| t0 + 20 s | 0.42 | 7.94 |  | 2.13 |
| t0 + 35 s | 0.42 | 8.44 |  | 2.26 |
| t0 + 53 s | 0.42 | 8.72 |  | 2.31 |
| t0 + 70 s | 0.41 | 8.97 |  | 2.34 |
| t0 + 83 s | 0.41 | 9.08 |  | 2.34 |

Conditions with YKC5P21 (Test 2)
Dyeing bath: [dye]=0.5 mM. [CDCA]=20.0 mM in Ethanol:CHCl$_3$ 1:1
Electrolyte: [I$_2$]=9 mM. [LiI]=0.5 M. [$^t$BP]=0.5 M. [GThio]=0.1 M in ACN
Thickness: 12 μm. No scattering layer

TABLE 4

(YKC5P21-test 2)

|  | $V_{OC}$ (V) | $J_{SC}$ (mA/cm$^2$) | FF | PCE (%) |
|---|---|---|---|---|
| t0 | 0.458 | 1.42 | 0.67 | 0.44 |
| t0 + 15 s | 0.463 | 1.67 | 0.68 | 0.53 |
| t0 + 57 s | 0.502 | 8.02 | 0.59 | 2.38 |
| t0 + 74 s | 0.494 | 8.83 | 0.60 | 2.61 |
| t0 + 92 s | 0.488 | 9.24 | 0.59 | 2.68 |
| t0 + 108 s | 0.484 | 9.46 | 0.59 | 2.71 |
| t0 + 126 s | 0.481 | 9.59 | 0.59 | 2.73 |
| t0 + 144 s | 0.476 | 9.71 | 0.59 | 2.75 |
| t0 + 159 s | 0.473 | 9.78 | 0.59 | 2.76 |
| t0 + 83 s | 0.41 | 9.08 | 0.59 | 2.34 |

The last test was carried out to demonstrate that the solar cells show a reversible photochromic behaviour.

Note that in this case the solar cells were fabricated with a scattering layer, this explains the rapid coloration and the rapid increase of efficiency.

After irradiation the solar cells were stored for 16 h in the dark and tested again in the same conditions. The solar cells were decoloured, indicating that the photochromic behaviour is reversible.

Conditions with YKC5P21 (Test 3)
Dyeing bath: [dye]=0.5 mM. [CDCA]=20.0 mM in Ethanol:CHCl$_3$ 1:1
Electrolyte: [I$_2$]=9 mM. [LiI]=0.5 M. [$^t$BP]=0.5 M. [GThio]=0.1 M in CAN
Thickness: 12 μm.+ scattering layer 4 μm

TABLE 4

(YKC5P21-test 3)

| DAY 1 | $V_{OC}$ (V) | $J_{SC}$ (mA/cm$^2$) | FF | PCE (%) |
|---|---|---|---|---|
| t0 | 0.49 | 8.36 | 0.61 | 2.55 |
| t0 + 18 s | 0.49 | 8.94 | 0.62 | 2.74 |
| t0 + 57 s | 0.48 | 9.06 | 0.62 | 2.73 |
| DAY 2 | The solar cell was decoloured after 16 h in the dark | | | |
| t0 + 0 s | 0.44 | 7.98 | 0.62 | 2.25 |
| t0 + 14 s | 0.45 | 8.77 | 0.65 | 2.57 |
| t0 + 29 s | 0.44 | 9.11 | 0.65 | 2.67 |
| t0 + 45 s | 0.44 | 9.37 | 0.65 | 2.72 |
| t0 + 60 s | 0.44 | 9.54 | 0.65 | 2.76 |
| t0 + 89 s | 0.44 | 9.63 | 0.64 | 2.78 |

Conditions with YKC5P98

Dyeing bath: [dye]=0.5 mM. [CDCA]=5.0 mM in Tertiobutanol:CHCl$_3$ 1:1

Electrolyte: [I$_2$]=10 mM. [LiI]=0.5 M. [$^t$BP]=0.5 M. [GThio]=0.1 M in ACN

Thickness: 8 μm+4 μm scattering layer

TABLE 5

| (YKC5P98) | | | |
|---|---|---|---|
| | $V_{OC}$ (V) | $J_{SC}$ (mA/cm$^2$) | FF (%) | PCE (%) |
| t0 + 40 s | 0.50 | 3.10 | 71 | 1.12 |

BIBLIOGRAPHY

[1] Hagfeldt et al, 2010, "Dye-sensitized solar cells", Chem. Rev., vol. 110, pages 6595-6663.

[2] Yoon et al, 2011, "Application of transparent dye-sensitized solar cells to building integrated photovoltaic systems", Building and Environment, vol. 46, pages 1899-1904.

[3] Bechinger et al, 1996, "Photoelectrochromic windows and displays", Nature, vol. 383, pages 608-610.

[4] Yang et al, 2012, "A novel photoelectrochromic device based on ProDOT thin film and dye sensitized solar cells", Sol. Ener. Mat. Sol. Cells, vol. 97, pages 186-190.

[5] Nunzio et al, 2010, "Photochromism and Thermochromism of some Spirooxazines and Naphthopyrans in the Solid State and in Polymeric Film", J. Phys. Chem. C, vol. 114, pages 6123-6131.

[6] Pardo et al, 2011, "Photochromic organic-inorganic hybrid materials", Chem. Soc. Rev., vol. 40, pages 672-681.

[7] International application WO 2009/109499 in the name of BASF SE and published on Sep. 11, 2009.

[8] Mishra et al, 2009, "Metal-Free Organic Dyes for Dye-Sensitized Solar Cells: From Structure: Property Relationships to Design Rules", Angew. Chem. Int. Ed., vol. 48, pages 2474-2499.

[9] Kalyanasundaram K., 2010, "Dye Sensitized Solar Cells", (ed.), EPFL Press, ISBN: 978-2-940222-36-0 CRC Press ISBN 978-1-4398-0866-5.

[10] Yum et al, 2009, "A light-resistant organic sensitizer for solar-cell applications", Angew. Chem. Int. Ed., vol. 48, pages 1576-1580.

The invention claimed is:

1. An organic dye of formula (I):

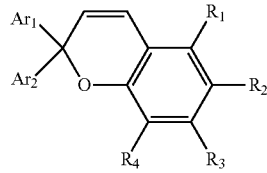

wherein

Ar$_1$ and Ar$_2$ are independently an optionally substituted aryl group,

R$_1$ to R$_4$ are independently a hydrogen, a halogen, a cyano group (—CN), a nitro group (—NO$_2$), an optionally substituted alkyl group, an optionally substituted aryl group, an optionally substituted alkylaryl group, or an optionally substituted arylalkyl group, R$_1$ and R$_2$ optionally forming with the carbons to which they are attached an optionally substituted aromatic or heteroaromatic ring, and R$_3$ and R$_4$ optionally forming with the carbons to which they are attached an optionally substituted aromatic or heteroaromatic, wherein Ar$_1$ and/or Ar$_2$ is substituted by -eD and at least one selected from the group consisting of R$_1$, R$_2$, R$_3$, R$_4$, the aromatic or heteroaromatic ring formed by R$_1$ and R$_2$ with the carbons to which they are attached, and the aromatic or heteroaromatic ring formed by R$_3$ and R$_4$ with the carbons to which they are attached, is substituted by -L-A, or wherein Ar$_1$ and/or Ar$_2$ is substituted by -L-A and at least one selected from the group consisting of R$_1$, R$_2$, R$_3$, R$_4$, the aromatic or heteroaromatic ring formed by R$_1$ and R$_2$ with the carbons to which they are attached, and the aromatic or heteroaromatic ring formed by R$_3$ and R$_4$ with the carbons to which they are attached, is substituted by -eD, or wherein Ar$_1$ and/or Ar$_2$ is substituted by -eD and at least one selected from the group consisting of R$_3$, R$_4$, R$_{15}$, R$_{16}$, R$_{17}$, R$_{18}$, and the aromatic or heteroaromatic ring formed by R$_{17}$ and R$_{18}$ with the carbons to which they are attached is substituted by -L-A;

or wherein Ar$_1$ and/or Ar$_2$ is substituted by -L-A and at least one selected from the group consisting of R$_3$, R$_4$, R$_{15}$, R$_{16}$, R$_{17}$, R$_{18}$, and the aromatic or heteroaromatic ring formed by R$_{17}$, and R$_{18}$ with the carbons to which they are attached is substituted by -eD wherein -eD is electron donor segment that is an amino group of a formula, (Z$_1$)(Z$_2$)N—, with Z$_1$ and Z$_2$ independently being an optionally substituted alkyl group or an optionally substituted aryl group, -L- is a covalent bond or a spacer segment, and -A is an electron attractor segment, able to form a covalent bond with a semi-conductor, that is a carboxylic acid group, a cyanoacrylic acid group, a phosphonic group, a dithiocarbonic group, or a group of formula:

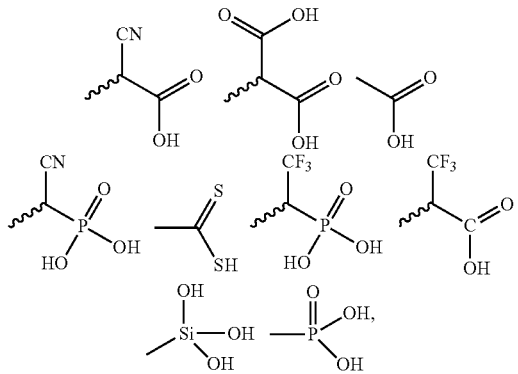

and wherein, if $R_1$ and $R_2$ form a ring of formula (VIa)

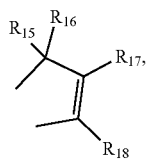

(VIa)

$R_{15}$ to $R_{18}$ are independently a hydrogen, a halogen, a cyano group (—CN), a nitro group (—NO$_2$), an optionally substituted alkyl group, an optionally substituted aryl group, an optionally substituted alkylaryl group, or an optionally substituted arylalkyl group, $R_{15}$ and $R_{16}$ optionally forming together a $=$O or $=$C($R_{24}$)($R_{25}$) group with $R_{24}$ and $R_{25}$ independently being a hydrogen, a halogen, a cyano group (—CN), a nitro group (—NO$_2$), an optionally substituted alkyl group, an optionally substituted aryl group, an optionally substituted alkylaryl group, or an optionally substituted arylalkyl group, and $R_{17}$ and $R_{18}$ optionally forming with the carbons to which they are attached an optionally substituted aromatic or heteroaromatic ring.

2. The dye of claim 1, having a formula (III):

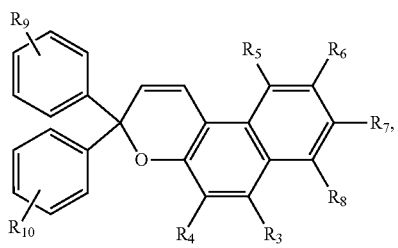

(III)

wherein $R_3$ and $R_4$ are as defined in claim 1, $R_5$ to $R_8$ are independently a hydrogen, a halogen, a cyano group (—CN), a nitro group (–NO$_2$), an optionally substituted alkyl group, an optionally substituted aryl group, an optionally substituted alkylaryl group, an optionally substituted arylalkyl group, -eD, or -L-A, $R_9$ and $R_{10}$ are independently a hydrogen, a halogen, a cyano group (—CN), a nitro group (—NO$_2$), an optionally substituted alkyl group, an optionally substituted aryl group, an optionally substituted alkylaryl group, an optionally substituted arylalkyl group, -eD, or -L-A, wherein $R_9$ and/or $R_{10}$ is -eD or is substituted by -eD and at least one selected from the group consisting of $R_3$, $R_4$, $R_5$, $R_6$, $R_7$, and $R_8$ is -L-A or substituted by -L-A, or wherein $R_9$ and/or $R_{10}$ is -L-A or is substituted by -L-A and at least one selected from the group consisting of radical $R_3$, $R_4$, $R_5$, $R_6$, and $R_7$, and $R_8$ is -eD or is substituted -eD, -eD and -L-A being as defined in claim 1.

3. The dye of claim 1, having formula (V):

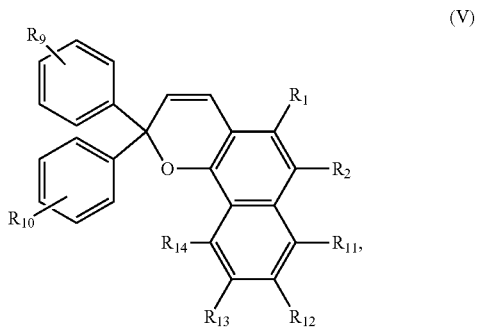

(V)

wherein $R_1$ and $R_2$ are as defined in claim 1, $R_9$ and $R_{10}$ are independently a hydrogen, a halogen, a cyano group (—CN), a nitro group (—NO$_2$), an optionally substituted alkyl group, an optionally substituted aryl group, an optionally substituted alkylaryl group, an optionally substituted arylalkyl group, -eD, or a -L-A, $R_{11}$ to $R_{14}$ are independently a hydrogen, a halogen, a cyano group (—CN), a nitro group (—NO$_2$), an optionally substituted alkyl group, an optionally substituted aryl group, an optionally substituted alkylaryl group, an optionally substituted arylalkyl group, -eD, or L-A, $R_{11}$ and $R_{12}$ optionally forming with the carbons to which they are attached an optionally substituted aromatic or heteroaromatic ring, and $R_{13}$ and $R_{14}$ optionally forming with the carbons to which they are attached an optionally substituted aromatic or heteroaromatic ring, wherein $R_9$ and/or $R_{10}$ is -eD or is substituted by -eD and at least one selected from group consisting of $R_1$, $R_2$, $R_{11}$, $R_{12}$, $R_{13}$, $R_{14}$, the aromatic or heteroaromatic ring formed by $R_{11}$ and $R_{12}$ with the carbons to which they are attached, and the aromatic or heteroaromatic ring formed by $R_{13}$ and $R_{14}$ with the carbons to which they are attached, is -L-A or is substituted by -L-A, or wherein $R_9$ and/or $R_{10}$ is -L-A or is substituted by -L-A and at least one selected from the group consisting of $R_1$, $R_2$, $R_{11}$, $R_{12}$, $R_{13}$, $R_{14}$, the aromatic or heteroaromatic ring formed by $R_{11}$ and $R_{12}$ with the carbons to which they are attached, and the aromatic or heteroaromatic ring formed by $R_{13}$ and $R_{14}$ with the carbons to which they are attached, is -eD or is substituted by -eD, -eD and -L-A being as defined in claim 1.

4. The dye of claim 1, wherein -L- is a pi-conjugated function.

5. The dye of claim 1, having a structure
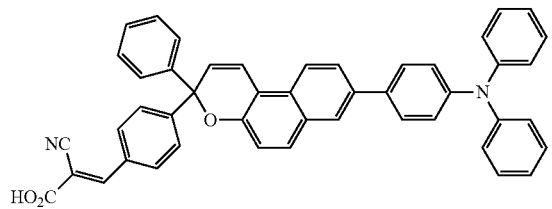
DJ228
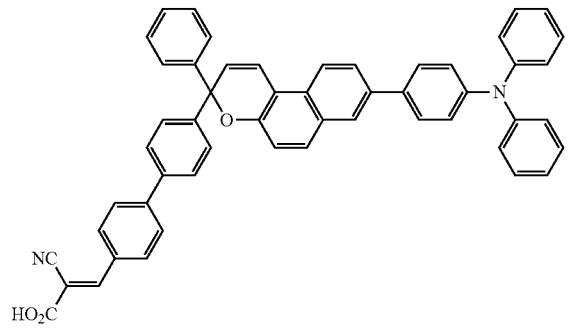
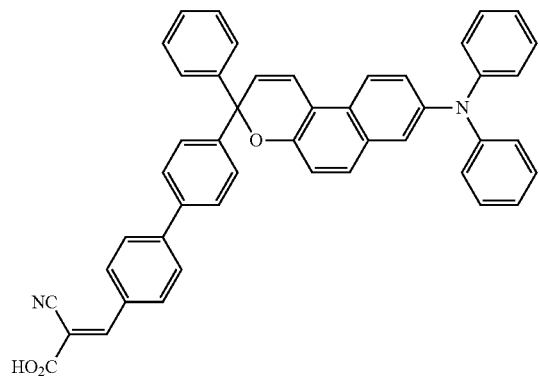
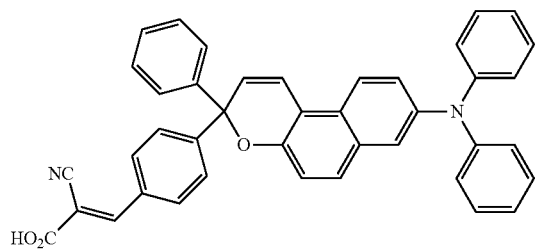
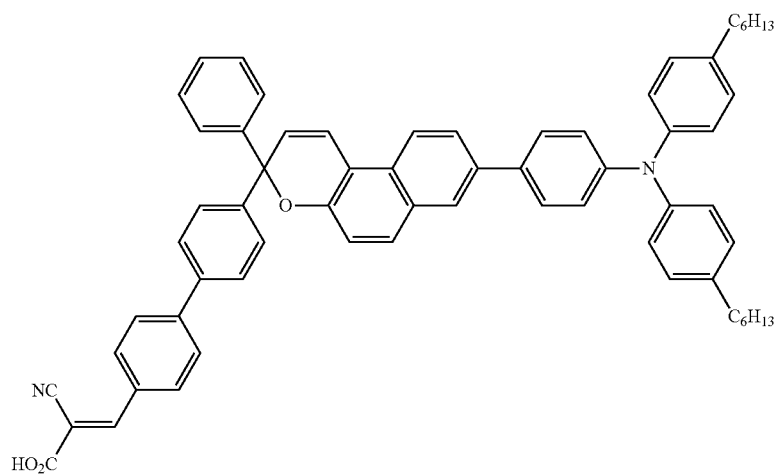

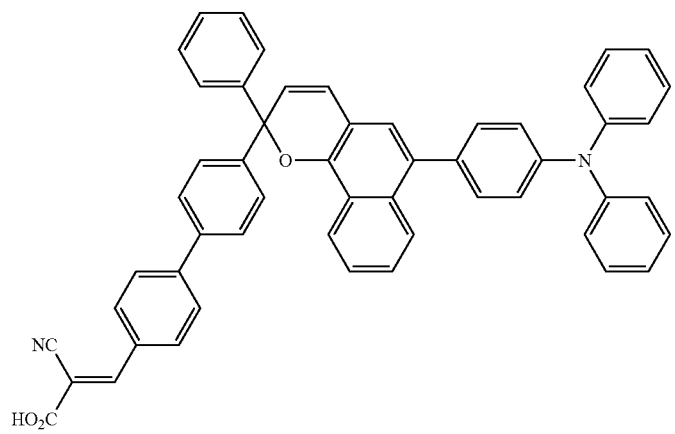
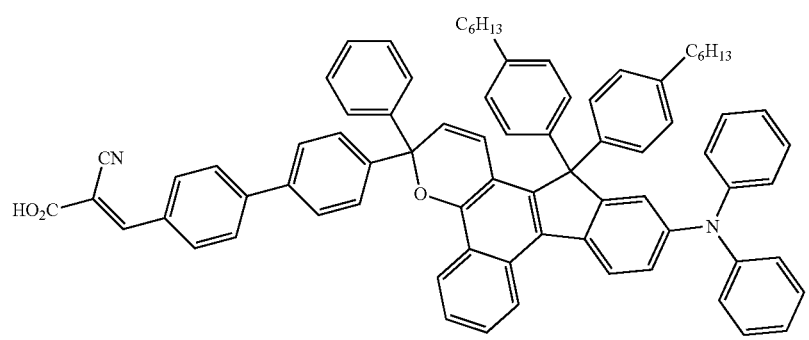
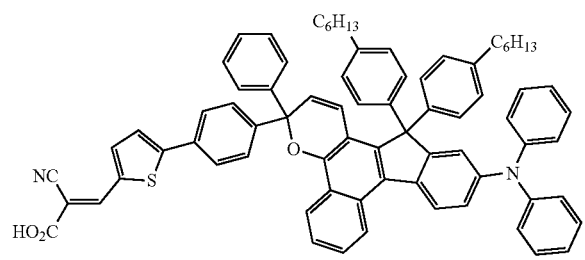
6. The dye of claim 1, having a structure
7. The dye of claim 1, having a structure
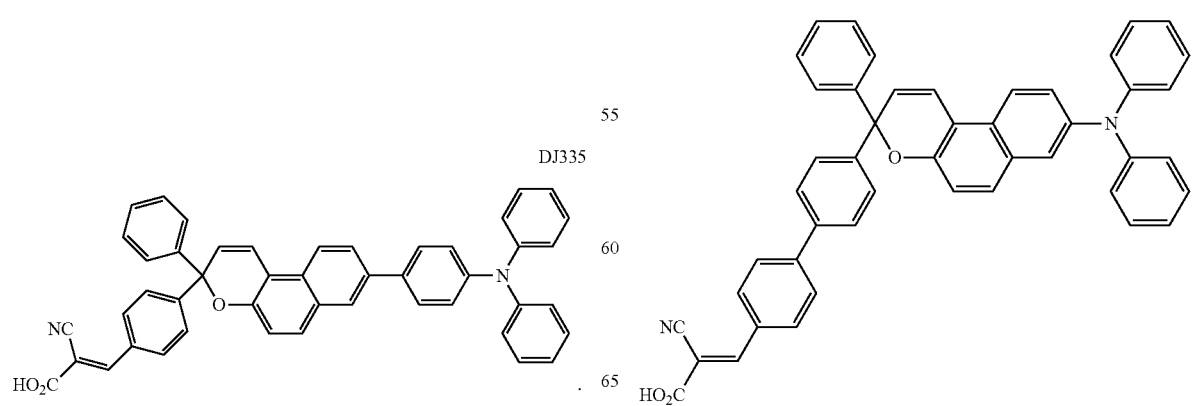

8. The dye of claim 1, having a structure
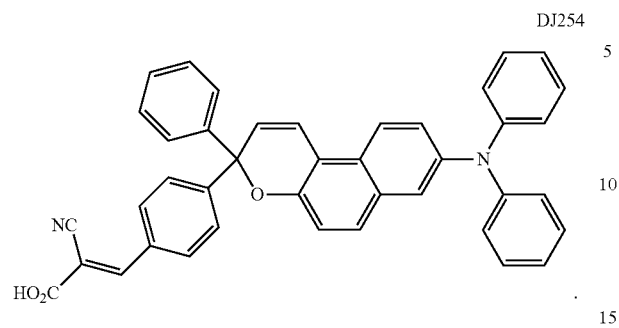
9. The dye of claim 1, having a structure
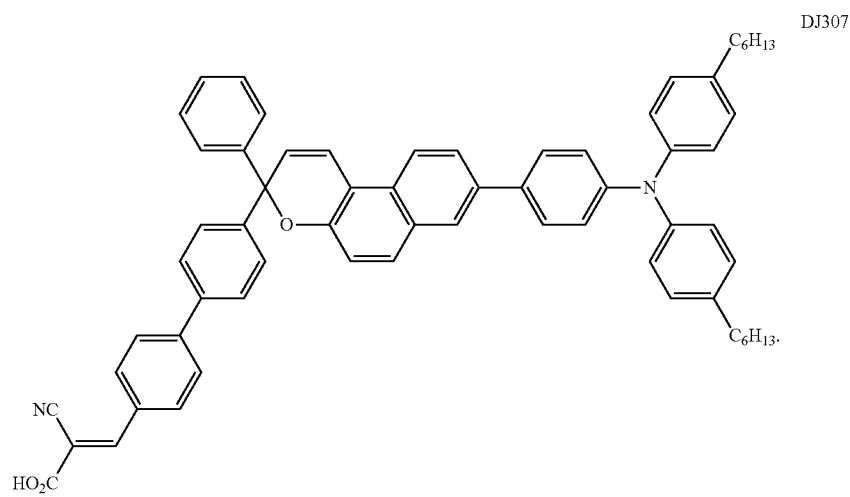
10. The dye of claim 1, having a structure
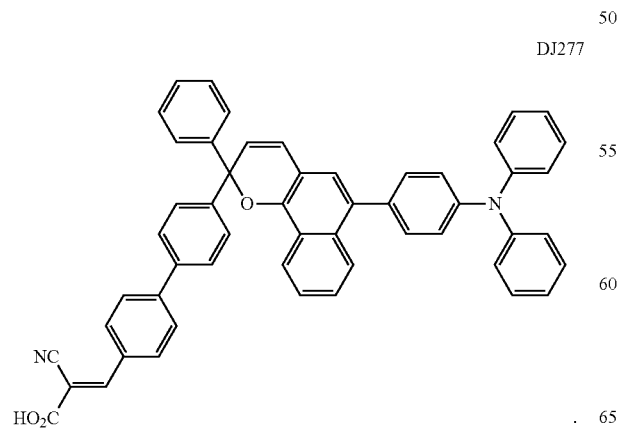

11. The dye of claim 1, having a structure
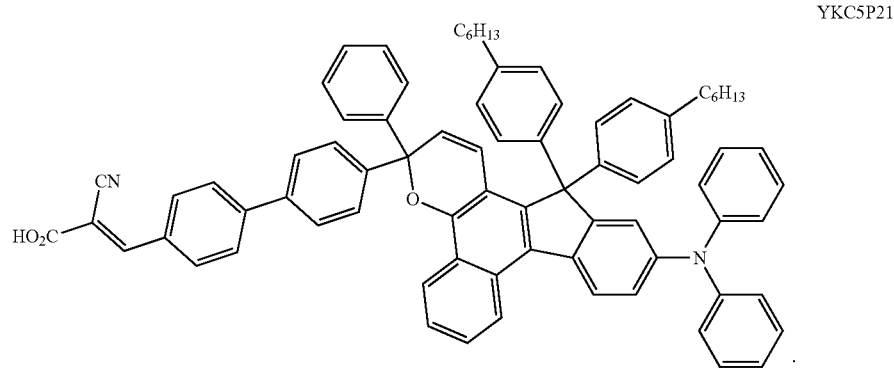
YKC5P21
12. The dye of claim 1, having a structure
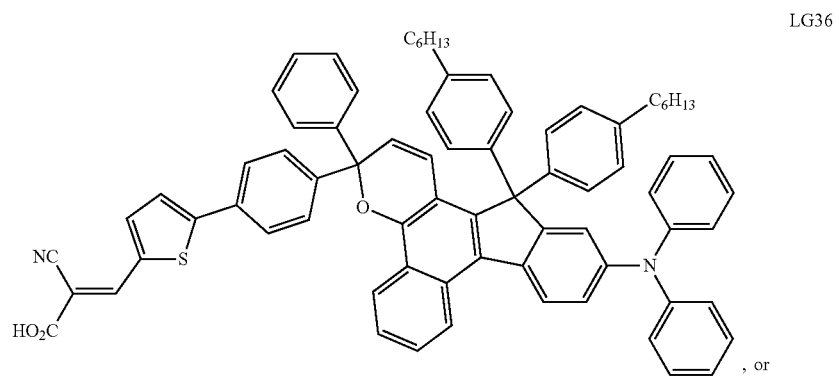
LG36, or
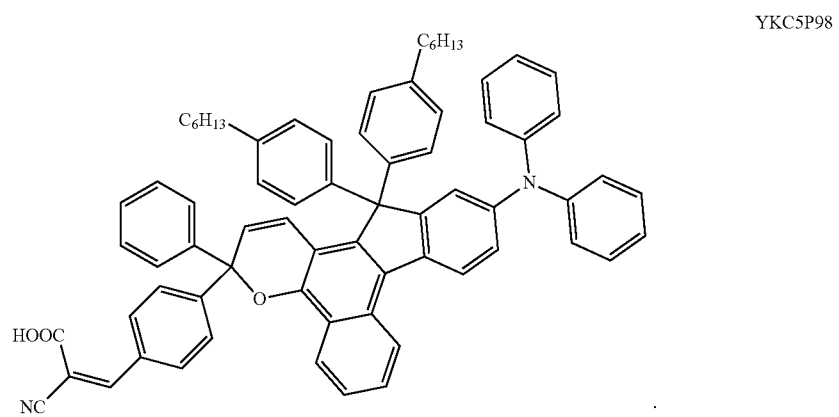
YKC5P98

13. A process, comprising:

photosensitizing a photovoltaic device with the dye of claim 1.

14. A photovoltaic device, comprising:

a nanostructured semi-conductor metal oxide layer comprising the dye of claim 1, the dye sensitizing the layer.

15. The device of claim 14, comprising:

an anode; and a counter electrode, wherein the anode and counter electrode are separated from each other by an electrolyte and optionally one or more polymer shims.

16. The device of claim 14, wherein the semi-conductor metal oxide is a binary, tertiary, or quaternary metal oxide 17. The device of claim 15, wherein the nanostructured semi-conductor metal oxide layer is in the form of a mesoporous layer and is deposited on the anode.

18. The device of claim 15, wherein the electrolyte is a liquid, an ionic liquid, a gel, or a solid.

19. An organic dye of formula (VIII):

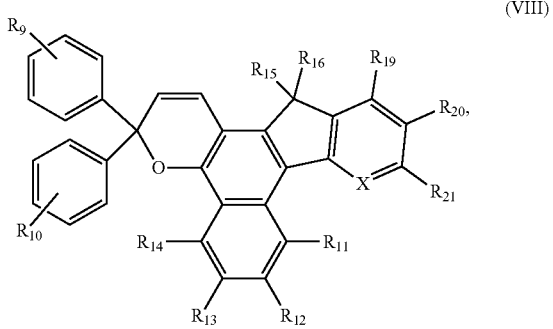

(VIII)

wherein $R_9$ and $R_{10}$ are independently a hydrogen, a halogen, a cyano group (—CN), a nitro group (—NO$_2$), an optionally substituted alkyl group, an optionally substituted aryl group, an optionally substituted alkylaryl group, an optionally substituted arylalkyl group, -eD, or -L-A, -eD is an electron donor segment that is an amino group of a formula, $(Z_1)(Z_2)N$—, with $Z_1$ and $Z_2$ independently being an optionally substituted alkyl group or an optionally substituted aryl group, -L- is a covalent bond or a spacer segment, and -A is an electron attractor segment, able to form a covalent bond with a semi-conductor, that is a carboxylic acid group, a cyanoacrylic acid group, a phosphonic group, a dithiocarbonic group, or a group of formula:

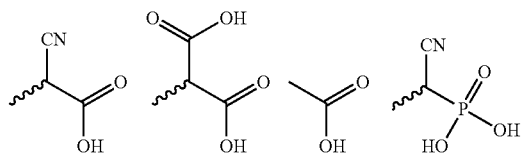

-continued

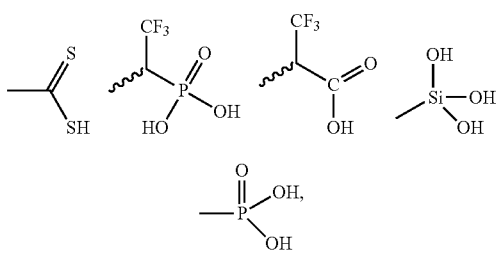

$R_{11}$ to $R_{14}$ are independently a hydrogen, a halogen, a cyano group (—CN), a nitro group (—NO$_2$), an optionally substituted alkyl group, an optionally substituted aryl group, an optionally substituted alkylaryl group, an optionally substituted arylalkyl group -eD, or -L-A, $R_{11}$ and $R_{12}$ optionally forming with the carbons to which they are attached an optionally substituted aromatic or heteroaromatic ring, and $R_{13}$ and $R_{14}$ optionally forming with the carbons to which they are attached an optionally substituted aromatic or heteroaromatic ring, X is $C(R_{26})$ or N;

$R_{15}$ and $R_{16}$ are independently a hydrogen, a halogen, a cyano group (—CN), a nitro group (—NO$_2$), an optionally substituted alkyl group, an optionally substituted aryl group, an optionally substituted alkylaryl group, or an optionally substituted arylalkyl group, $R_{15}$ and $R_{16}$ optionally forming together a =O or =C($R_{24}$)($R_{25}$) group with $R_{24}$ and $R_{25}$ independently being a hydrogen, a halogen, a cyano group (—CN), a nitro group (—NO$_2$), an optionally substituted alkyl group, an optionally substituted aryl group, an optionally substituted alkylaryl group, or an optionally substituted arylalkyl group, $R_{19}$ to $R_{21}$ are independently a hydrogen, a halogen, a cyano group (—CN), a nitro group (—NO$_2$), an optionally substituted alkyl group, an optionally substituted aryl group, an optionally substituted alkylaryl group, an optionally substituted arylalkyl group -eD, or -L-A, $R_{26}$ is a hydrogen, a halogen, a cyano group (—CN), a nitro group (—NO$_2$), an optionally substituted alkyl group, an optionally substituted aryl group, an optionally substituted alkylaryl group, or optionally substituted an arylalkyl group, wherein $R_9$ and/or $R_{10}$ is -eD or is substituted by -eD and at least one selected from group consisting of $R_{11}$, $R_{12}$, $R_{13}$, $R_{14}$, the aromatic or heteroaromatic ring formed by $R_{11}$ and $R_{12}$ with the carbons to which they are attached, the aromatic or heteroaromatic ring formed by $R_{13}$ and $R_{14}$ with the carbons to which they are attached, $R_{15}$, $R_{16}$, $R_{19}$, $R_{20}$, $R_{21}$, $R_{24}$, and $R_{25}$, is -L-A or is substituted by -L-A, or wherein $R_9$ and/or $R_{10}$ is -L-A or is substituted by -L-A and at least one selected from the group consisting of $R_{11}$, $R_{12}$, $R_{13}$, $R_{14}$, the aromatic or heteroaromatic ring formed by $R_{11}$ and $R_{12}$ with the carbons to which they are attached, the aromatic or heteroaromatic ring formed by $R_{13}$ and $R_{14}$ with the carbons to which they are attached, $R_{15}$, $R_{16}$, $R_{19}$, $R_{20}$, $R_{21}$, $R_{24}$, and $R_{25}$, is -eD or is substituted by -eD.

20. An organic dye of formula (X):

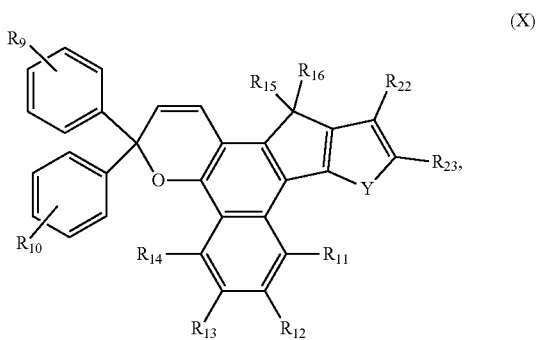

wherein $R_9$ and $R_{10}$ are independently a hydrogen, a halogen, a cyano group (—CN), a nitro group (—$NO_2$), an optionally substituted alkyl group, an optionally substituted aryl group, an optionally substituted alkylaryl group, an optionally substituted arylalkyl group, -eD or -L-A, -eD is an electron donor segment that is an amino group of a formula, $(Z_1)(Z_2)N$—, with $Z_1$ and $Z_2$ independently being an optionally substituted alkyl group or an optionally substituted aryl group, -L- is a covalent bond or a spacer segment, and -A is an electron attractor segment, able to form a covalent bond with a semi-conductor, that is a carboxylic acid group, a cyanoacrylic acid group, a phosphonic group, a dithiocarbonic group, or a group of formula:

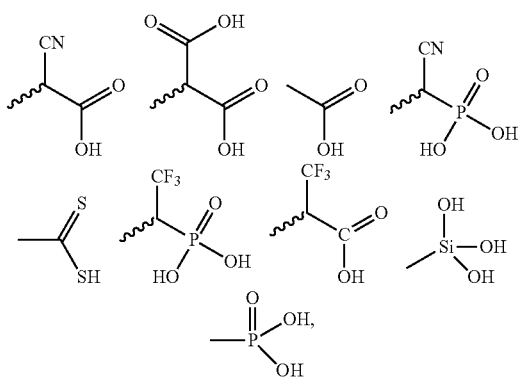

$R_{11}$ to $R_{14}$ are independently a hydrogen, a halogen, a cyano group (—CN), a nitro group (—$NO_2$), an optionally substituted alkyl group, an optionally substituted aryl group, an optionally substituted alkylaryl group, an optionally substituted arylalkyl group, -eD, or -L-A, $R_{11}$ and $R_{12}$ optionally forming with the carbons to which they are attached an optionally substituted aromatic or heteroaromatic ring, and $R_{13}$ and $R_{14}$ optionally forming with the carbons to which they are attached an optionally substituted aromatic or heteroaromatic ring, $R_{15}$ and $R_{16}$ are independently a hydrogen, a halogen, a cyano group (—CN), a nitro group (—$NO_2$), an optionally substituted alkyl group, an optionally substituted aryl group, an optionally substituted alkylaryl group, or an optionally substituted arylalkyl group, $R_{15}$ and $R_{16}$ optionally forming together a =O or =$C(R_{24})(R_{25})$ group with $R_{24}$ and $R_{25}$ independently being a hydrogen, a halogen, a cyano group (—CN), a nitro group (—$NO_2$), an optionally substituted alkyl group, an optionally substituted aryl group, an optionally substituted alkylaryl group, or an optionally substituted arylalkyl group, Y is $C(R_{27})(R_{28})$, C(=O), S, Se, O, $N(R_{29})$, $P(R_{30})$, or $Si(R_{31})(R_{32})$;

$R_{22}$ and $R_{23}$ are independently a hydrogen, a halogen, a cyano group (—CN), a nitro group (—$NO_2$), an optionally substituted alkyl group, an optionally substituted aryl group an optionally substituted alkylaryl group, an optionally substituted arylalkyl group, -eD, or -L-A, $R_{27}$ to $R_{32}$ are independently a hydrogen, an optionally substituted alkyl group, an optionally substituted aryl group, an optionally substituted alkylaryl group, or an optionally substituted arylalkyl group, wherein $R_9$ and/or $R_{10}$ is -eD or is substituted by -eD and at least one selected from the group consisting of $R_{11}$, $R_{12}$, $R_{13}$, $R_{14}$, the aromatic or heteroaromatic ring formed by $R_{11}$ and $R_{12}$ with the carbons to which they are attached, the aromatic or heteroaromatic ring formed by $R_{13}$ and $R_{14}$ with the carbons to which they are attached, $R_{15}$, $R_{16}$, $R_{22}$, $R_{23}$, $R_{24}$, and $R_{25}$, is -L-A or is substituted by -L-A, or wherein $R_9$ and/or $R_{10}$ is -L-A or is substituted by -L-A and at least one selected from the group consisting of $R_{11}$, $R_{12}$, $R_{13}$, $R_{14}$, the aromatic or heteroaromatic ring formed by $R_{11}$ and $R_{12}$ with the carbons to which they are attached, the aromatic or heteroaromatic ring formed by $R_{13}$ and $R_{14}$ with the carbons to which they are attached, $R_{15}$, $R_{16}$, $R_{22}$, $R_{26}$, $R_{24}$, and $R_{25}$, is a -eD or is substituted by -eD.

* * * * *